United States Patent
Masuoka et al.

(10) Patent No.: US 9,825,221 B2
(45) Date of Patent: *Nov. 21, 2017

(54) MEMORY DEVICE, SEMICONDUCTOR DEVICE, METHOD FOR PRODUCING MEMORY DEVICE, AND METHOD FOR PRODUCING SEMICONDUCTOR DEVICE

(71) Applicant: Unisantis Electronics Singapore Pte. Ltd., Peninsula Plaza (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Peninsula Plaza (SG)

( * ) Notice: Subject to any disclaimer, the term of this patent is extended or adjusted under 35 U.S.C. 154(b) by 0 days.

This patent is subject to a terminal disclaimer.

(21) Appl. No.: 15/019,553

(22) Filed: Feb. 9, 2016

(65) Prior Publication Data

US 2016/0163976 A1   Jun. 9, 2016

Related U.S. Application Data

(63) Continuation of application No. 14/483,791, filed on Sep. 11, 2014, now Pat. No. 9,293,703, which is a
(Continued)

(51) Int. Cl.
*H01L 31/119* (2006.01)
*H01L 29/06* (2006.01)
(Continued)

(52) U.S. Cl.
CPC .......... *H01L 45/06* (2013.01); *H01L 27/2454* (2013.01); *H01L 27/2463* (2013.01);
(Continued)

(58) Field of Classification Search
CPC ............. H01L 29/0669; H01L 29/0692; H01L 29/66545; H01L 29/66795;
(Continued)

(56) References Cited

U.S. PATENT DOCUMENTS 8,546,177 B2   10/2013  Seo et al.
8,669,601 B2   3/2014   Masuoka et al.
(Continued)

FOREIGN PATENT DOCUMENTS

JP   2004-356314 A   12/2004
JP   2005-260014 A   9/2005
(Continued)

OTHER PUBLICATIONS

Office Action in corresponding U.S. Appl. No. 14/483,791 dated Jul. 31, 2015, 9 pages.
(Continued)

*Primary Examiner* — Hsien Ming Lee
(74) *Attorney, Agent, or Firm* — Brinks Gilson & Lione

(57) ABSTRACT

A memory device includes a reset gate whose resistance changes. The memory device also includes a pillar-shaped phase-change layer, a reset gate insulating film surrounding the pillar-shaped phase-change layer, and the reset gate surrounding the reset gate insulating film. The pillar-shaped phase-change layer and the reset gate are electrically insulated from each other by the reset gate insulating film.

5 Claims, 54 Drawing Sheets

Related U.S. Application Data continuation of application No. PCT/JP2013/080148, filed on Nov. 7, 2013.

(51) Int. Cl.
  H01L 21/00 (2006.01)
  H01L 45/00 (2006.01)
  H01L 27/24 (2006.01)

(52) U.S. Cl.
  CPC .......... *H01L 45/065* (2013.01); *H01L 45/126* (2013.01); *H01L 45/1206* (2013.01); *H01L 45/1233* (2013.01); *H01L 45/1253* (2013.01); *H01L 45/1286* (2013.01); *H01L 45/144* (2013.01); *H01L 45/16* (2013.01); *H01L 45/1608* (2013.01); *H01L 45/1675* (2013.01)

(58) Field of Classification Search
  CPC ............. H01L 29/66787; H01L 29/785; H01L 29/7889; H01L 29/7827; H01L 29/66825; H01L 29/66484; H01L 29/66666; H01L 27/092; H01L 27/11521; H01L 27/2454; H01L 45/06; H01L 45/16; H01L 45/1206; H01L 29/78; H01L 29/66
  USPC ........ 257/288, 350, 401, 618; 438/149, 156, 438/197, 279, 286
  See application file for complete search history.

(56) References Cited

U.S. PATENT DOCUMENTS

| 8,735,971 | B2 | 5/2014 | Masuoka et al. |
| 9,293,703 | B2* | 3/2016 | Masuoka ............... H01L 45/16 |
| 9,590,011 | B2* | 3/2017 | Masuoka ............ H01L 27/2454 |
| 2008/0239932 | A1* | 10/2008 | Kamata .................. G11B 9/04 369/126 |
| 2009/0296457 | A1* | 12/2009 | Suh .................... G11C 13/0004 365/163 |
| 2010/0290277 | A1 | 11/2010 | Happ et al. |
| 2010/0309714 | A1 | 12/2010 | Meade |

FOREIGN PATENT DOCUMENTS

| JP | 2009-123847 A | 6/2009 |
| JP | 2009-182318 A | 8/2009 |
| JP | 2011-103323 A | 5/2011 |
| JP | 2011-199017 A | 10/2011 |
| JP | 2012-84676 A | 4/2012 |
| JP | 2012-186424 A | 9/2012 |
| JP | 2012-204404 A | 10/2012 |
| WO | WO 2009/096363 A1 | 8/2009 |
| WO | WO 2013/038553 A1 | 3/2013 |
| WO | WO 2013/093988 A1 | 6/2013 |

OTHER PUBLICATIONS

Office Action in corresponding U.S. Appl. No. 14/483,791 dated Oct. 30, 2015, 10 pages.
Notice of Allowance in corresponding U.S. Appl. No. 14/483,791 dated Dec. 14, 2015, 8 pages.
Notice of Allowance in corresponding U.S. Appl. No. 15/019,513, dated Jul. 19, 2016, 7 pages.
Ex Parte Quayle Action in corresponding U.S. Appl. No. 15/019,513, dated May 25, 2016, 8 pages.
Notice of Allowance in corresponding U.S. Appl. No. 15/019,441, dated May 26, 2016, 9 pages.
English language translation of International Preliminary Report on Patentability in corresponding International Application No. PCT/JP2013/080148, dated May 12, 2016, 9 pages.

* cited by examiner

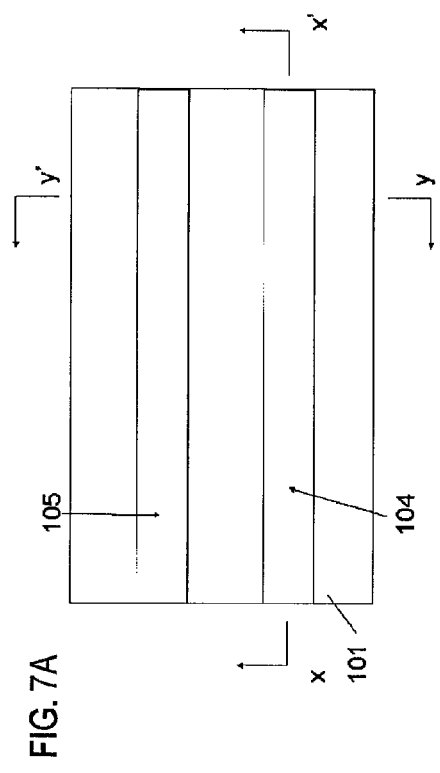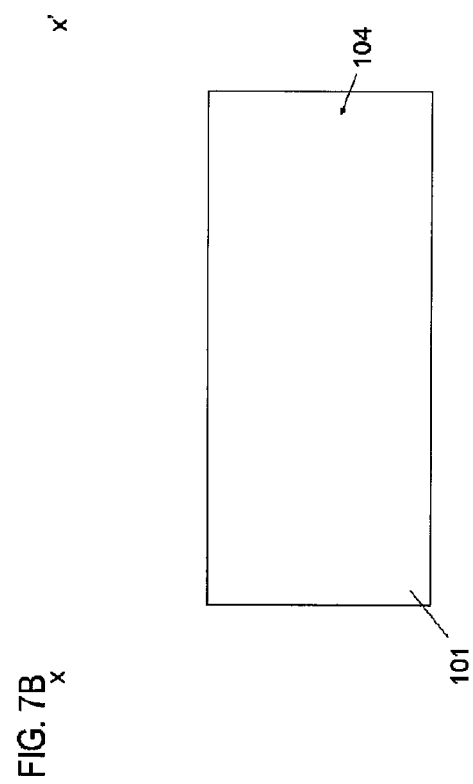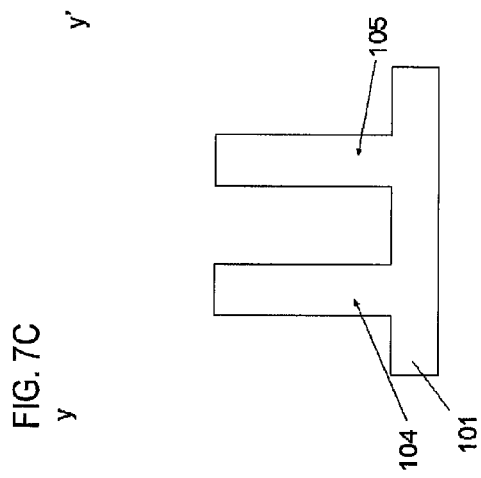

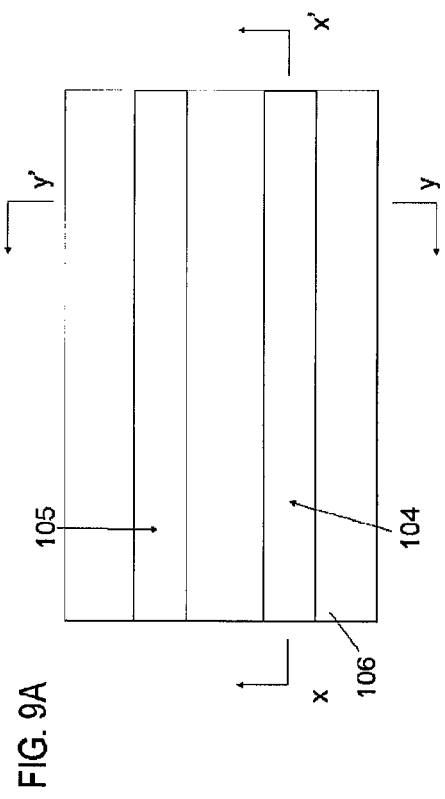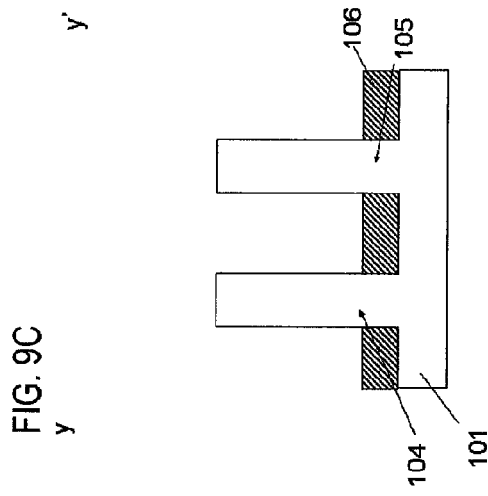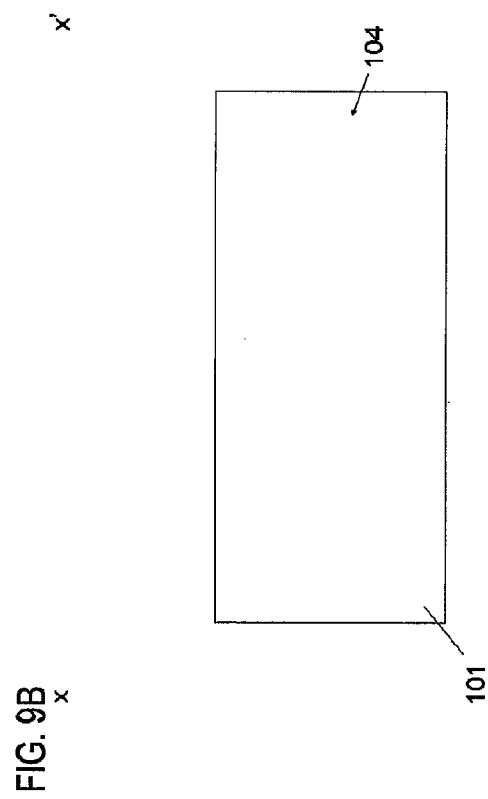

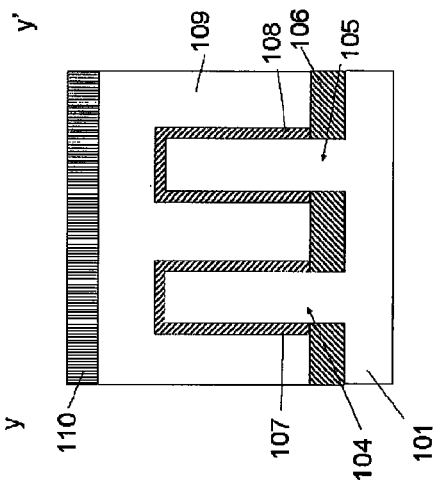
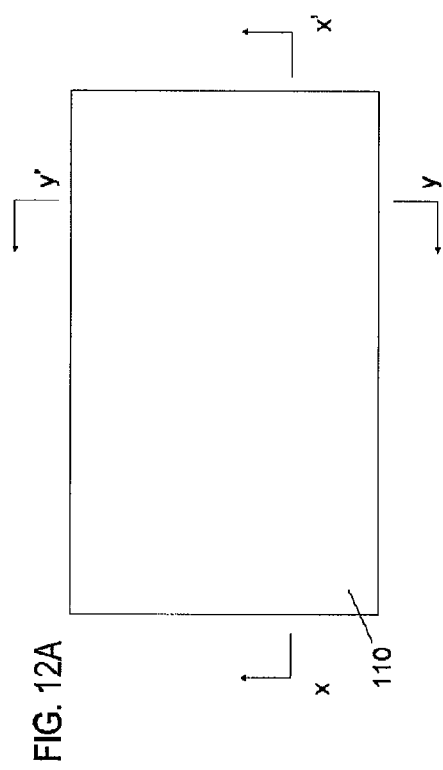
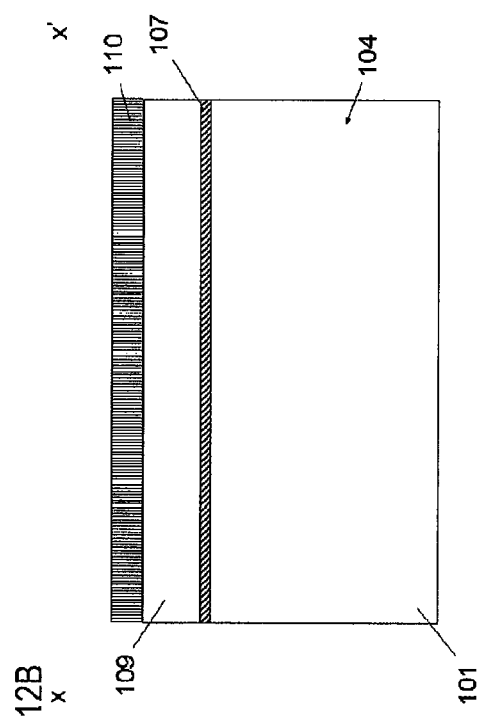
FIG. 12A
FIG. 12B
FIG. 12C

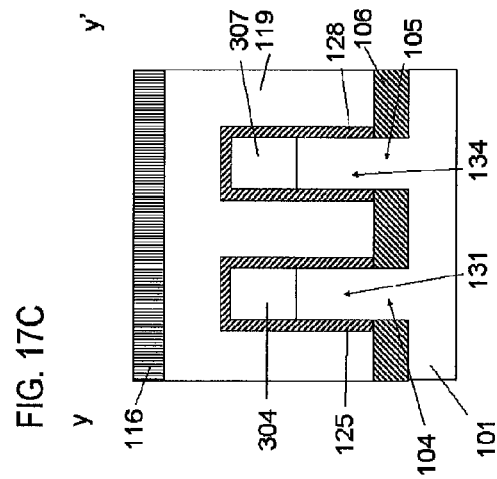
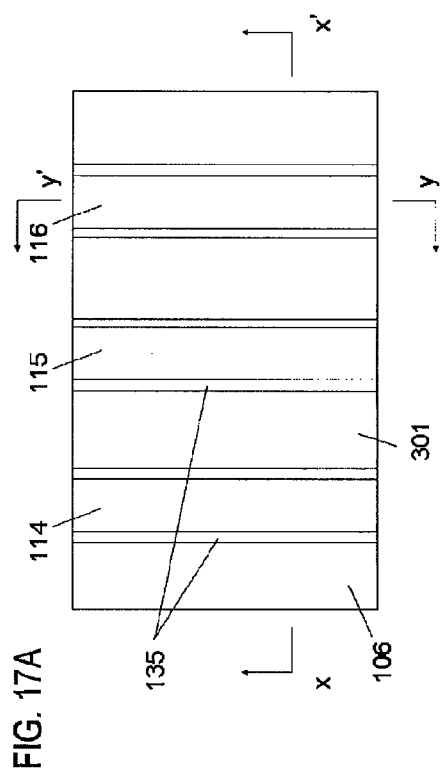
FIG. 17A
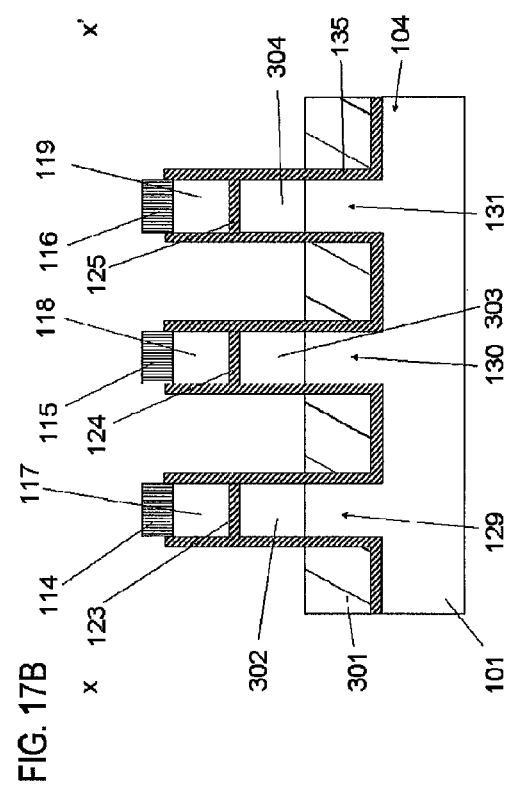
FIG. 17B
FIG. 17C

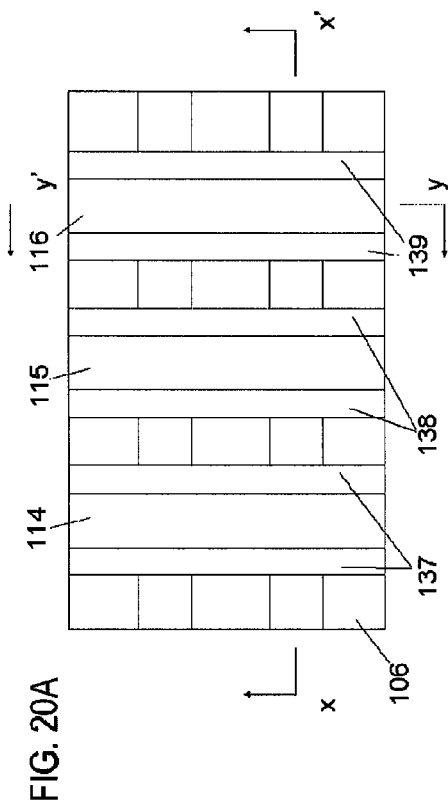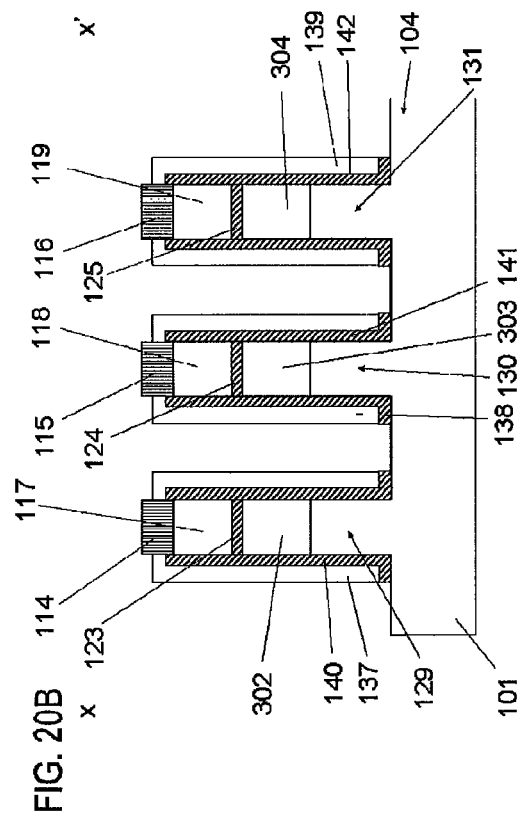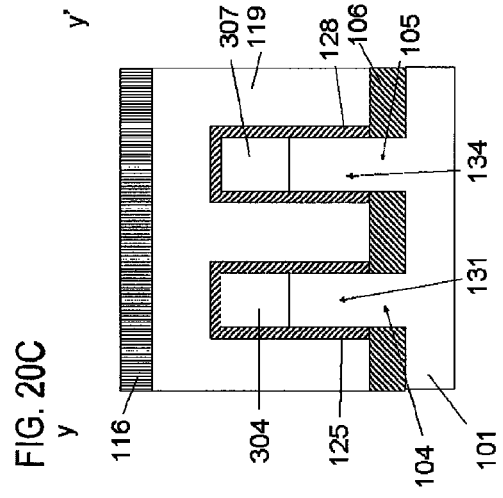

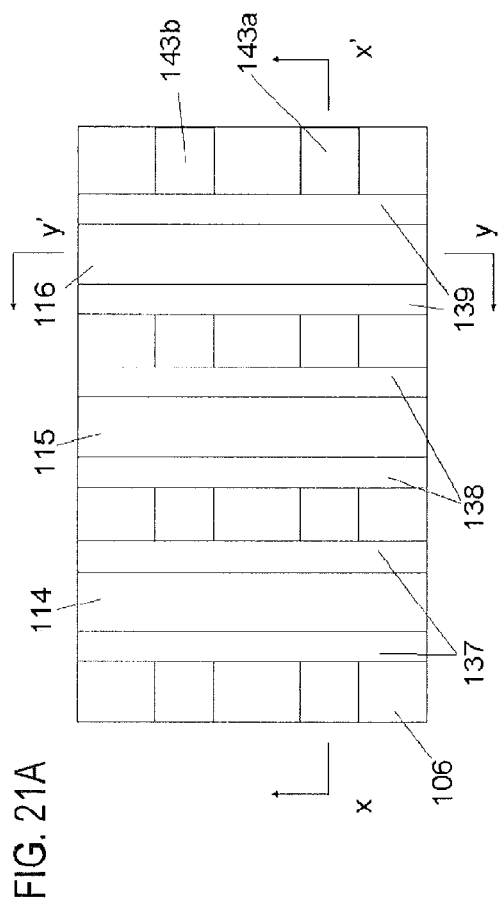
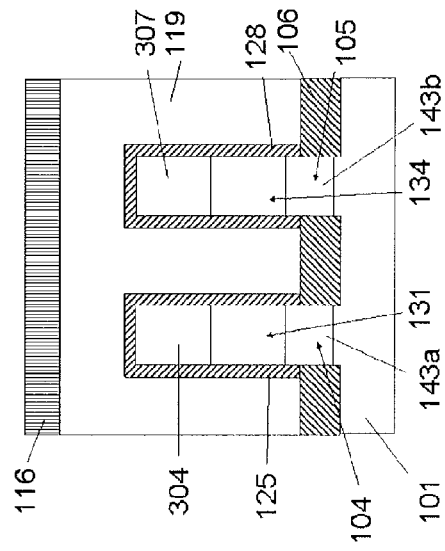
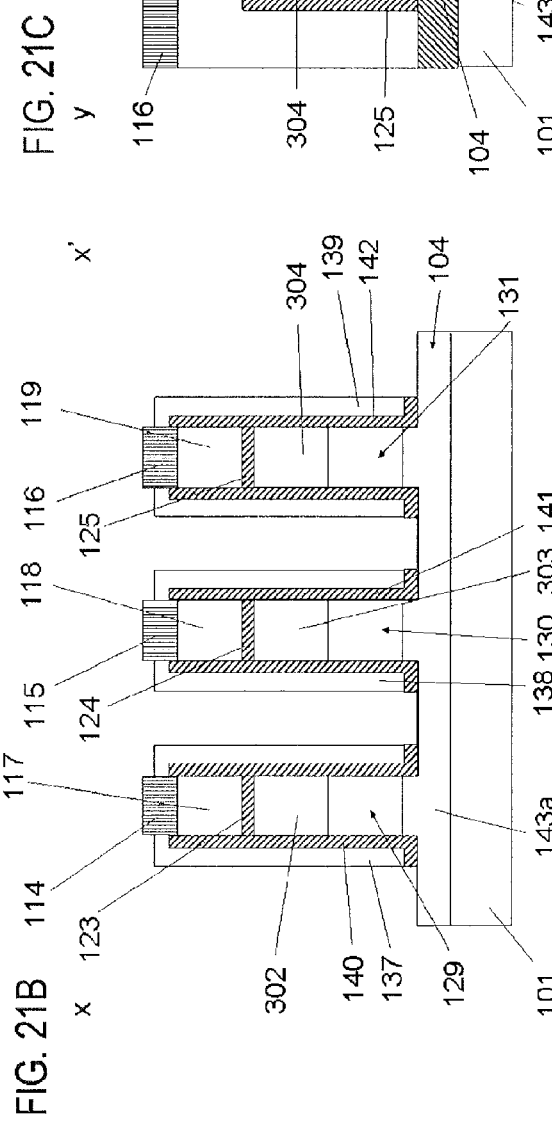
FIG. 21A
FIG. 21B
FIG. 21C

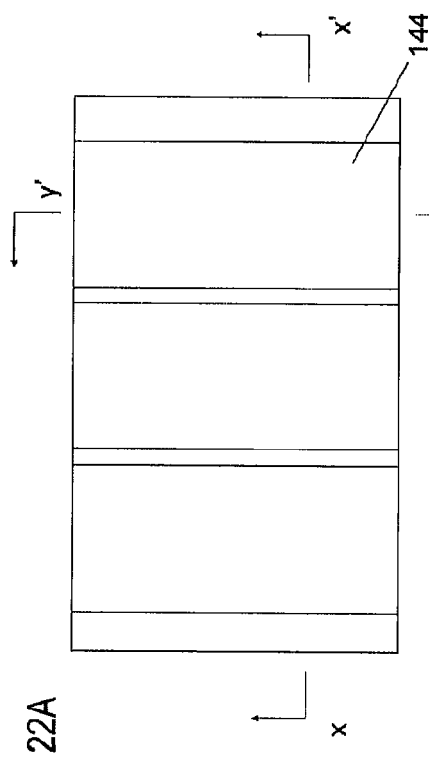
FIG. 22A
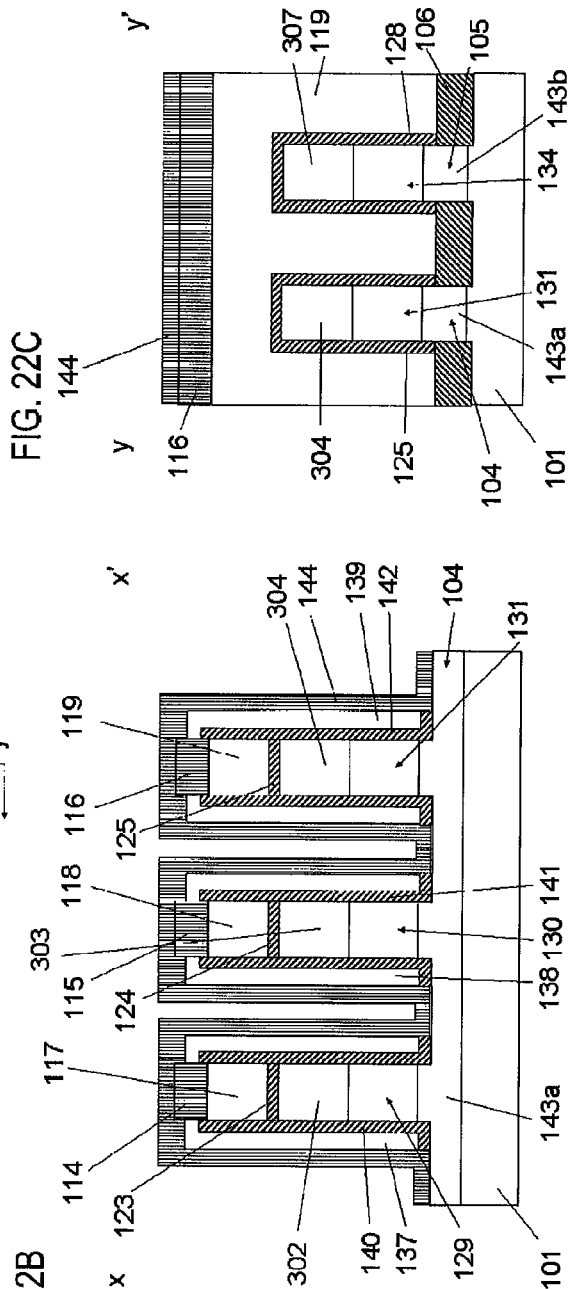
FIG. 22B
FIG. 22C

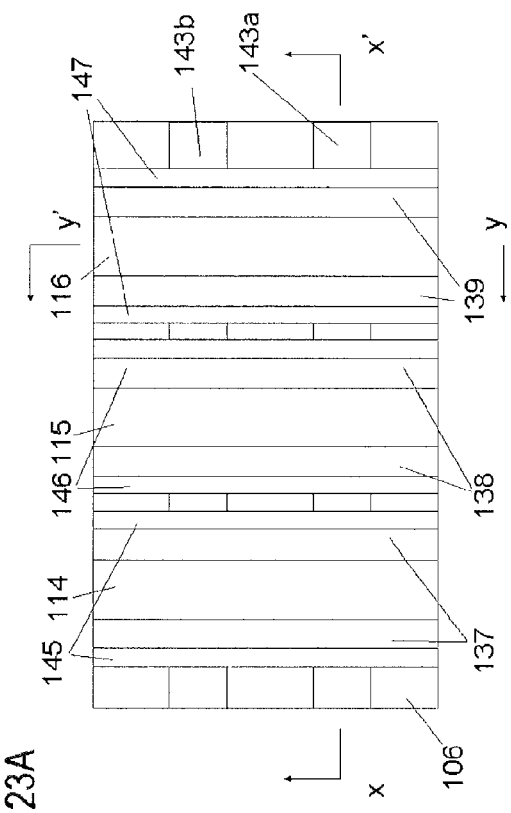
FIG. 23A
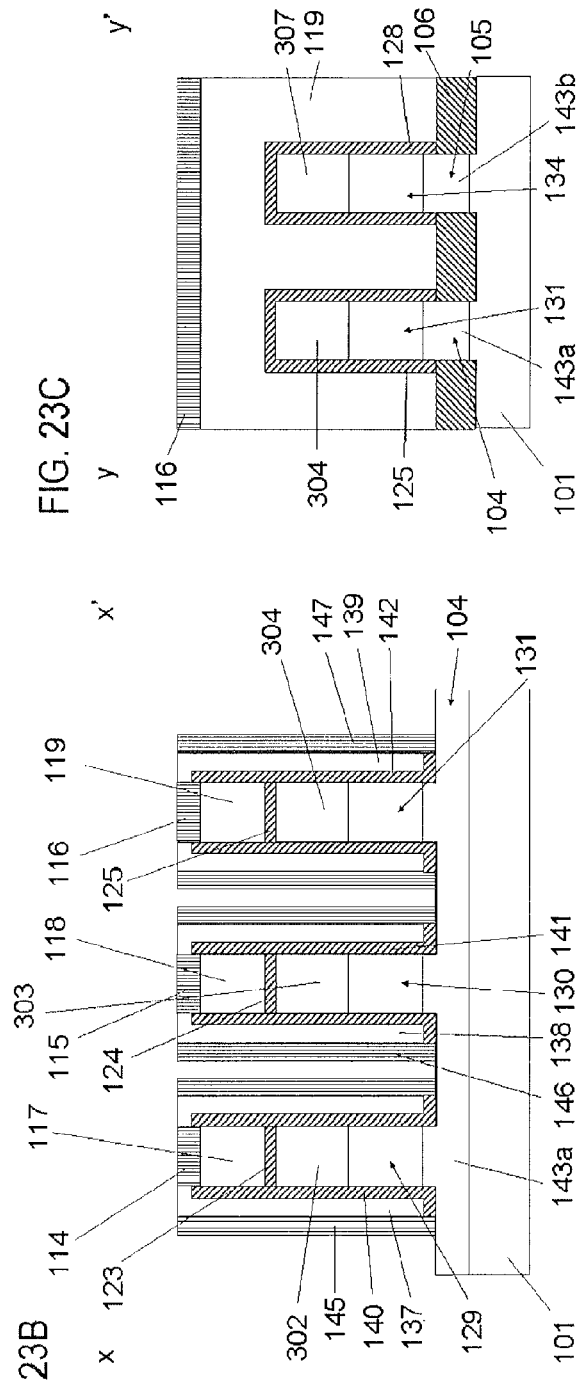
FIG. 23B
FIG. 23C

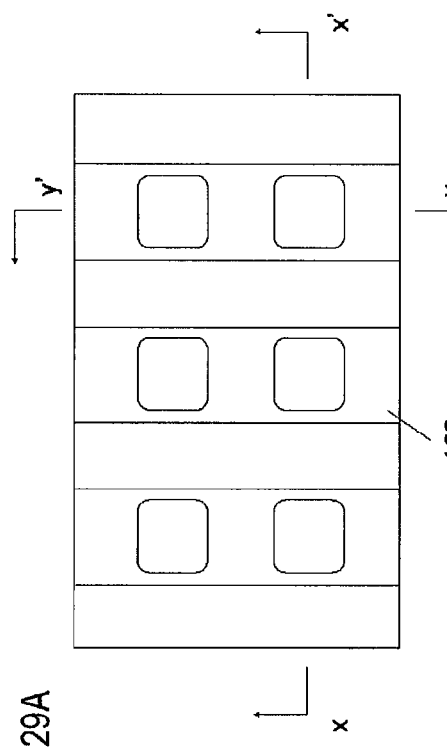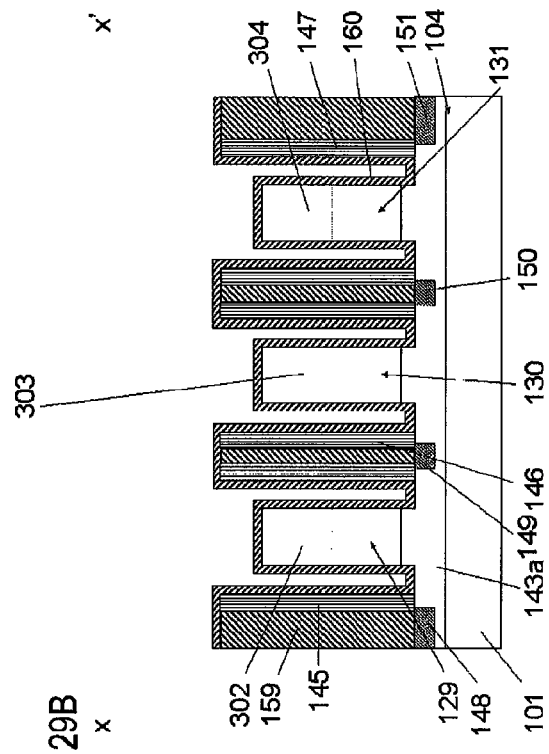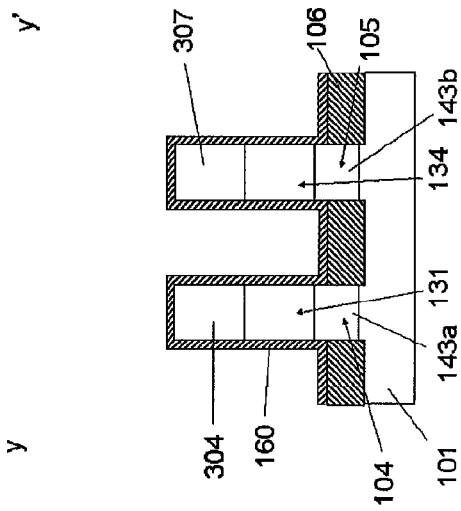

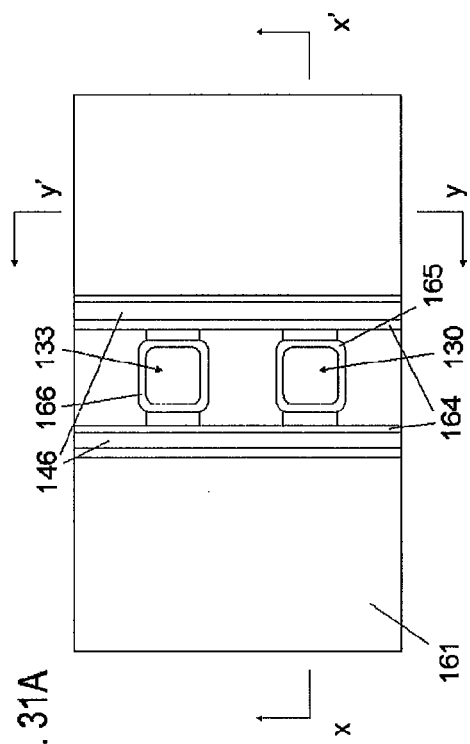
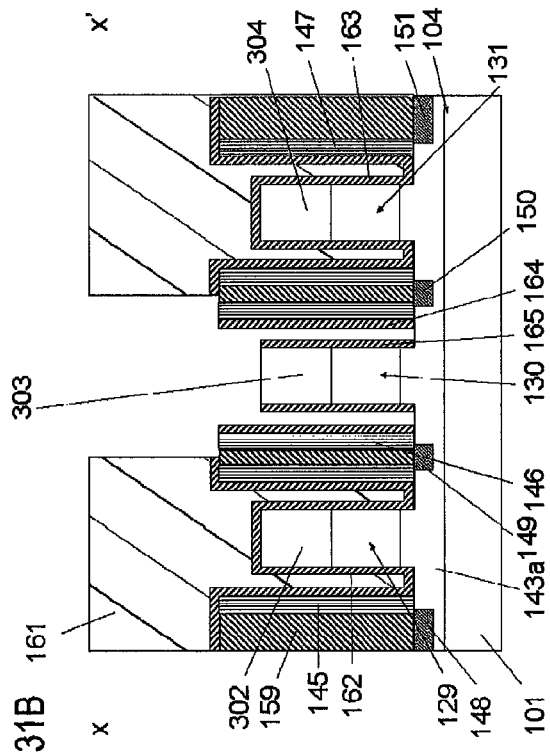
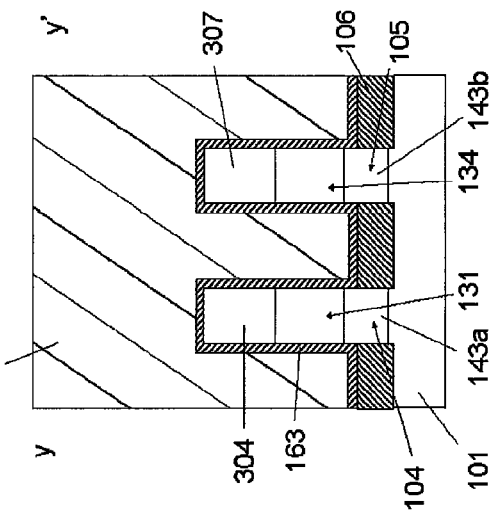
FIG. 31A
FIG. 31B
FIG. 31C

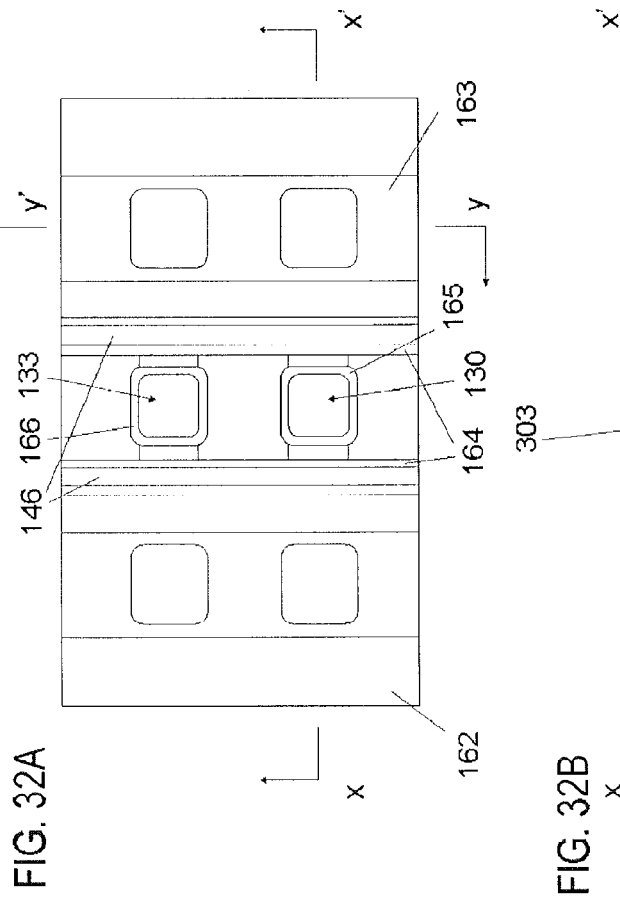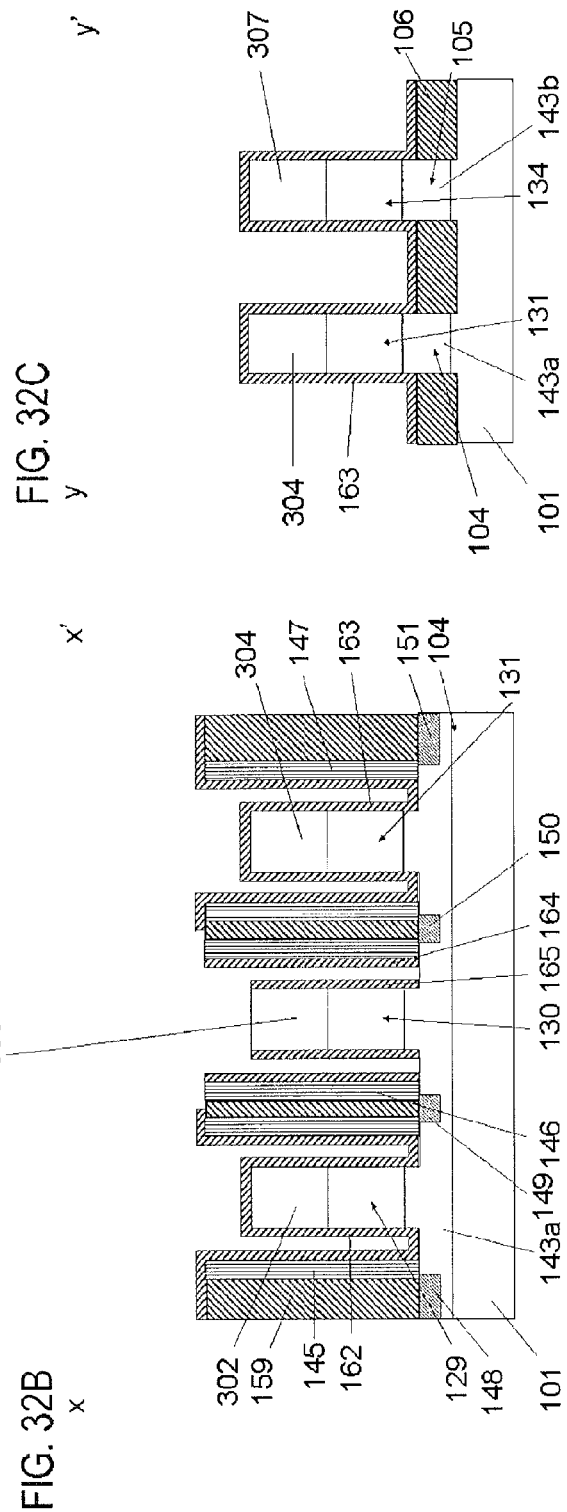
FIG. 32A
FIG. 32B
FIG. 32C

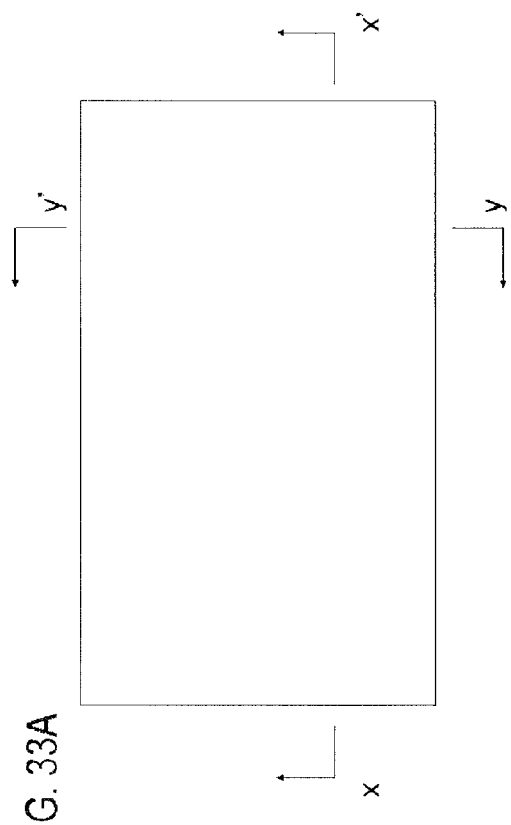
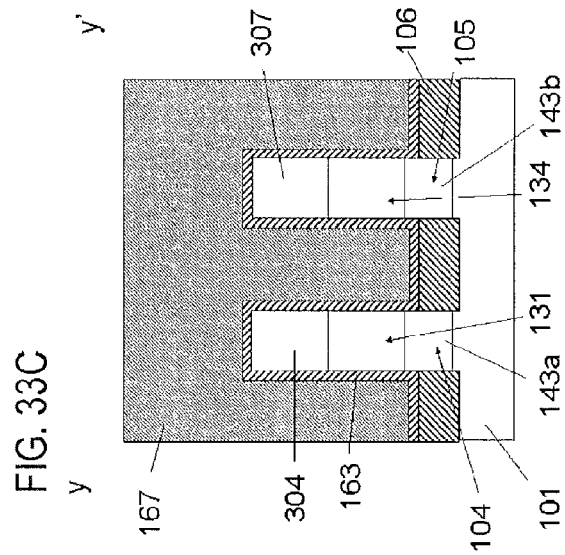
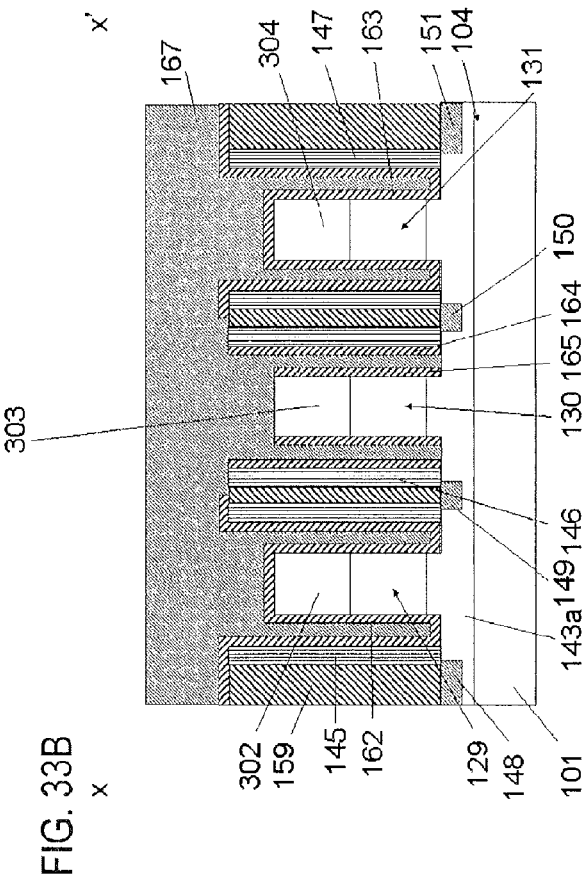

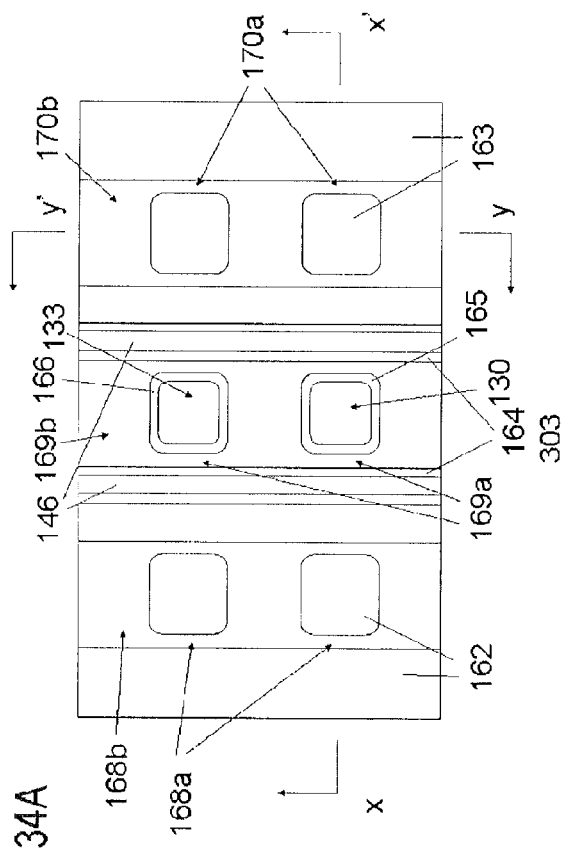
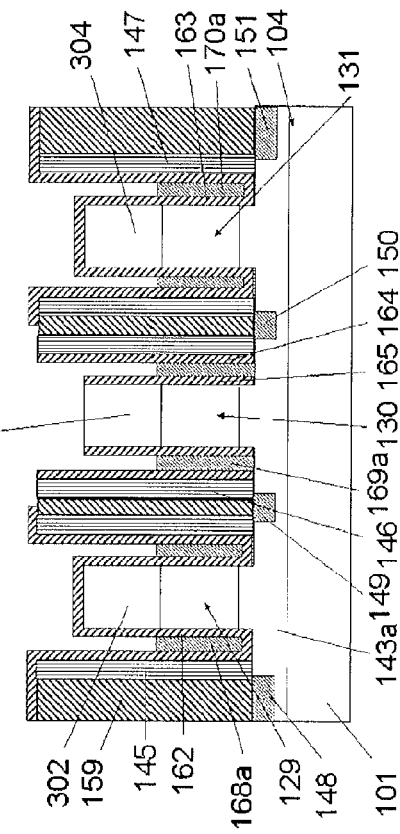
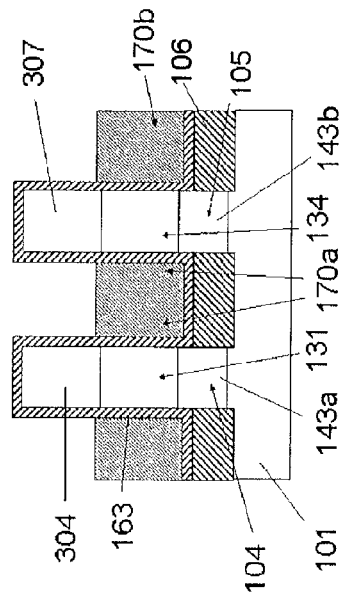
FIG. 34A
FIG. 34B
FIG. 34C

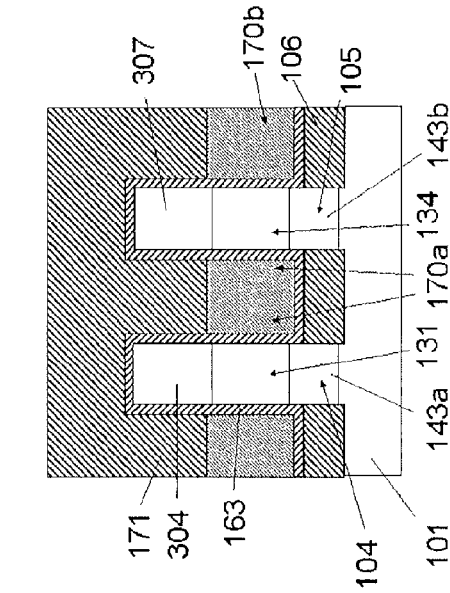
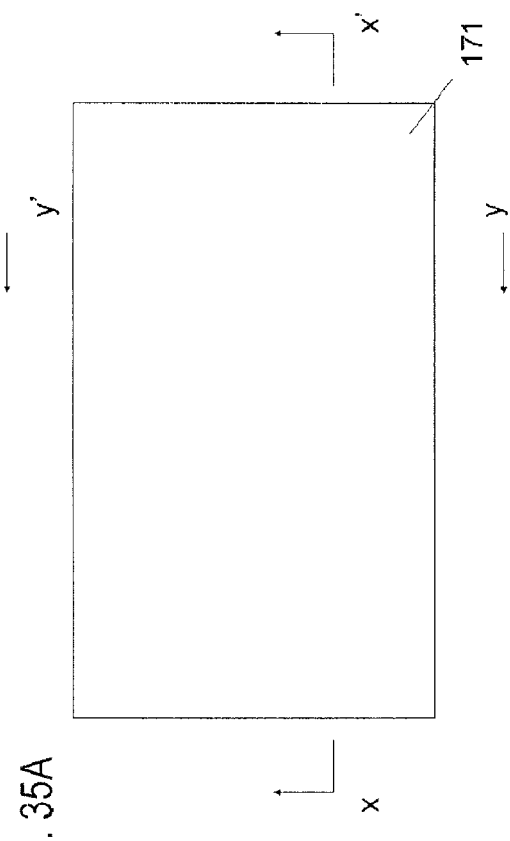
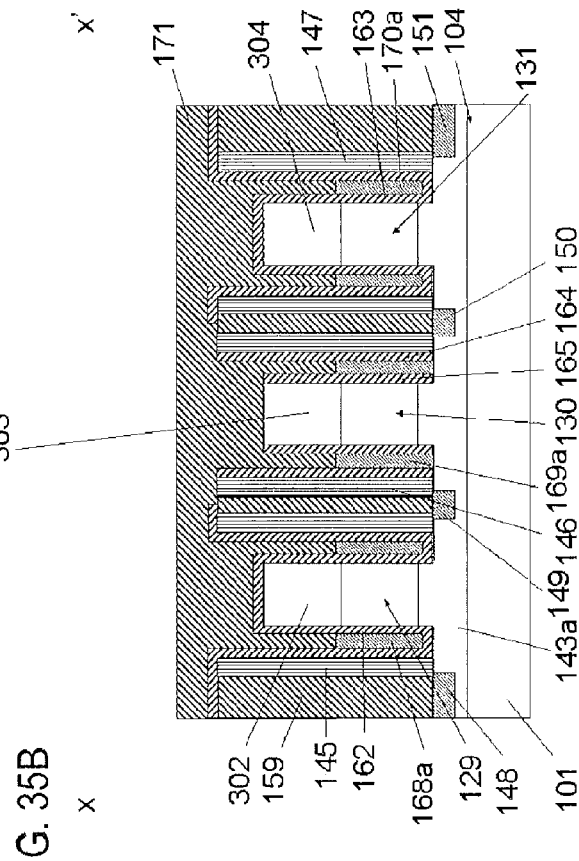

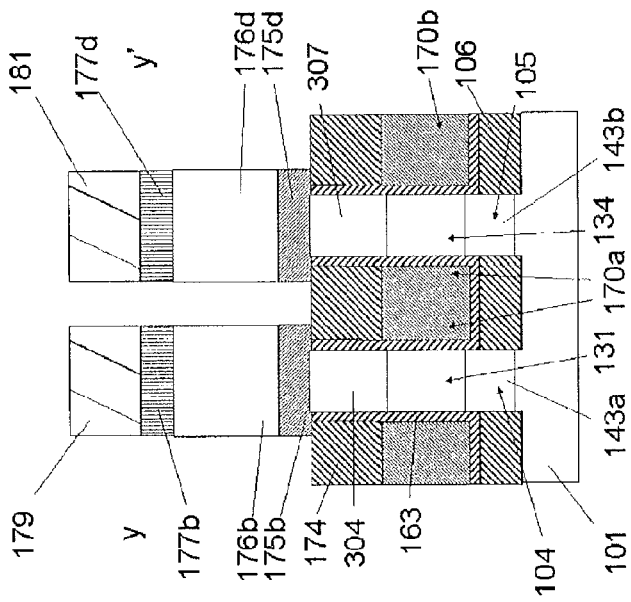
FIG. 39A
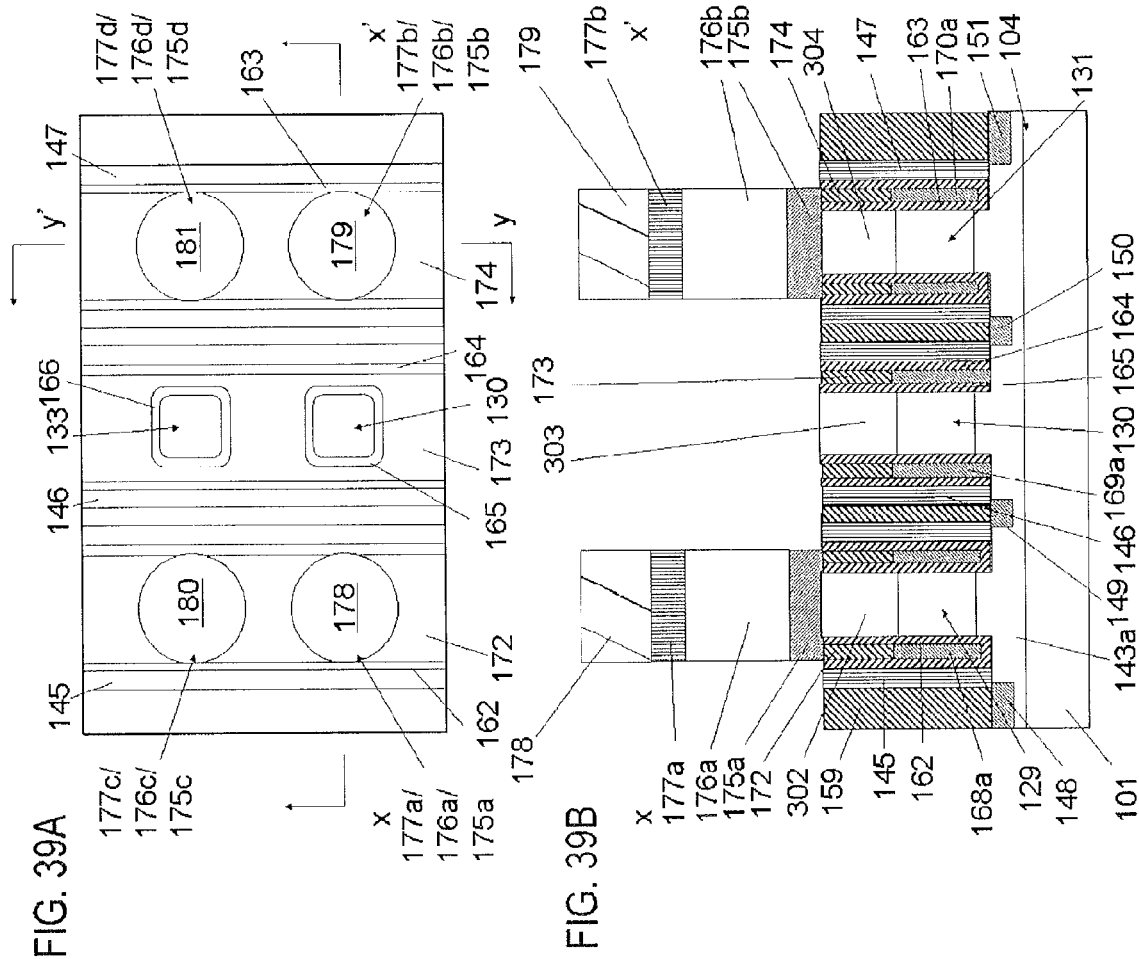
FIG. 39B
FIG. 39C

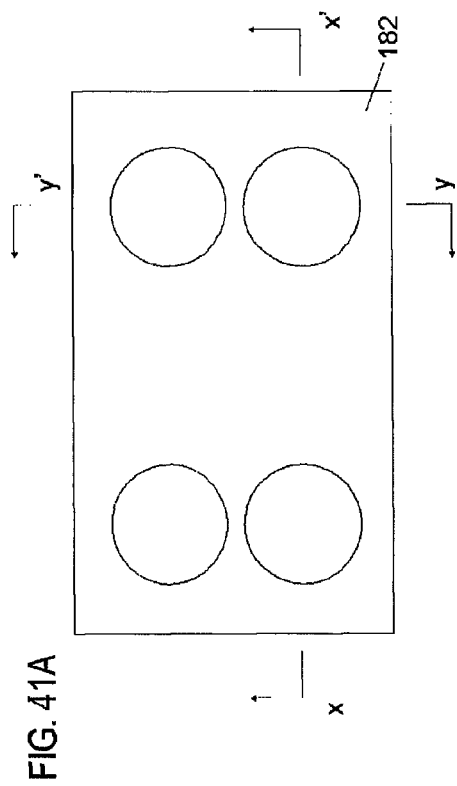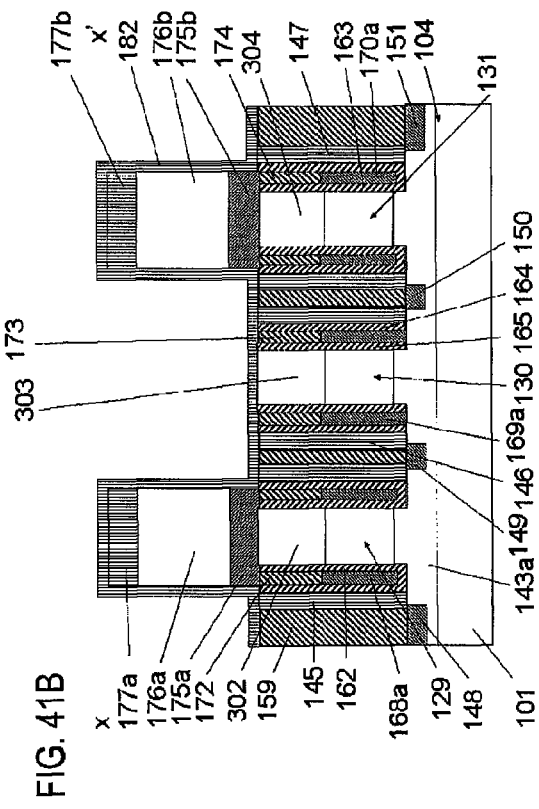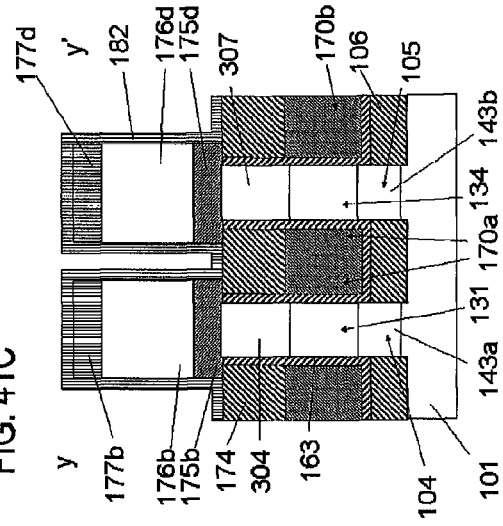
FIG. 41A
FIG. 41B
FIG. 41C

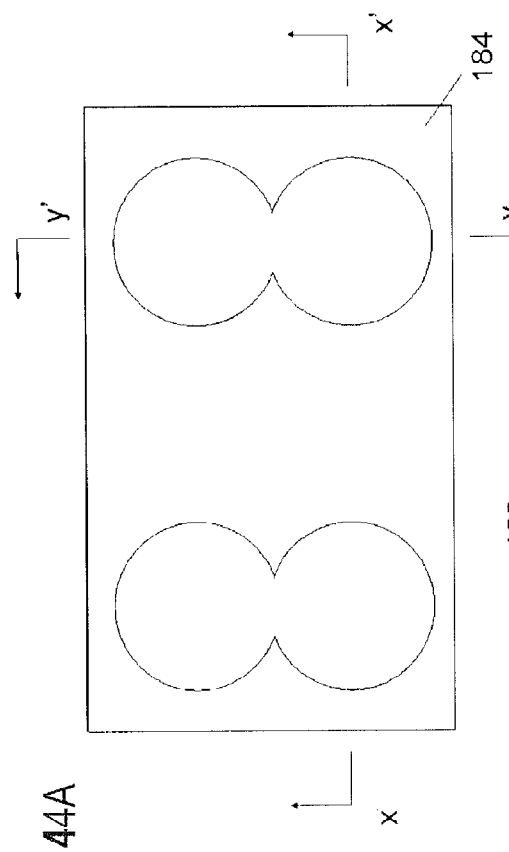
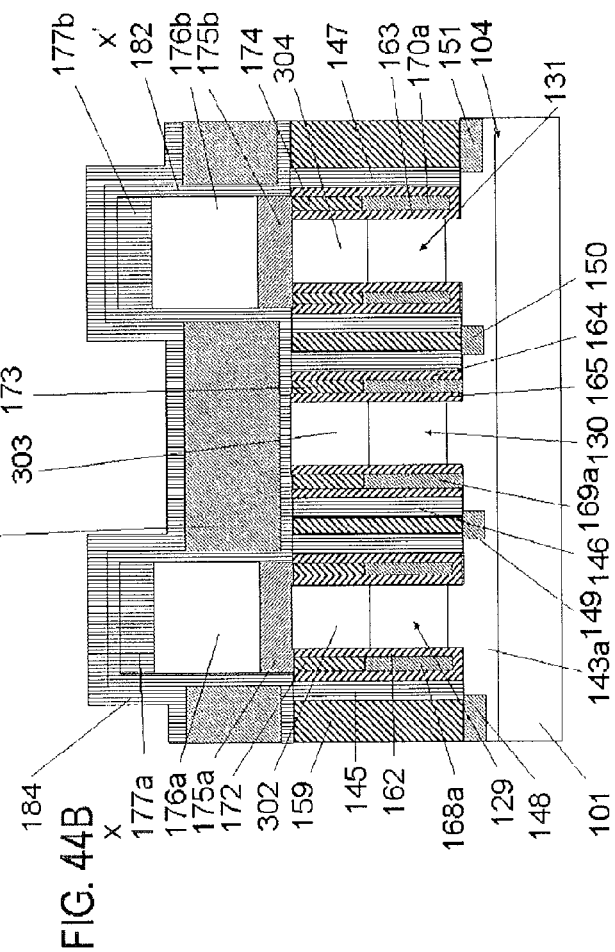

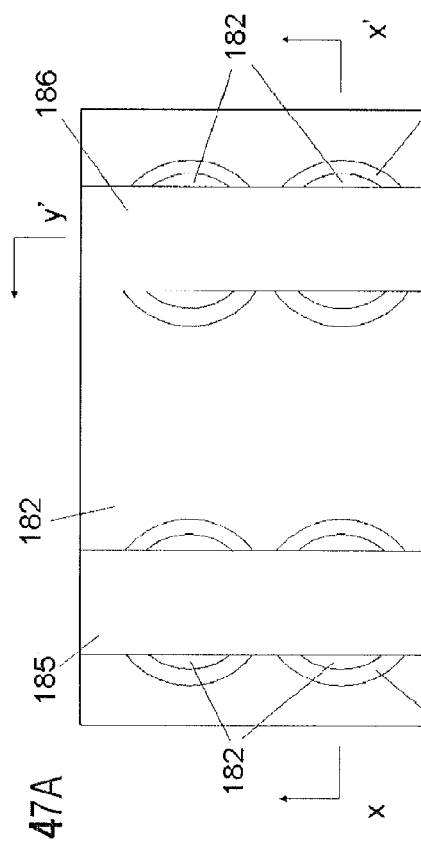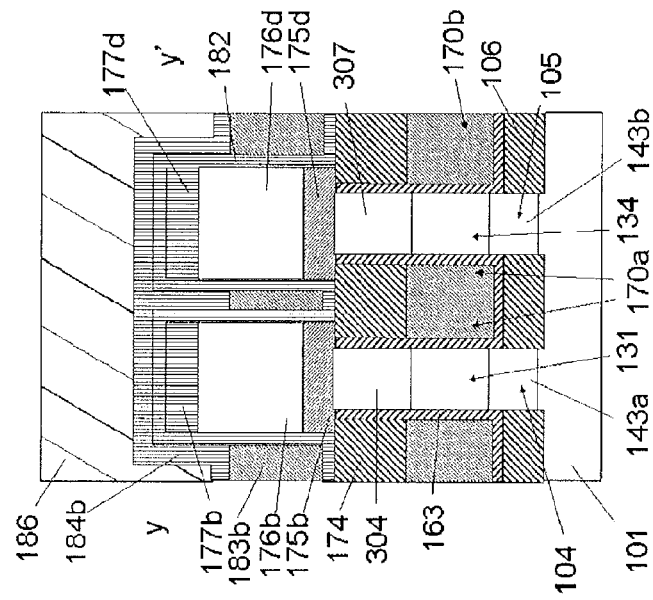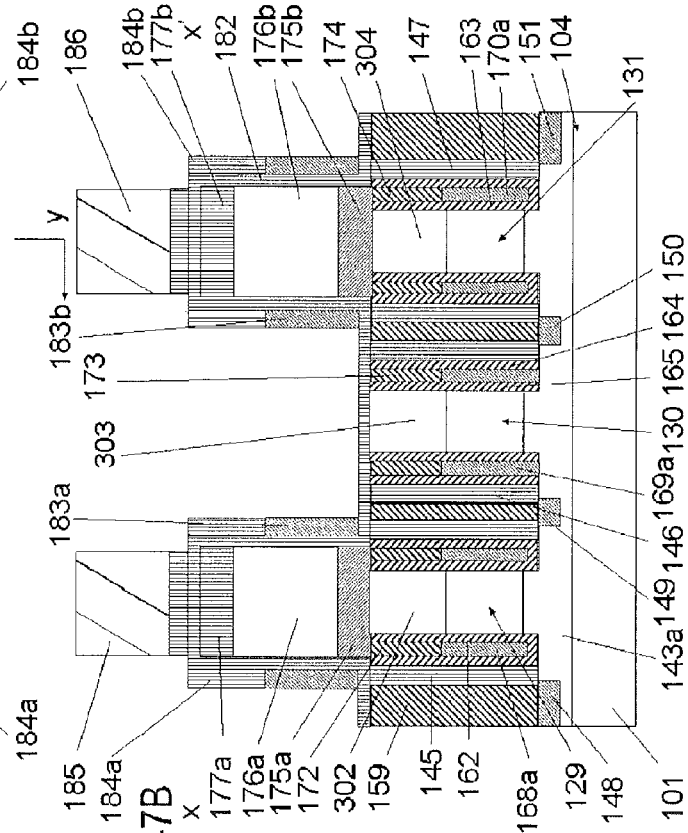

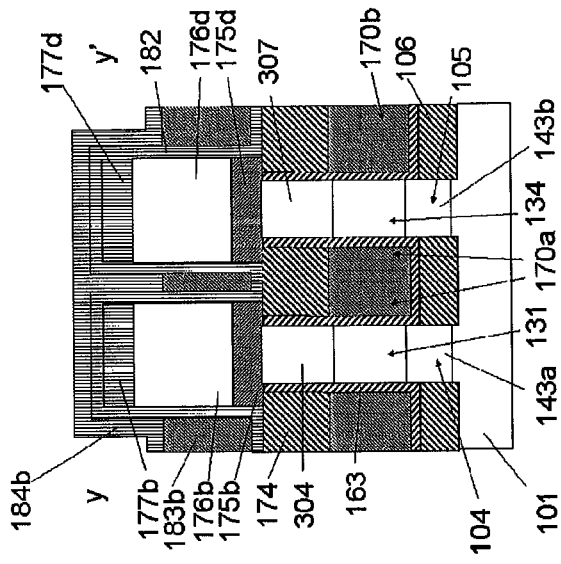
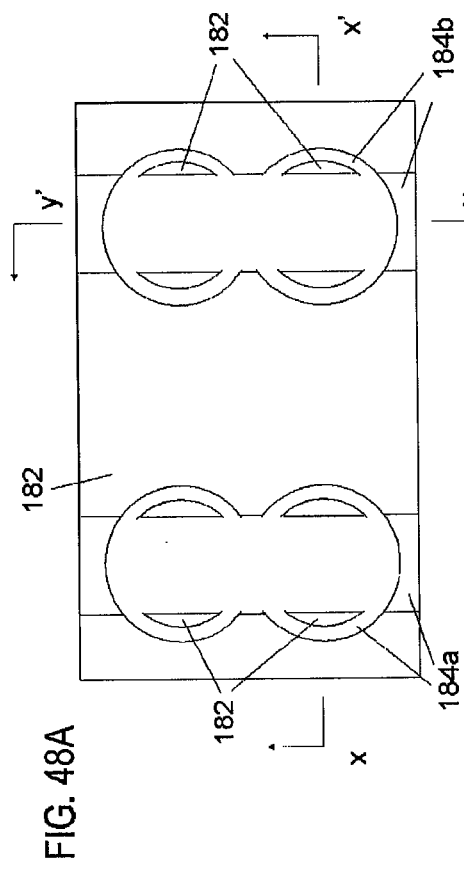
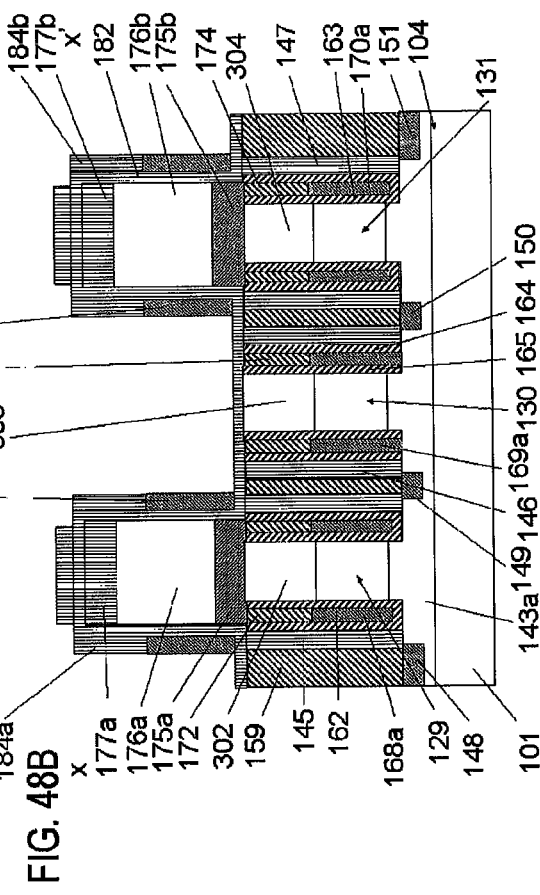

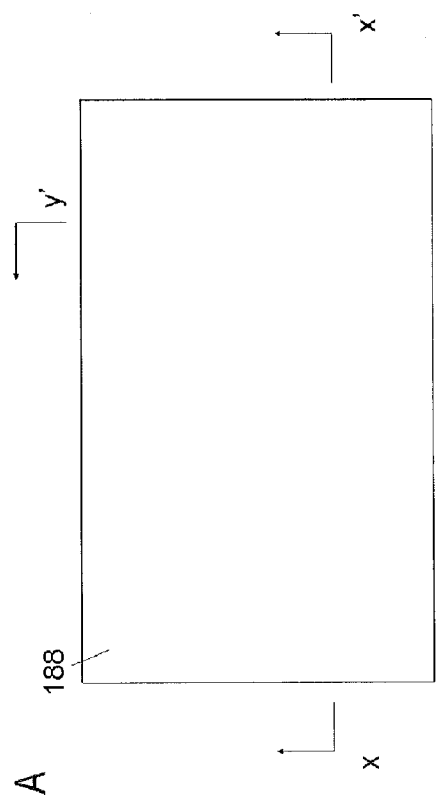
FIG. 51A
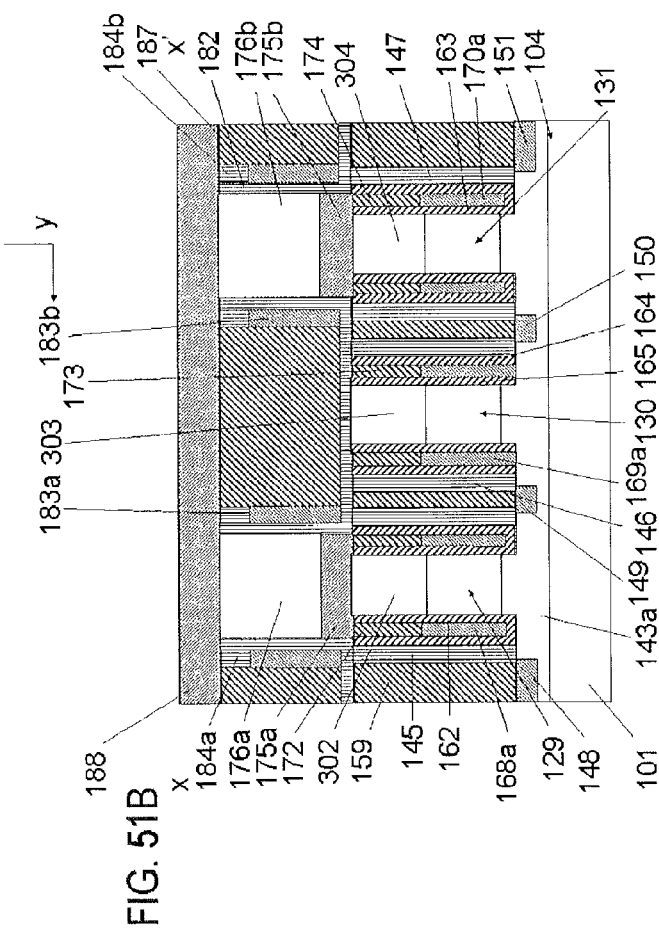
FIG. 51B
FIG. 51C

MEMORY DEVICE, SEMICONDUCTOR DEVICE, METHOD FOR PRODUCING MEMORY DEVICE, AND METHOD FOR PRODUCING SEMICONDUCTOR DEVICE

RELATED APPLICATIONS

This application is a continuation of U.S. patent application Ser. No. 14/483,791, filed Sep. 11, 2014, which is a continuation of PCT/JP2013/080148 filed on Nov. 7, 2013. The entire contents of which are incorporated by reference herein.

TECHNICAL FIELD

The present invention relates to a memory device, a semiconductor device, a method for producing a memory device, and a method for producing a semiconductor device.

BACKGROUND ART

In recent years, phase-change memories have been developing (refer to, for example, PTL 1). In phase-change memories, information is memorized by changing and recording the resistance of an information memory element of a memory cell.

The mechanism is as follows. When a current is allowed to flow between a bit line and a source line by turning a cell transistor to the on-state, heat is generated in a heater, which is a high-resistance element. Chalcogenide glass (GST: $Ge_2Sb_2Te_5$) that contacts this heater is melted, thereby causing a transition of the state of the chalcogenide glass. When the chalcogenide glass is melted at a high temperature (by supplying a high current) and cooled at a high speed (by stopping the current), the chalcogenide glass transitions to an amorphous state (reset operation). When the chalcogenide glass is melted at a relatively low high-temperature (by applying a low current) and slowly cooled (by gradually decreasing the current), the chalcogenide glass is crystallized (set operation). With this mechanism, at the time of reading out information, information of "0" or information of "1" is determined on the basis of the case where the amount of current flowing between the bit line and the source line is large (low resistance=crystal state) and the case where the current flowing between the bit line and the source line is small (high resistance=amorphous) (refer to, for example, PTL 1).

In this case, for example, the reset current is very large, namely, 200 μA. In order to make the reset current large in this manner and to allow this current to flow to a cell transistor, the size of a memory cell has to be very large. In order to allow a large current to flow, a selection element such as a bipolar transistor or a diode can be used (refer to, for example, PTL 1).

Diodes are two-terminal elements. Therefore, in order to select a memory cell, when one source line is selected, currents of all memory cells connected to the one source line flow in the one source line. Consequently, the IR drop in the resistance of the source line increases.

On the other hand, bipolar transistors are three-terminal elements. However, since a current flows in a gate, it is difficult to connect a large number of transistors to a word line.

A surrounding gate transistor (hereinafter referred to as "SGT") having a structure in which a source, a gate, and a drain are arranged in a direction perpendicular to a substrate and a gate electrode surrounds a pillar-shaped semiconductor layer has been proposed (refer to, for example, PTL 2). Since the source, the gate, and the drain are arranged in a direction perpendicular to the substrate, a small cell area can be realized.

CITATION LIST

Patent Literature

PTL 1: Japanese Unexamined Patent Application Publication No. 2012-204404
PTL 2: Japanese Unexamined Patent Application Publication No. 2004-356314

SUMMARY

Accordingly, an object is to provide a memory including a memory device which includes a layer whose resistance changes and in which reset can be performed by using a reset gate.

A memory device includes a reset gate whose resistance changes. The memory device also includes a pillar-shaped phase-change layer, a reset gate insulating film surrounding the pillar-shaped phase-change layer, and the reset gate surrounding the reset gate insulating film. The pillar-shaped phase-change layer and the reset gate are electrically insulated from each other by the reset gate insulating film.

The memory device may include a lower electrode under the pillar-shaped layer whose resistance changes.

The reset gate may be composed of titanium nitride.

The reset gate insulating film may be formed of a nitride film.

The lower electrode may be composed of titanium nitride.

The layer whose resistance changes may be reset by allowing a current to flow in the reset gate.

A semiconductor device includes a first pillar-shaped semiconductor layer, a gate insulating film formed around the first pillar-shaped semiconductor layer, a gate electrode formed around the gate insulating film, a gate line connected to the gate electrode, a first diffusion layer formed in an upper portion of the first pillar-shaped semiconductor layer, a second diffusion layer formed in a lower portion of the first pillar-shaped semiconductor layer, and the above-described memory device formed on the first diffusion layer.

The semiconductor device may include a fin-shaped semiconductor layer formed on a semiconductor substrate, a first insulating film formed around the fin-shaped semiconductor layer, the first pillar-shaped semiconductor layer formed on the fin-shaped semiconductor layer, and the gate insulating film formed on a periphery and a bottom portion of the gate electrode and the gate line. The gate electrode may be composed of a metal, the gate line may be composed of a metal, the gate line may extend in a direction perpendicular to a direction in which the fin-shaped semiconductor layer extends, and the second diffusion layer may be further formed in the fin-shaped semiconductor layer.

The second diffusion layer may be further formed in the semiconductor substrate.

The semiconductor device may include a contact line that is parallel to the gate line and connected to the second diffusion layer.

The semiconductor device may include the fin-shaped semiconductor layer formed on the semiconductor substrate, the first insulating film formed around the fin-shaped semiconductor layer, a second pillar-shaped semiconductor layer formed on the fin-shaped semiconductor layer, a contact electrode formed around the second pillar-shaped semiconductor layer and composed of a metal, the contact line connected to the contact electrode and composed of a metal extending in a direction perpendicular to the direction in which the fin-shaped semiconductor layer extends, and the second diffusion layer formed in the fin-shaped semiconductor layer and in a lower portion of the second pillar-shaped semiconductor layer. The contact electrode may be connected to the second diffusion layer.

An outer width of the gate electrode may be the same as a width of the gate line, and a width of the first pillar-shaped semiconductor layer in the direction perpendicular to the direction in which the fin-shaped semiconductor layer extends may be the same as a width of the fin-shaped semiconductor layer in the direction perpendicular to the direction in which the fin-shaped semiconductor layer extends.

The semiconductor device may include the gate insulating film formed between the second pillar-shaped semiconductor layer and the contact electrode.

A width of the second pillar-shaped semiconductor layer in the direction perpendicular to the direction in which the fin-shaped semiconductor layer extends may be the same as the width of the fin-shaped semiconductor layer in the direction perpendicular to the direction in which the fin-shaped semiconductor layer extends.

The semiconductor device may include the gate insulating film formed on a periphery of the contact electrode and the contact line.

An outer width of the contact electrode may be the same as a width of the contact line.

The semiconductor device may include the first pillar-shaped semiconductor layer formed on a semiconductor substrate, and the gate insulating film formed on a periphery and a bottom portion of the gate electrode and the gate line. The gate electrode may be composed of a metal, the gate line may be composed of a metal, and the second diffusion layer may be further formed in the semiconductor substrate.

A method for producing a memory device according to the present invention includes a sixth step of forming a pillar-shaped layer whose resistance changes and a lower electrode on a semiconductor substrate, forming a reset gate insulating film so as to surround the pillar-shaped layer whose resistance changes and the lower electrode, and forming a reset gate.

A method for producing a semiconductor device includes a first step of forming a fin-shaped semiconductor layer on a semiconductor substrate and forming a first insulating film around the fin-shaped semiconductor layer; a second step of, after the first step, forming a second insulating film around the fin-shaped semiconductor layer, depositing a first polysilicon on the second insulating film and planarizing the first polysilicon, forming a second resist for forming a gate line, a first pillar-shaped semiconductor layer, a second pillar-shaped semiconductor layer, and a contact line in a direction perpendicular to a direction in which the fin-shaped semiconductor layer extends, and etching the first polysilicon, the second insulating film, and the fin-shaped semiconductor layer to thereby form a first pillar-shaped semiconductor layer, a first dummy gate composed of the first polysilicon, a second pillar-shaped semiconductor layer, and a second dummy gate composed of the first polysilicon; a third step of, after the second step, forming a fourth insulating film around the first pillar-shaped semiconductor layer, the second pillar-shaped semiconductor layer, the first dummy gate, and the second dummy gate, depositing a second polysilicon around the fourth insulating film, and leaving, by conducting etching, the second polysilicon on side walls of the first dummy gate, the first pillar-shaped semiconductor layer, the second dummy gate, and the second pillar-shaped semiconductor layer to form a third dummy gate and a fourth dummy gate; a fourth step of forming a second diffusion layer in an upper portion of the fin-shaped semiconductor layer, in a lower portion of the first pillar-shaped semiconductor layer, and in a lower portion of the second pillar-shaped semiconductor layer, forming a fifth insulating film around the third dummy gate and the fourth dummy gate, leaving the fifth insulating film in a side wall shape by etching to form side walls formed of the fifth insulating film, and forming a compound of a metal and a semiconductor in an upper portion of the second diffusion layer; a fifth step of, after the fourth step, depositing an interlayer insulating film and planarizing the interlayer insulating film to expose upper portions of the first dummy gate, the second dummy gate, the third dummy gate, and the fourth dummy gate, removing the first dummy gate, the second dummy gate, the third dummy gate, and the fourth dummy gate, removing the second insulating film and the fourth insulating film, forming a gate insulating film around the first pillar-shaped semiconductor layer, around the second pillar-shaped semiconductor layer, and on an inner side of the fifth insulating film, forming a fourth resist for removing a portion of the gate insulating film which is located on a periphery of a bottom portion of the second pillar-shaped semiconductor layer, removing the portion of the gate insulating film which is located on the periphery of the bottom portion of the second pillar-shaped semiconductor layer, depositing a metal and etching back the metal to form a gate electrode and a gate line around the first pillar-shaped semiconductor layer and to form a contact electrode and a contact line around the second pillar-shaped semiconductor layer; after the fifth step, depositing a second interlayer insulating film and planarizing the second interlayer insulating film to expose an upper portion of the first pillar-shaped semiconductor layer; and the sixth step described above.

The method for producing a semiconductor device may further include, after depositing the first polysilicon on the second insulating film and planarizing the first polysilicon, forming a third insulating film on the first polysilicon.

A fourth insulating film may be formed around the first pillar-shaped semiconductor layer, the first dummy gate, the second pillar-shaped semiconductor layer, and the second dummy gate. A third resist may then be formed and etchback is performed to expose an upper portion of the first pillar-shaped semiconductor layer, and a first diffusion layer may be formed in the upper portion of the first pillar-shaped semiconductor layer.

According to the present invention, it is possible to provide a memory including a memory device which includes a layer whose resistance changes and in which reset can be performed by using a reset gate.

The memory device includes a pillar-shaped layer whose resistance changes, a reset gate insulating film surrounding the pillar-shaped layer whose resistance changes, and a reset gate surrounding the reset gate insulating film. With this structure, when a current is supplied to the reset gate, heat is generated in the reset gate functioning as a heater. Consequently, chalcogenide glass (GST: $Ge_2Sb_2Te_5$) that contacts this heater is melted, and a transition of the state of the chalcogenide glass can be caused.

The memory device has the structure in which the reset gate surrounds the pillar-shaped layer whose resistance changes, and thus the pillar-shaped layer whose resistance changes is easily heated.

Since the reset is performed by allowing a current to flow in the reset gate, a large current need not be supplied to a selection element and it is sufficient that a low current for a set operation can be allowed to flow in the selection element.

BRIEF DESCRIPTION OF THE DRAWING

FIG. 3A is a plan view of a memory device according to the present invention. FIG. 3B is a cross-sectional view taken along line X-X' of FIG. 3A. FIG. 3C is a cross-sectional view taken along line Y-Y' of FIG. 3A.

FIG. 7A is a plan view illustrating the method for producing a memory device according to the present invention. FIG. 7B is a cross-sectional view taken along line X-X' of FIG. 7A. FIG. 7C is a cross-sectional view taken along line Y-Y' of FIG. 7A.

FIG. 9A is a plan view illustrating the method for producing a memory device according to the present invention. FIG. 9B is a cross-sectional view taken along line X-X' of FIG. 9A. FIG. 9C is a cross-sectional view taken along line Y-Y' of FIG. 9A.

FIG. 12A is a plan view illustrating the method for producing a memory device according to the present invention. FIG. 12B is a cross-sectional view taken along line X-X' of FIG. 12A. FIG. 12C is a cross-sectional view taken along line Y-Y' of FIG. 12A.

FIG. 17A is a plan view illustrating the method for producing a memory device according to the present invention. FIG. 17B is a cross-sectional view taken along line X-X' of FIG. 17A. FIG. 17C is a cross-sectional view taken along line Y-Y' of FIG. 17A.

FIG. 20A is a plan view illustrating the method for producing a memory device according to the present invention. FIG. 20B is a cross-sectional view taken along line X-X' of FIG. 20A. FIG. 20C is a cross-sectional view taken along line Y-Y' of FIG. 20A.

FIG. 21A is a plan view illustrating the method for producing a memory device according to the present invention. FIG. 21B is a cross-sectional view taken along line X-X' of FIG. 21A. FIG. 21C is a cross-sectional view taken along line Y-Y' of FIG. 21A.

FIG. 22A is a plan view illustrating the method for producing a memory device according to the present invention. FIG. 22B is a cross-sectional view taken along line X-X' of FIG. 22A. FIG. 22C is a cross-sectional view taken along line Y-Y' of FIG. 22A.

FIG. 23A is a plan view illustrating the method for producing a memory device according to the present invention. FIG. 23B is a cross-sectional view taken along line X-X' of FIG. 23A. FIG. 23C is a cross-sectional view taken along line Y-Y' of FIG. 23A.

FIG. 24A is a plan view illustrating the method for producing a memory device according to the present invention. FIG. 24B is a cross-sectional view taken along line X-X' of FIG. 24A. FIG. 24C is a cross-sectional view taken along line Y-Y' of FIG. 24A.

FIG. 29A is a plan view illustrating the method for producing a memory device according to the present invention. FIG. 29B is a cross-sectional view taken along line X-X' of FIG. 29A. FIG. 29C is a cross-sectional view taken along line Y-Y' of FIG. 29A.

FIG. 31A is a plan view illustrating the method for producing a memory device according to the present invention. FIG. 31B is a cross-sectional view taken along line X-X' of FIG. 31A. FIG. 31C is a cross-sectional view taken along line Y-Y' of FIG. 31A.

FIG. 32A is a plan view illustrating the method for producing a memory device according to the present invention. FIG. 32B is a cross-sectional view taken along line X-X' of FIG. 32A. FIG. 32C is a cross-sectional view taken along line Y-Y' of FIG. 32A.

FIG. 33A is a plan view illustrating the method for producing a memory device according to the present invention. FIG. 33B is a cross-sectional view taken along line X-X' of FIG. 33A. FIG. 33C is a cross-sectional view taken along line Y-Y' of FIG. 33A.

FIG. 34A is a plan view illustrating the method for producing a memory device according to the present invention. FIG. 34B is a cross-sectional view taken along line X-X' of FIG. 34A. FIG. 34C is a cross-sectional view taken along line Y-Y' of FIG. 34A.

FIG. 35A is a plan view illustrating the method for producing a memory device according to the present invention. FIG. 35B is a cross-sectional view taken along line X-X' of FIG. 35A. FIG. 35C is a cross-sectional view taken along line Y-Y' of FIG. 35A.

FIG. 39A is a plan view illustrating the method for producing a memory device according to the present invention. FIG. 39B is a cross-sectional view taken along line X-X' of FIG. 39A. FIG. 39C is a cross-sectional view taken along line Y-Y' of FIG. 39A.

FIG. 41A is a plan view illustrating the method for producing a memory device according to the present invention. FIG. 41B is a cross-sectional view taken along line X-X' of FIG. 41A. FIG. 41C is a cross-sectional view taken along line Y-Y' of FIG. 41A.

FIG. 44A is a plan view illustrating the method for producing a memory device according to the present invention. FIG. 44B is a cross-sectional view taken along line X-X' of FIG. 44A. FIG. 44C is a cross-sectional view taken along line Y-Y' of FIG. 44A.

FIG. 47A is a plan view illustrating the method for producing a memory device according to the present invention. FIG. 47B is a cross-sectional view taken along line X-X' of FIG. 47A. FIG. 47C is a cross-sectional view taken along line Y-Y' of FIG. 47A.

FIG. 48A is a plan view illustrating the method for producing a memory device according to the present invention. FIG. 48B is a cross-sectional view taken along line X-X' of FIG. 48A. FIG. 48C is a cross-sectional view taken along line Y-Y' of FIG. 48A.

FIG. 51A is a plan view illustrating the method for producing a memory device according to the present invention. FIG. 51B is a cross-sectional view taken along line X-X' of FIG. 51A. FIG. 51C is a cross-sectional view taken along line Y-Y' of FIG. 51A.

DETAILED DESCRIPTION OF THE PREFERRED EMBODIMENTS

Figure 1B:
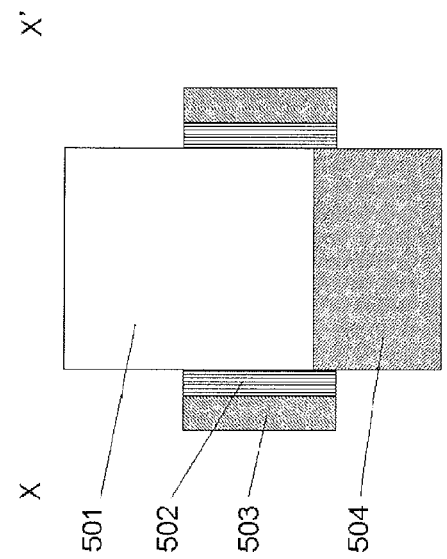
FIG. 1B is a cross-sectional view taken along line X-X' of FIG. 1A.
Figure 1C:
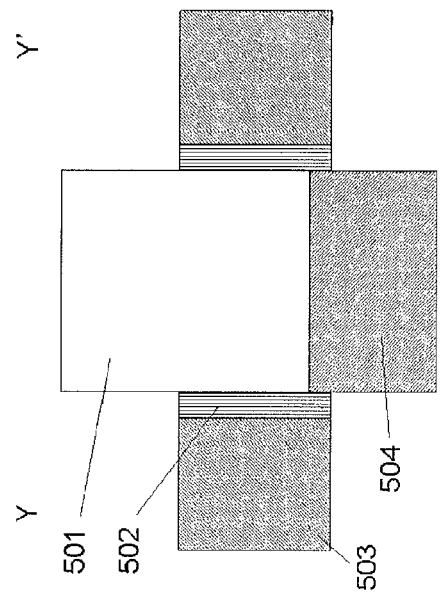
FIG. 1C is a cross-sectional view taken along line Y-Y' of FIG. 1A.
Figure 1A:
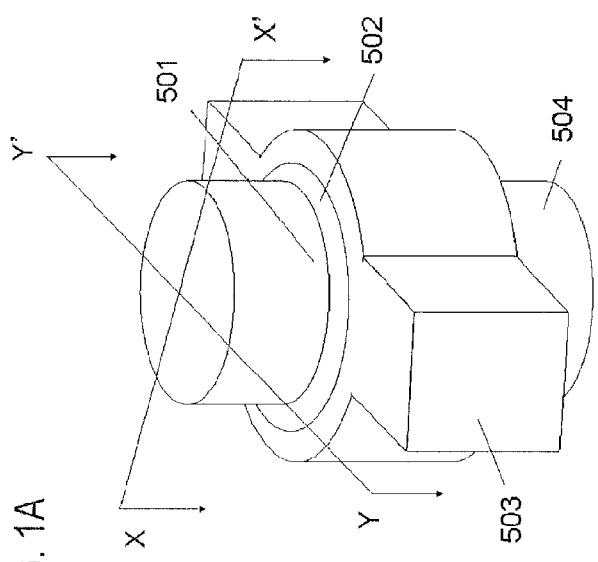
FIG. 1A is a bird's-eye view of a memory device according to the present invention.

FIGS. 1A, 1B and 1C illustrate a structure of a memory device.

The memory device includes a pillar-shaped layer 501 whose resistance changes, a reset gate insulating film 502 surrounding the pillar-shaped layer 501 whose resistance changes, and a reset gate 503 surrounding the reset gate insulating film 502.

The pillar-shaped layer 501 whose resistance changes is preferably composed of chalcogenide glass (GST: $Ge_2Sb_2Te_5$).

A lower electrode 504 is provided under the pillar-shaped layer 501 whose resistance changes.

The reset gate 503 may be composed of any material that generates heat when a current flows therein. The reset gate 503 is preferably composed of titanium nitride.

The reset gate insulating film 502 may be any insulating film having good thermal conductivity. The reset gate insulating film 502 is preferably formed of a nitride film.

The lower electrode 504 may be composed of any material that generates heat when a current flows therein. The lower electrode 504 is preferably composed of titanium nitride.

By allowing a current to flow in the reset gate 503, heat is generated in the reset gate 503, which functions as a heater, and the pillar-shaped layer 501 whose resistance changes, the pillar-shaped layer 501 contacting this heater, is melted and a transition of the state of the pillar-shaped layer 501 can be caused.

Figure 2A:
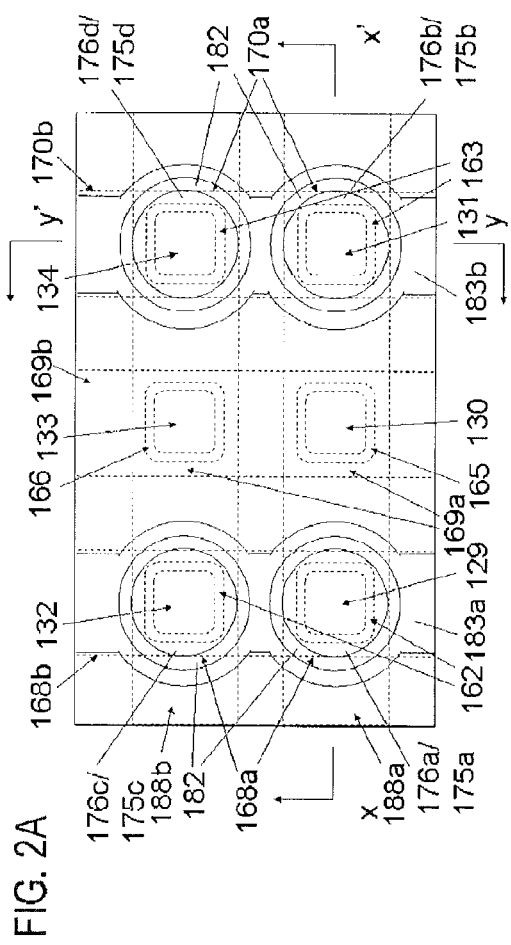
FIG. 2A is a plan view of a memory device according to the present invention.
Figure 2C:
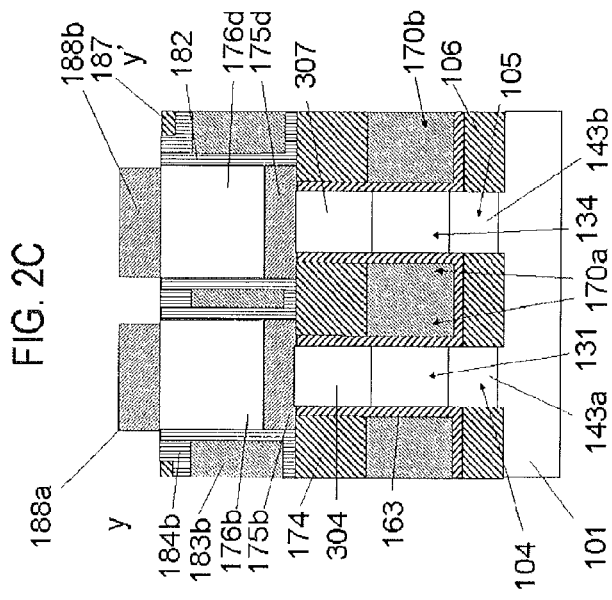
FIG. 2C is a cross-sectional view taken along line Y-Y' of FIG. 2A.
Figure 2B:
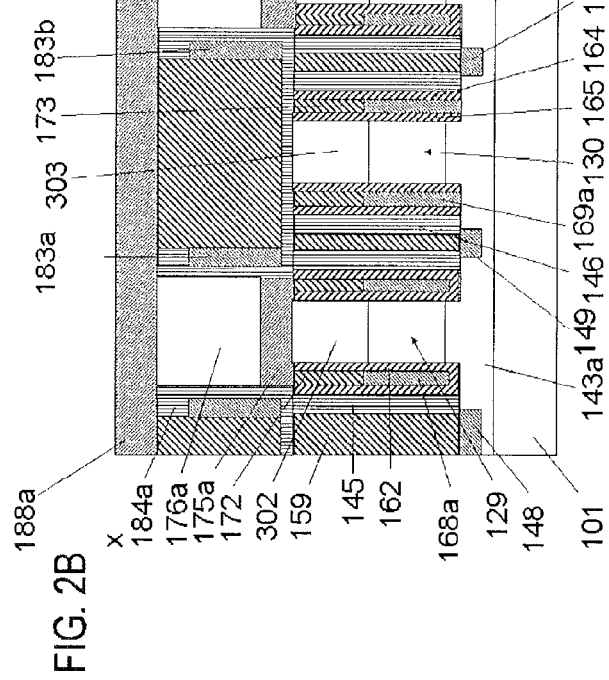
FIG. 2B is a cross-sectional view taken along line X-X' of FIG. 2A.

In FIGS. 2A, 2B and 2C, a memory cell, which is a semiconductor device of the present invention, is arranged in each of the first column of the first row, the third column of the first row, the first column of the second row, and the third column of the second row. Furthermore, in order to connect source lines to each other, a contact device including a contact electrode and a contact line is arranged in the second column of the first row and the second column of the second row.

The memory cell in the first column of the second row includes a fin-shaped semiconductor layer 104 formed on a semiconductor substrate 101, a first insulating film 106 formed around the fin-shaped semiconductor layer 104, and a first pillar-shaped semiconductor layer 129 formed on the fin-shaped semiconductor layer 104. A width of the first pillar-shaped semiconductor layer 129 in a direction perpendicular to a direction in which the fin-shaped semiconductor layer 104 extends is the same as a width of the fin-shaped semiconductor layer 104 in the direction perpendicular to the direction in which the fin-shaped semiconductor layer 104 extends. Furthermore, the memory cell in the first column of the second row includes the first pillar-shaped semiconductor layer 129, a gate insulating film 162 formed around the first pillar-shaped semiconductor layer 129, a gate electrode 168a composed of a metal and formed around the gate insulating film 162, a gate line 168b composed of a metal and connected to the gate electrode 168a, and the gate insulating film 162 formed on a periphery and a bottom portion of the gate electrode 168a and the gate line 168b. The gate line 168b extends in the direction perpendicular to the direction in which the fin-shaped semiconductor layer 104 extends. The gate electrode 168a has an outer width the same as a width of the gate line 168b. Furthermore, the memory cell in the first column of the second row includes a first diffusion layer 302 formed in an upper portion of the first pillar-shaped semiconductor layer 129 and a second diffusion layer 143a formed in a lower portion of the first pillar-shaped semiconductor layer 129. The second diffusion layer 143a is further formed in the fin-shaped semiconductor layer 104.

A lower electrode 175a, a pillar-shaped layer 176a whose resistance changes, a reset gate insulating film 182, and a reset gate 183a are disposed on the first diffusion layer 302.

The memory cell in the third column of the second row includes the fin-shaped semiconductor layer 104 formed on the semiconductor substrate 101, the first insulating film 106 formed around the fin-shaped semiconductor layer 104, and a first pillar-shaped semiconductor layer 131 formed on the fin-shaped semiconductor layer 104. A width of the first pillar-shaped semiconductor layer 131 in a direction perpendicular to the direction in which the fin-shaped semiconductor layer 104 extends is the same as a width of the fin-shaped semiconductor layer 104 in the direction perpendicular to the direction in which the fin-shaped semiconductor layer 104 extends. Furthermore, the memory cell in the third column of the second row includes the first pillar-shaped semiconductor layer 131, a gate insulating film 163 formed around the first pillar-shaped semiconductor layer 131, a gate electrode 170a composed of a metal and formed around the gate insulating film 163, a gate line 170b composed of a metal and connected to the gate electrode 170a, and the gate insulating film 163 formed on a periphery and a bottom portion of the gate electrode 170a and the gate line 170b. The gate line 170b extends in the direction perpendicular to the direction in which the fin-shaped semiconductor layer 104 extends. The gate electrode 170a has an outer width the same as a width of the gate line 170b. Furthermore, the memory cell in the third column of the second row includes a first diffusion layer 304 formed in an upper portion of the first pillar-shaped semiconductor layer 131, and the second diffusion layer 143a formed in a lower portion of the first pillar-shaped semiconductor layer 131. The second diffusion layer 143a is further formed in the fin-shaped semiconductor layer 104.

A lower electrode 175b, a pillar-shaped layer 176b whose resistance changes, the reset gate insulating film 182, and a reset gate 183b are disposed on the first diffusion layer 304.

An upper portion of the pillar-shaped layer 176a whose resistance changes and an upper portion of the pillar-shaped layer 176b whose resistance changes are connected by a bit line 188a.

The memory cell in the first column of the first row includes a fin-shaped semiconductor layer 105 formed on the semiconductor substrate 101, the first insulating film 106 formed around the fin-shaped semiconductor layer 105, and a first pillar-shaped semiconductor layer 132 formed on the fin-shaped semiconductor layer 105. A width of the first pillar-shaped semiconductor layer 132 in a direction perpendicular to a direction in which the fin-shaped semiconductor layer 105 extends is the same as a width of the fin-shaped semiconductor layer 105 in the direction perpendicular to the direction in which the fin-shaped semiconductor layer 105 extends. Furthermore, the memory cell in the first column of the first row includes the first pillar-shaped semiconductor layer 132, the gate insulating film 162 formed around the first pillar-shaped semiconductor layer 132, the gate electrode 168a composed of the metal and formed around the gate insulating film 162, the gate line 168b composed of the metal and connected to the gate electrode 168a, and the gate insulating film 162 formed on a periphery and a bottom portion of the gate electrode 168a and the gate line 168b. The gate line 168b extends in the direction perpendicular to the direction in which the fin-shaped semiconductor layer 105 extends. The gate electrode 168a has an outer width the same as a width of the gate line 168b. Furthermore, the memory cell in the first column of the first row includes a first diffusion layer 305 formed in an upper portion of the first pillar-shaped semiconductor layer 132, and a second diffusion layer 143b formed in a lower portion of the first pillar-shaped semiconductor layer 132. The second diffusion layer 143b is further formed in the fin-shaped semiconductor layer 105.

A lower electrode 175c, a pillar-shaped layer 176c whose resistance changes, the reset gate insulating film 182, and the reset gate 183a are disposed on the first diffusion layer 305.

The memory cell in the third column of the first row includes the fin-shaped semiconductor layer 105 formed on the semiconductor substrate 101, the first insulating film 106 formed around the fin-shaped semiconductor layer 105, and a first pillar-shaped semiconductor layer 134 formed on the fin-shaped semiconductor layer 105. A width of the first pillar-shaped semiconductor layer 134 in a direction perpendicular to the direction in which the fin-shaped semiconductor layer 105 extends is the same as a width of the fin-shaped semiconductor layer 105 in the direction perpendicular to the direction in which the fin-shaped semiconductor layer 105 extends. Furthermore, the memory cell in the third column of the first row includes the first pillar-shaped semiconductor layer 134, the gate insulating film 163 formed around the first pillar-shaped semiconductor layer 134, the gate electrode 170a composed of the metal and formed around the gate insulating film 163, the gate line 170b composed of the metal and connected to the gate electrode 170a, and the gate insulating film 163 formed on a periphery and a bottom portion of the gate electrode 170a and the gate line 170b. The gate line 170b extends in the direction perpendicular to the direction in which the fin-shaped semiconductor layer 105 extends. The gate electrode 170a has an outer width the same as a width of the gate line 170b. Furthermore, the memory cell in the third column of the first row includes a first diffusion layer 307 formed in an upper portion of the first pillar-shaped semiconductor layer 134, and the second diffusion layer 143b formed in a lower portion of the first pillar-shaped semiconductor layer 134. The second diffusion layer 143b is further formed in the fin-shaped semiconductor layer 105.

A lower electrode 175d, a pillar-shaped layer 176d whose resistance changes, the reset gate insulating film 182, and the reset gate 183b are disposed on the first diffusion layer 307.

The pillar-shaped layer 176c whose resistance changes and the pillar-shaped layer 176d whose resistance changes are connected by a bit line 188b.

The gate electrodes 168a and 170a are composed of a metal, and the gate lines 168b and 170b are composed of a metal. Thus, cooling can be accelerated. In addition, the gate lines 168b and 170b that are respectively formed on peripheries and bottom portions of the gate electrodes 168a and 170a and the gate lines are provided. Accordingly, metal gates are formed by a gate-last process. Thus, a metal gate process and a high-temperature process can be combined.

The gate insulating films 162 and 163 that are respectively formed on peripheries and bottom portions of the gate electrodes 168a and 170a and the gate lines 168b and 170b are provided. The gate electrodes 168a and 170a are composed of a metal, and the gate lines 168b and 170b are composed of a metal. The gate line 168b and 170b extend in the direction perpendicular to the direction in which the fin-shaped semiconductor layers 104 and 105 extend. The second diffusion layers 143a and 143b are further formed in the fin-shaped semiconductor layers 104 and 105, respectively. The outer widths of the gate electrodes 168a and 170a are the same as the width of the gate lines 168b and 170b, respectively. The widths of the first pillar-shaped semiconductor layers 129, 131, 132, and 134 are the same as the widths of the fin-shaped semiconductor layers 104 and 105. With this structure, the fin-shaped semiconductor layers 104 and 105, the first pillar-shaped semiconductor layers 129, 131, 132, and 134, the gate electrodes 168a and 170a, and the gate lines 168b and 170b of the semiconductor device are formed by self-alignment using two masks. Thus, the number of steps can be reduced.

The contact device in the second column of the second row includes the fin-shaped semiconductor layer 104 formed on the semiconductor substrate 101, the first insulating film 106 formed around the fin-shaped semiconductor layer 104, and a second pillar-shaped semiconductor layer 130 formed on the fin-shaped semiconductor layer 104. A width of the second pillar-shaped semiconductor layer 130 in a direction perpendicular to the direction in which the fin-shaped semiconductor layer 104 extends is the same as a width of the fin-shaped semiconductor layer 104 in the direction perpendicular to the direction in which the fin-shaped semiconductor layer 104 extends. Furthermore, the contact device in the second column of the second row includes a contact electrode 169a composed of a metal and formed around the second pillar-shaped semiconductor layer 130, a gate insulating film 165 formed between the second pillar-shaped semiconductor layer 130 and the contact electrode 169a, a contact line 169b composed of a metal extending in a direction perpendicular to the direction in which the fin-shaped semiconductor layer 104 extends and connected to the contact electrode 169a, and a gate insulating film 164 formed on a periphery of the contact electrode 169a and the contact line 169b. The contact electrode 169a has an outer width the same as a width of the contact line 169b. Furthermore, the contact device in the second column of the second row includes a second diffusion layer 143a formed in the fin-shaped semiconductor layer 104 and in a lower portion of the second pillar-shaped semiconductor layer 130. The contact electrode 169a is connected to the second diffusion layer 143a.

The contact device in the second column of the first row includes the fin-shaped semiconductor layer 105 formed on the semiconductor substrate 101, the first insulating film 106 formed around the fin-shaped semiconductor layer 105, and a second pillar-shaped semiconductor layer 133 formed on the fin-shaped semiconductor layer 105. A width of the second pillar-shaped semiconductor layer 133 in a direction perpendicular to the direction in which the fin-shaped semiconductor layer 105 extends is the same as a width of the fin-shaped semiconductor layer 105 in the direction perpendicular to the direction in which the fin-shaped semiconductor layer 105 extends. Furthermore, the contact device in the second column of the first row includes the contact electrode 169a composed of the metal and formed around the second pillar-shaped semiconductor layer 133, a gate insulating film 166 formed between the second pillar-shaped semiconductor layer 133 and the contact electrode 169a, the contact line 169b composed of the metal extending in a direction perpendicular to the direction in which the fin-shaped semiconductor layer 105 extends and connected to the contact electrode 169a, and the gate insulating film 164 formed on a periphery of the contact electrode 169a and the contact line 169b. The contact electrode 169a has an outer width the same as a width of the contact line 169b. Furthermore, the contact device in the second column of the first row includes the second diffusion layer 143b formed in the fin-shaped semiconductor layer 105 and in a lower portion of the second pillar-shaped semiconductor layer 133. The contact electrode 169a is connected to the second diffusion layer 143b.

By providing the contact line 169b parallel to the gate lines 168b and 170b and connected to the second diffusion layers 143a and 143b, the second diffusion layers 143a and 143b are connected to each other. With this structure, the resistance of a source line can be decreased, and an increase in the source voltage due to a current at the time of the setting can be suppressed. For example, one contact line 169b parallel to the gate lines 168b and 170b is preferably arranged for every two memory cells, every four memory cells, every eight memory cells, every sixteen memory cells, every thirty-two memory cells, or every sixty-four memory cells that are arranged in a line in the direction of the bit lines 188a and 188b.

The structure formed by the second pillar-shaped semiconductor layers 130 and 133, the contact electrode 169a that is formed around the second pillar-shaped semiconductor layers 130 and 133, and the contact line 169b is the same as a transistor structure except that the contact electrode 169a is connected to the second diffusion layers 143a and 143b. All the source lines formed of the second diffusion layers 143a and 143b in a direction parallel to the gate lines 168b and 170b are connected to the contact line 169b. Thus, the number of steps can be reduced.

Figures 3A, 3B, 3C:
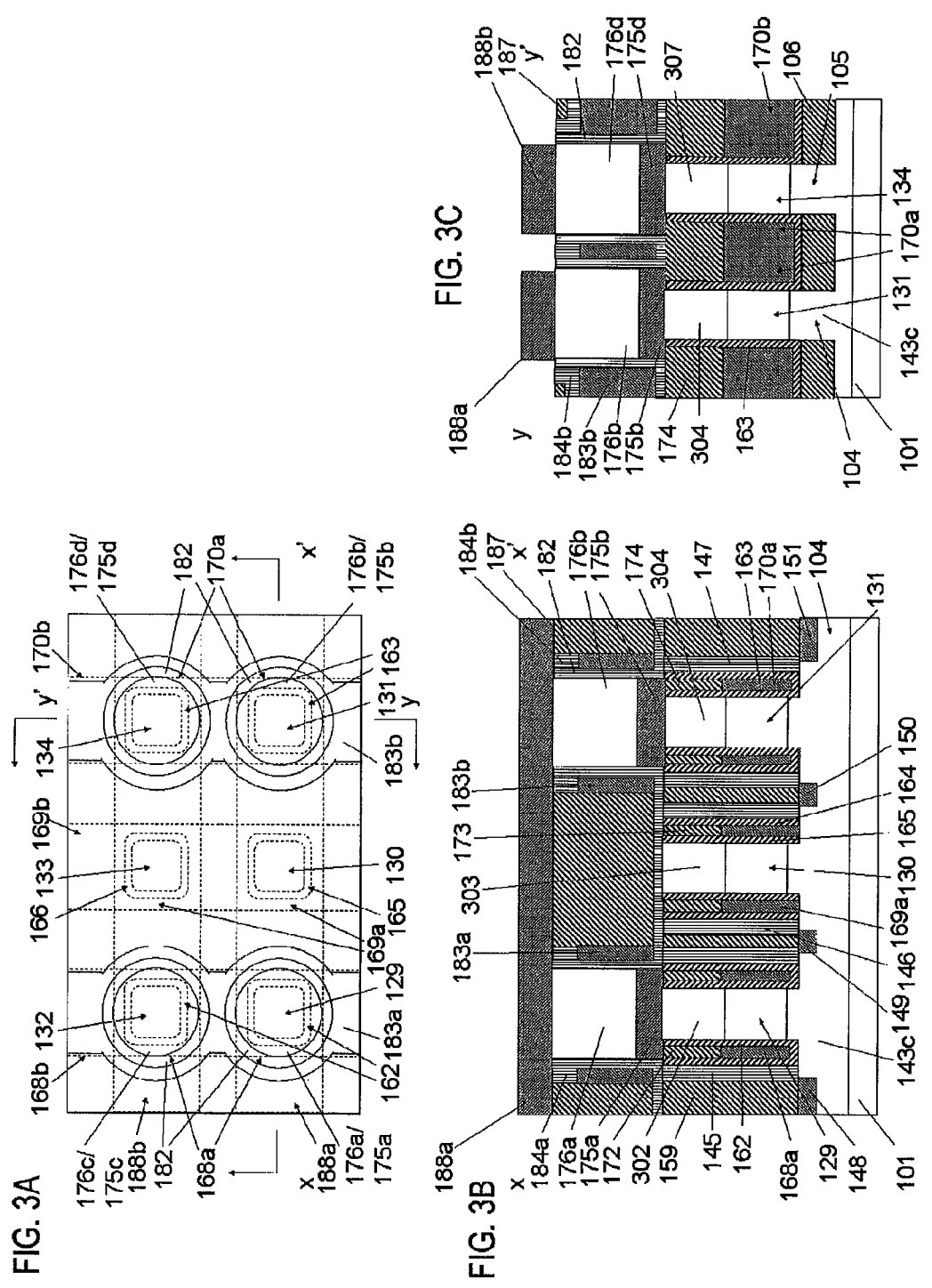

FIGS. 3A, 3B and 3C illustrate a structure in which a second diffusion layer 143c is deeply formed in a semiconductor substrate 101 so that the second diffusion layers 143a and 143b in FIGS. 1A, 1B and 1C are connected to each other. With this structure, the source resistance can be further reduced.

Figure 4A:
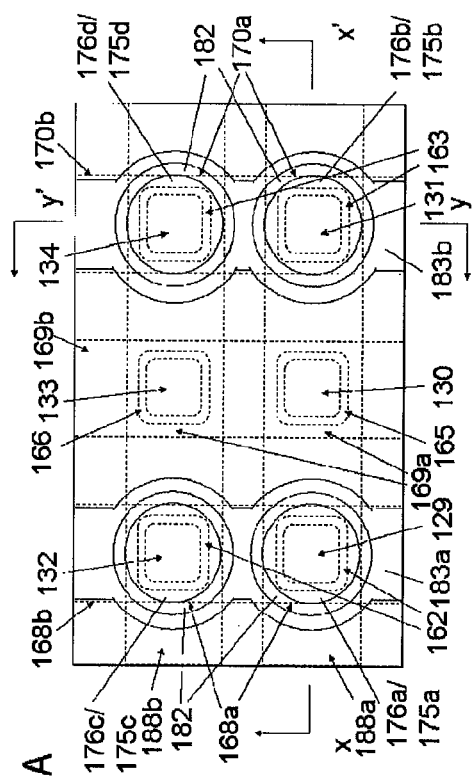
FIG. 4A is a plan view of a memory device according to the present invention.
Figure 4B:
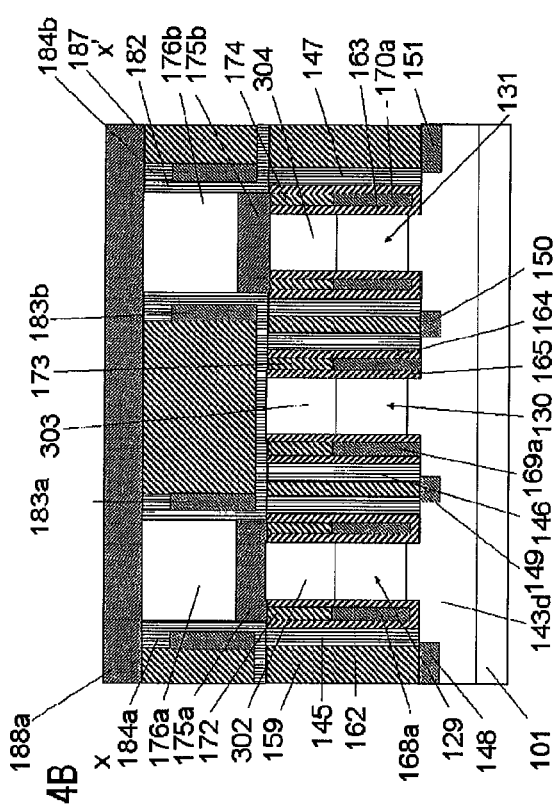
FIG. 4B is a cross-sectional view taken along line X-X' of FIG. 4A.
Figure 4C:
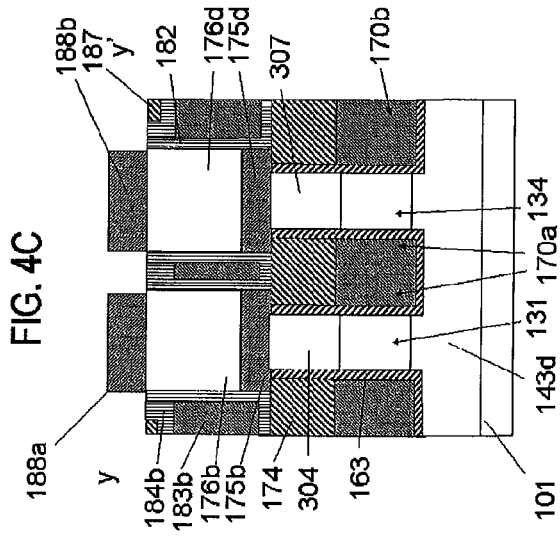
FIG. 4C is a cross-sectional view taken along line Y-Y' of FIG. 4A.

FIGS. 4A, 4B and 4C illustrate a structure in which the fin-shaped semiconductor layer 105 in FIGS. 2A, 2B and 2C and the first insulating film 106 formed around the fin-shaped semiconductor layer 105 are omitted and a second diffusion layer 143d is formed on a semiconductor substrate 101. With this structure, the source resistance can be further reduced.

A production process for forming the structure of a semiconductor device according to an embodiment of the present invention will now be described with reference to FIGS. 5A to 54C.

First, a first step of forming a fin-shaped semiconductor layer on a semiconductor substrate and forming a first insulating film around the fin-shaped semiconductor layer will be described. In the present embodiment, a silicon substrate is used. However, any semiconductor may be used.

Figure 5A:
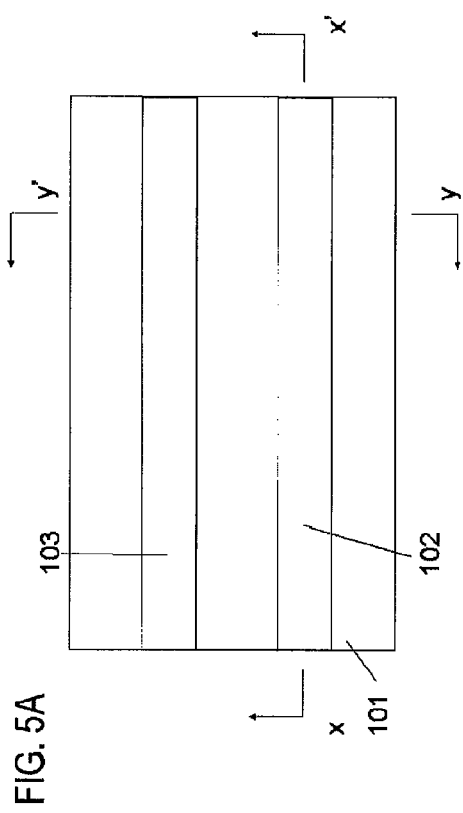
FIG. 5A is a plan view illustrating a method for producing a memory device according to the present invention.
Figure 5C:
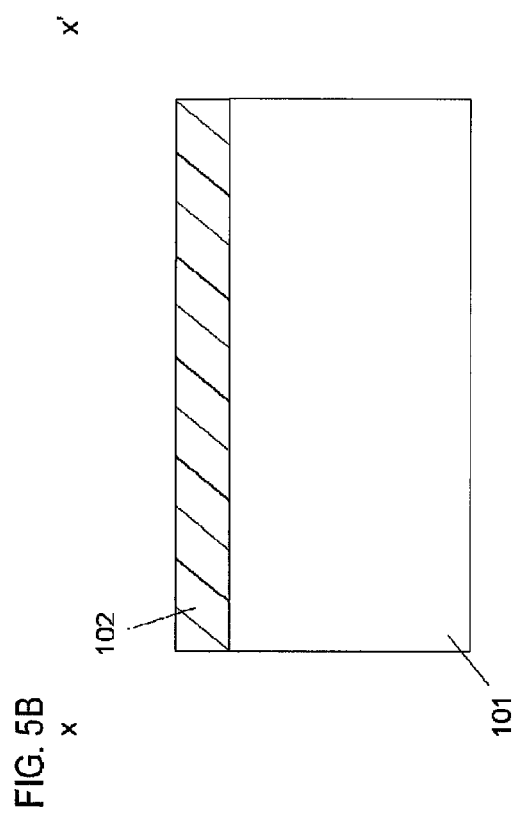
FIG. 5C is a cross-sectional view taken along line Y-Y' of FIG. 5A.
Figure 5B:
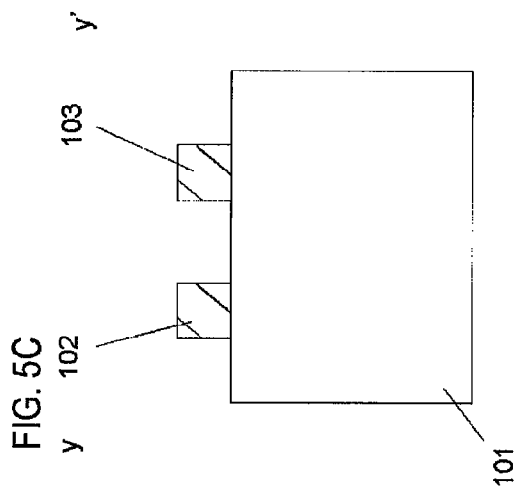
FIG. 5B is a cross-sectional view taken along line X-X' of FIG. 5A.

As illustrated in FIGS. 5A, 5B, 5C, a first resists 102 and 103 for forming fin-shaped silicon layers are formed on a silicon substrate 101.

Figure 6C:
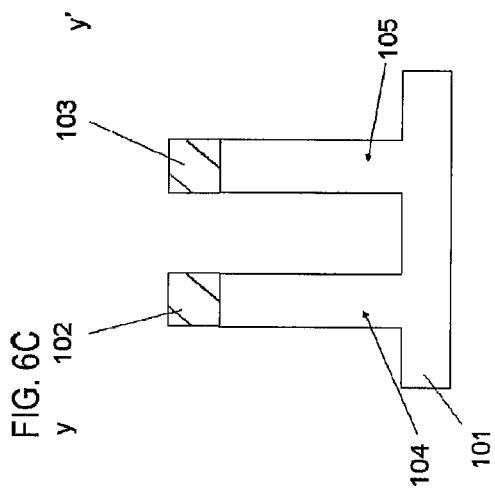
FIG. 6C is a cross-sectional view taken along line Y-Y' of FIG. 6A.
Figure 6A:
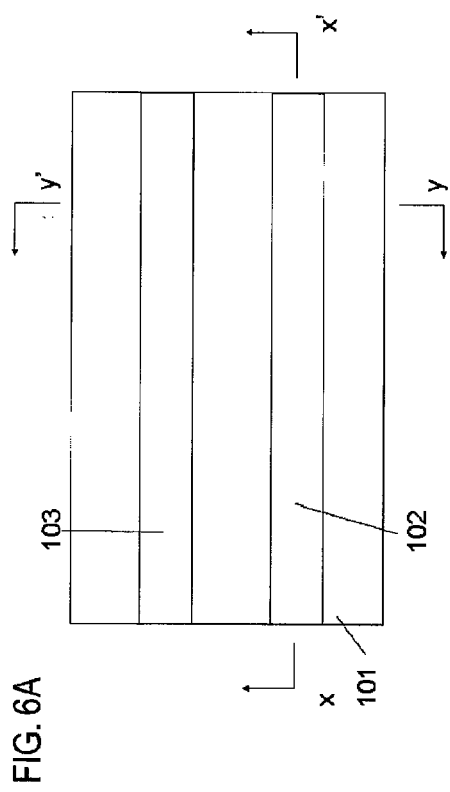
FIG. 6A is a plan view illustrating the method for producing a memory device according to the present invention.
Figure 6B:
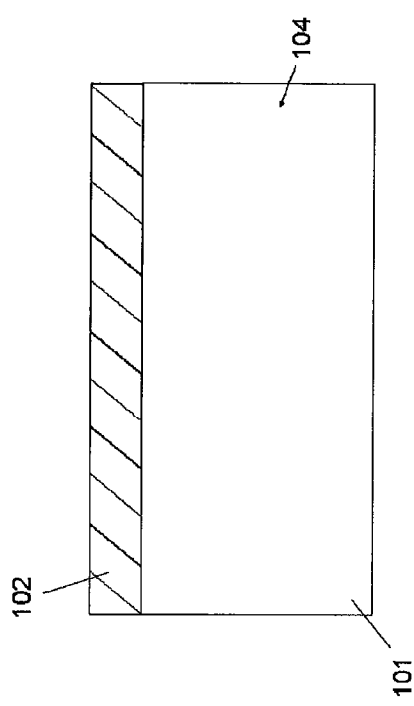
FIG. 6B is a cross-sectional view taken along line X-X' of FIG. 6A.

As illustrated in FIGS. 6A, 6B and 6C, the silicon substrate 101 is etched to form fin-shaped silicon layers 104 and 105. In the present embodiment, the fin-shaped silicon layers are formed by using a resist as a mask. Alternatively, a hard mask such as an oxide film or a nitride film may be used.

As illustrated in FIGS. 7A, 7B and 7C, the first resists 102 and 103 are removed.

Figure 8C:
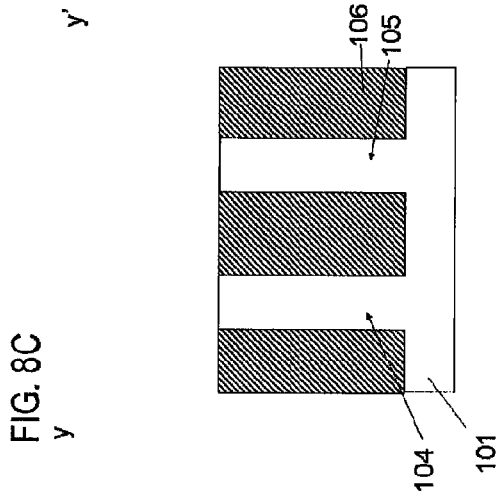
FIG. 8C is a cross-sectional view taken along line Y-Y' of FIG. 8A.
Figure 8A:
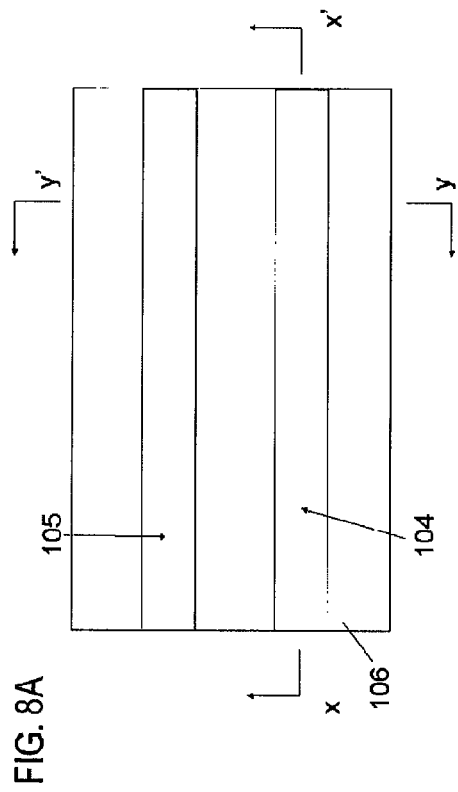
FIG. 8A is a plan view illustrating the method for producing a memory device according to the present invention.
Figure 8B:
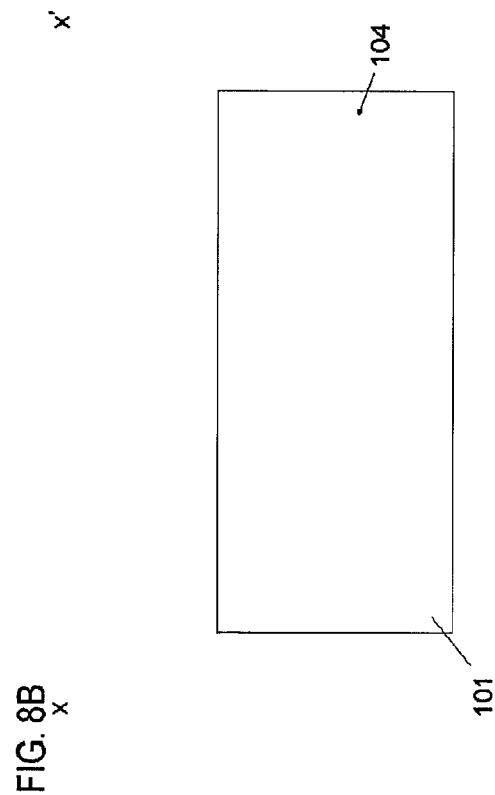
FIG. 8B is a cross-sectional view taken along line X-X' of FIG. 8A.

As illustrated in FIGS. 8A, 8B and 8C, a first insulating film 106 is deposited around the fin-shaped silicon layers 104 and 105. An oxide film formed by high-density plasma or an oxide film formed by low-pressure chemical vapor deposition (CVD) may be used as the first insulating film.

As illustrated in FIGS. 9A, 9B and 9C, a first insulating film 106 is etched back to expose upper portions of the fin-shaped silicon layers 104 and 105.

The first step of forming a fin-shaped semiconductor layer on a semiconductor substrate and forming a first insulating film around the fin-shaped semiconductor layer has been described.

Next, a description will be made of a second step of, after the first step, forming a second insulating film around the fin-shaped semiconductor layer, depositing a first polysilicon on the second insulating film and planarizing the first polysilicon, forming a second resist for forming a gate line, a first pillar-shaped semiconductor layer, a second pillar-shaped semiconductor layer, and a contact line in a direction perpendicular to a direction in which the fin-shaped semiconductor layer extends, and etching the first polysilicon, the second insulating film, and the fin-shaped semiconductor layer to thereby form a first pillar-shaped semiconductor layer, a first dummy gate composed of the first polysilicon, a second pillar-shaped semiconductor layer, and a second dummy gate composed of the first polysilicon.

Figure 10A:
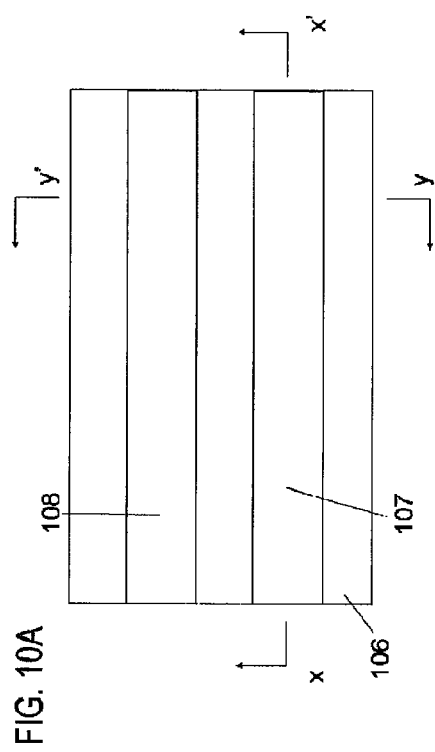
FIG. 10A is a plan view illustrating the method for producing a memory device according to the present invention.
Figure 10C:
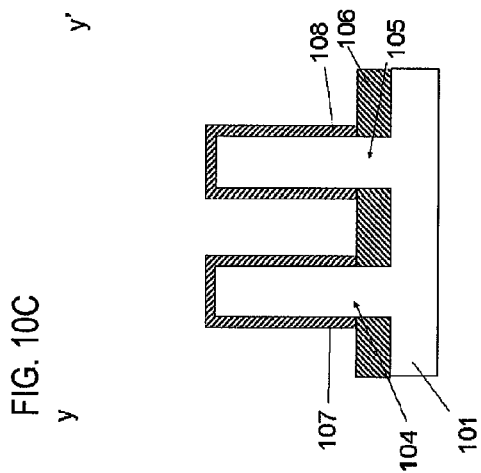
FIG. 10C is a cross-sectional view taken along line Y-Y' of FIG. 10A.
Figure 10B:
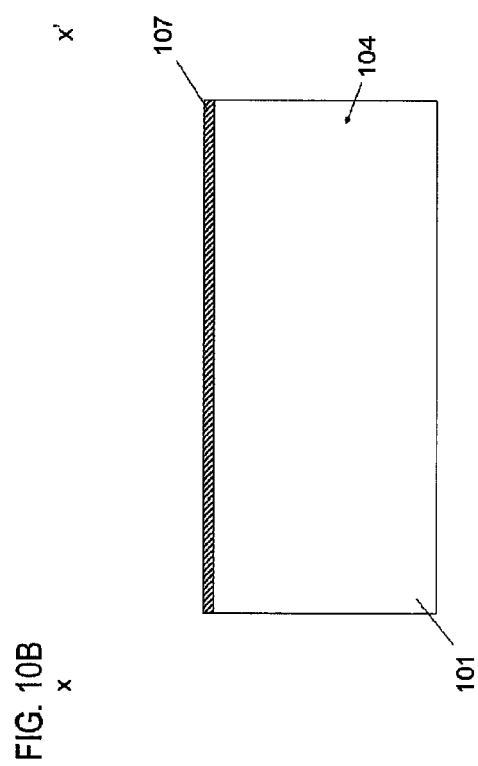
FIG. 10B is a cross-sectional view taken along line X-X' of FIG. 10A.

As illustrated in FIGS. 10A, 10B and 10C, second insulating films 107 and 108 are formed around the fin-shaped silicon layers 104 and 105, respectively. The second insulating films 107 and 108 are preferably oxide films.

Figure 11C:
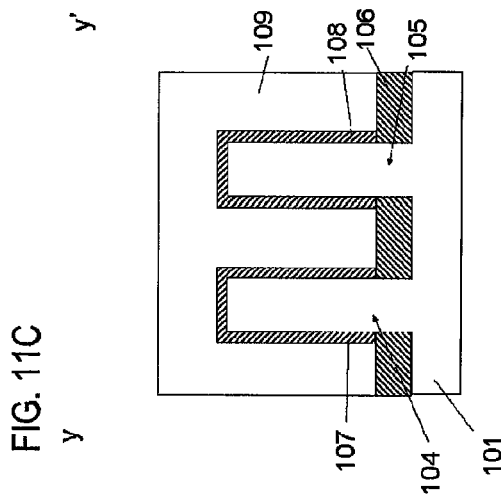
FIG. 11C is a cross-sectional view taken along line Y-Y' of FIG. 11A.
Figure 11A:
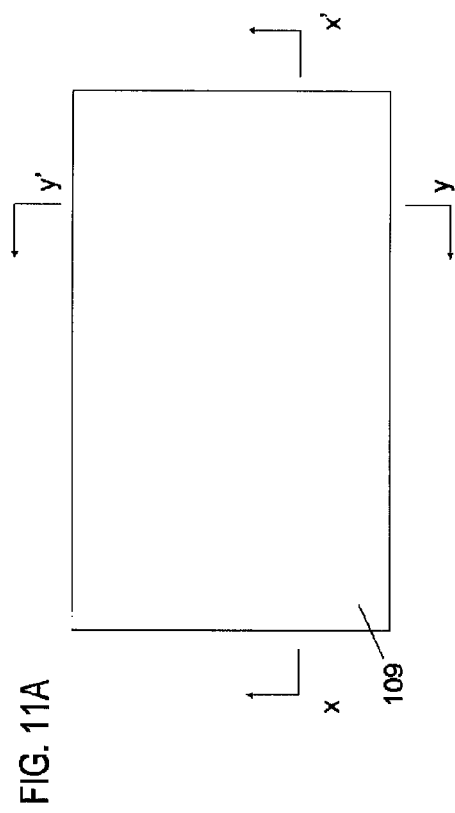
FIG. 11A is a plan view illustrating the method for producing a memory device according to the present invention.
Figure 11B:
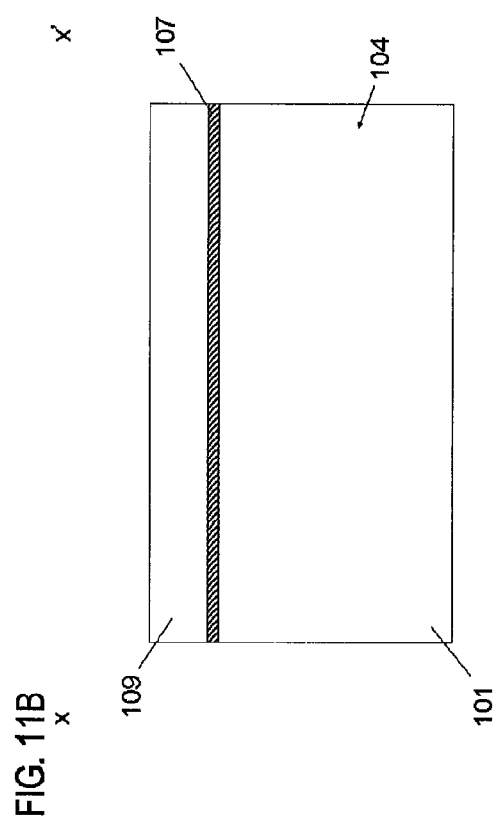
FIG. 11B is a cross-sectional view taken along line X-X' of FIG. 11A.

As illustrated in FIGS. 11A, 11B and 1C, a first polysilicon 109 is deposited on the second insulating films 107 and 108 and planarizing the first polysilicon 109.

As illustrated in FIGS. 12A, 12B and 12C, a third insulating film 110 is formed on the first polysilicon 109. The third insulating film 110 is preferably a nitride film.

Figure 13A:
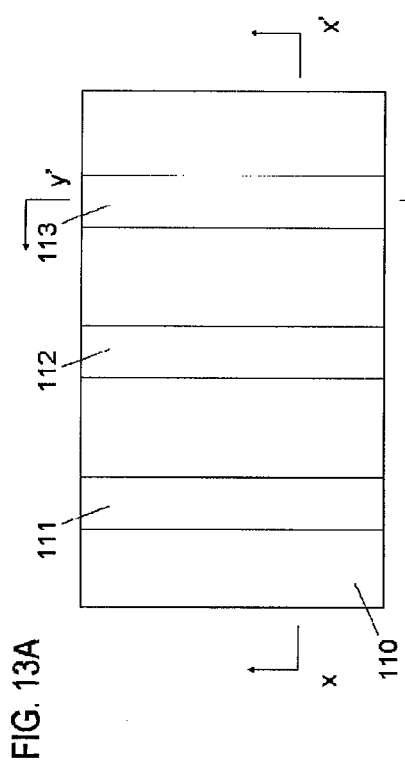
FIG. 13A is a plan view illustrating the method for producing a memory device according to the present invention.
Figure 13B:
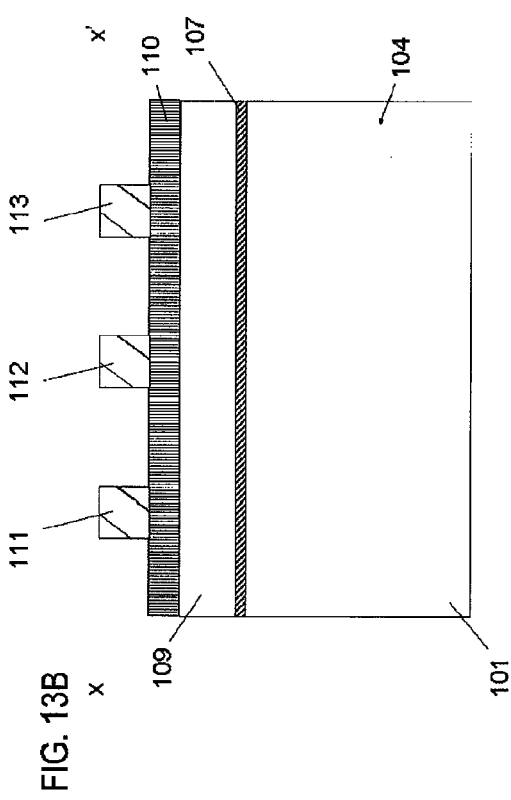
FIG. 13B is a cross-sectional view taken along line X-X' of FIG. 13A.
Figure 13C:
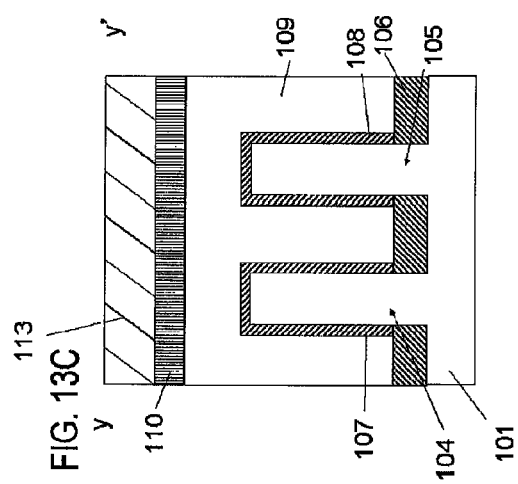
FIG. 13C is a cross-sectional view taken along line Y-Y' of FIG. 13A.

As illustrated in FIGS. 13A, 13B and 13C, second resists 111, 112, and 113 for forming gate lines 168b and 170b, first pillar-shaped semiconductor layers 129, 131, 132, and 134, second pillar-shaped semiconductor layers 130 and 133, and a contact line 169b are formed in a direction perpendicular to a direction in which the fin-shaped silicon layers 104 and 105 extend.

Figure 14A:
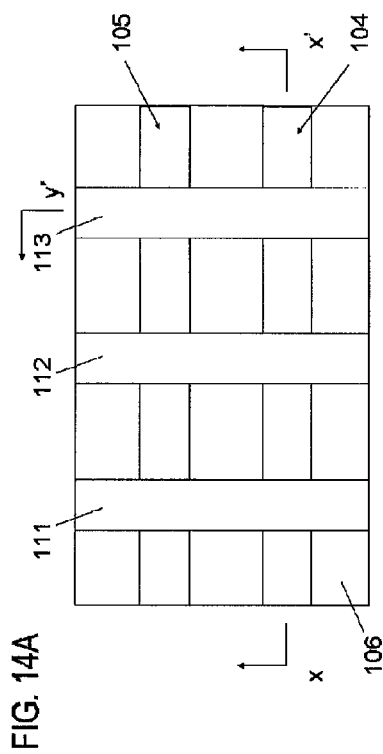
FIG. 14A is a plan view illustrating the method for producing a memory device according to the present invention.
Figure 14C:
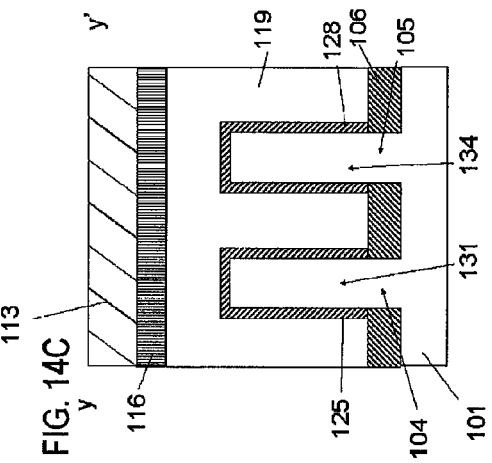
FIG. 14C is a cross-sectional view taken along line Y-Y' of FIG. 14A.
Figure 14B:
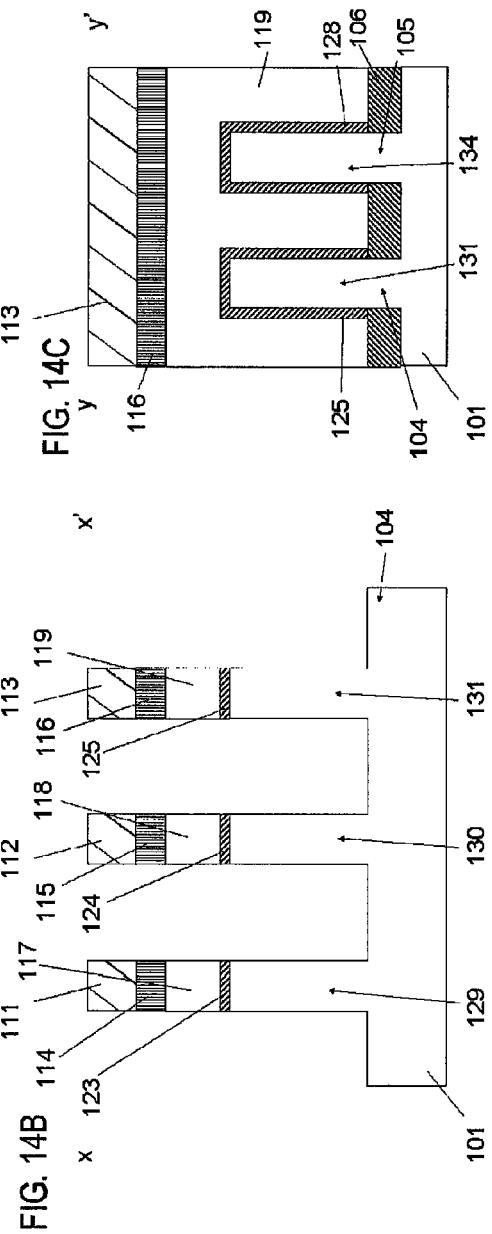
FIG. 14B is a cross-sectional view taken along line X-X' of FIG. 14A.

As illustrated in FIGS. 14A, 14B and 14C, the third insulating film 110, the first polysilicon 109, the second insulating films 107 and 108, and the fin-shaped silicon layers 104 and 105 are etched to thereby form first pillar-shaped silicon layers 129, 131, 132, and 134, first dummy gates 117 and 119 composed of the first polysilicon, second pillar-shaped silicon layers 130 and 133, and a second dummy gate 118 composed of the first polysilicon. At this time, the third insulating film 110 is separated into third insulating films 114, 115, and 116. The second insulating films 107 and 108 are separated into second insulating films 123, 124, 125, 126, 127, and 128. At this time, in the case where the second resists 111, 112, and 113 are removed during the etching, the third insulating films 114, 115, and 116 function as a hard mask. In the case where the second resists are not removed during the etching, the third insulating film may not be used.

Figure 15A:
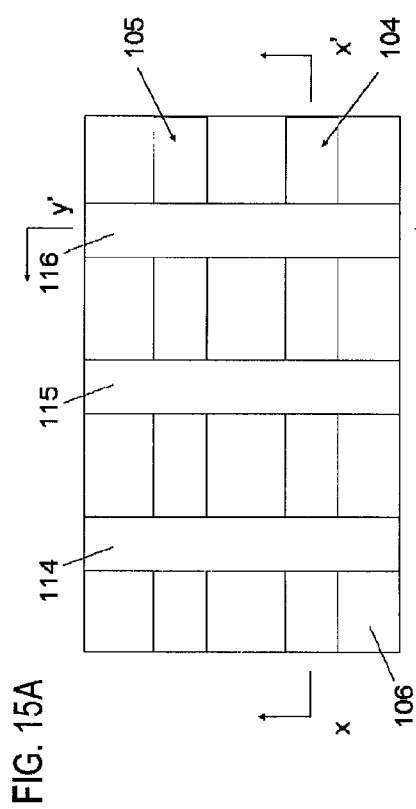
FIG. 15A is a plan view illustrating the method for producing a memory device according to the present invention.
Figure 15B:
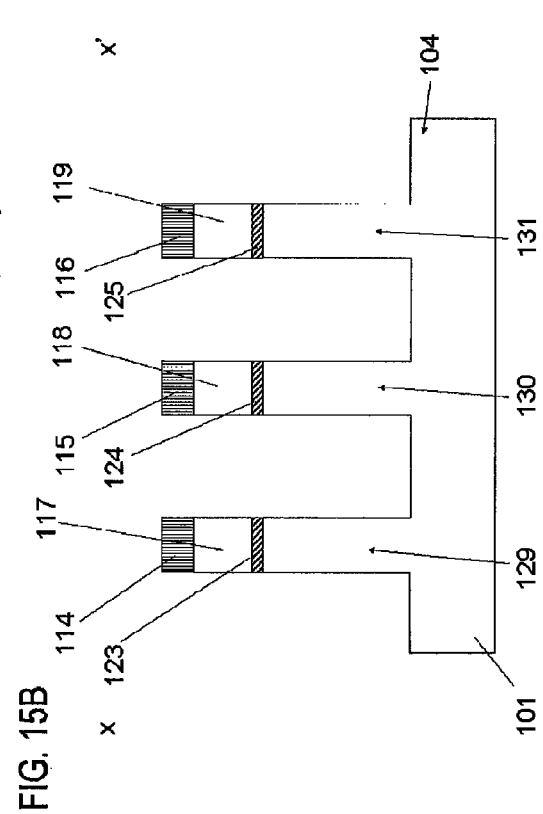
FIG. 15B is a cross-sectional view taken along line X-X' of FIG. 15A.
Figure 15C:
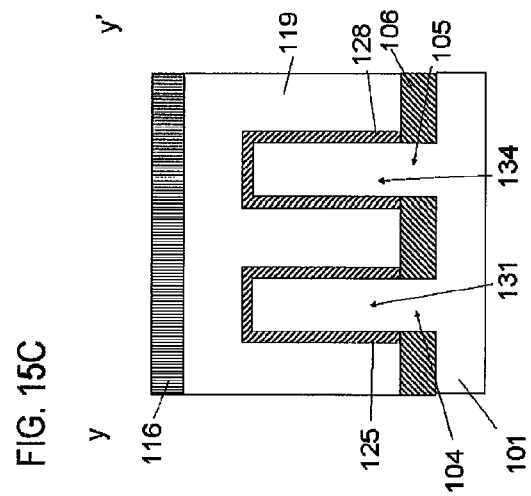
FIG. 15C is a cross-sectional view taken along line Y-Y' of FIG. 15A.

As illustrated in FIGS. 15A, 15B and 15C, the third insulating films 114, 115, and 116 are removed.

A description has been made of the second step of, after the first step, forming a second insulating film around the fin-shaped semiconductor layer, depositing a first polysilicon on the second insulating film and planarizing the first polysilicon, forming a second resist for forming a gate line, a first pillar-shaped semiconductor layer, a second pillar-shaped semiconductor layer, and a contact line in a direction perpendicular to a direction in which the fin-shaped semiconductor layer extends, and etching the first polysilicon, the second insulating film, and the fin-shaped semiconductor layer to thereby form a first pillar-shaped semiconductor layer, a first dummy gate composed of the first polysilicon, a second pillar-shaped semiconductor layer, and a second dummy gate composed of the first polysilicon.

Next, a description will be made of a third step of, after the second step, forming a fourth insulating film around the first pillar-shaped semiconductor layer, the second pillar-shaped semiconductor layer, the first dummy gate, and the second dummy gate, depositing a second polysilicon around the fourth insulating film, and leaving, by conducting etching, the second polysilicon on side walls of the first dummy gate, the first pillar-shaped semiconductor layer, the second dummy gate, and the second pillar-shaped semiconductor layer to form a third dummy gate and a fourth dummy gate.

Figure 16C:
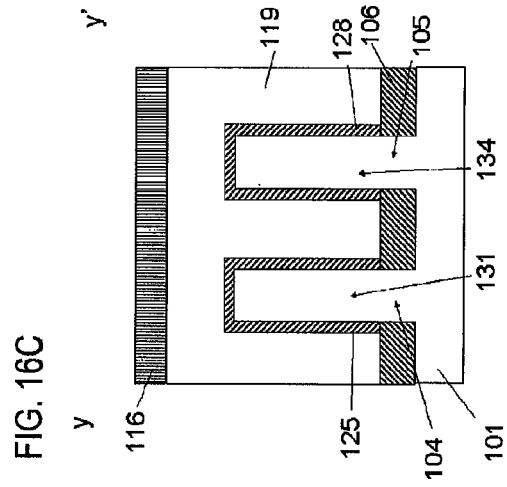
FIG. 16C is a cross-sectional view taken along line Y-Y' of FIG. 16A.
Figure 16A:
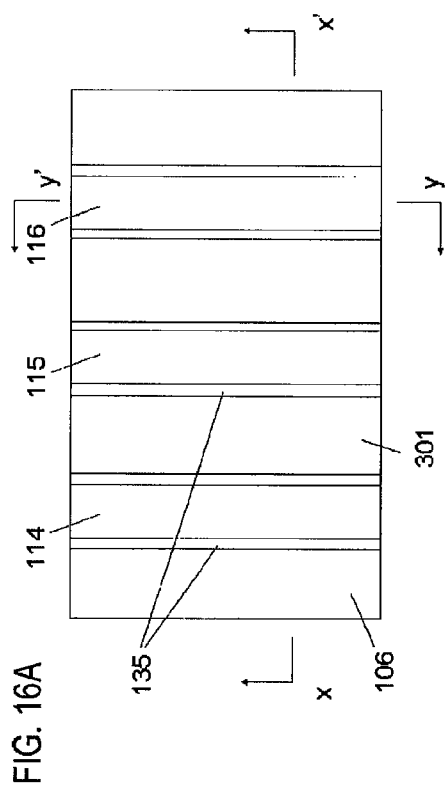
FIG. 16A is a plan view illustrating the method for producing a memory device according to the present invention.
Figure 16B:
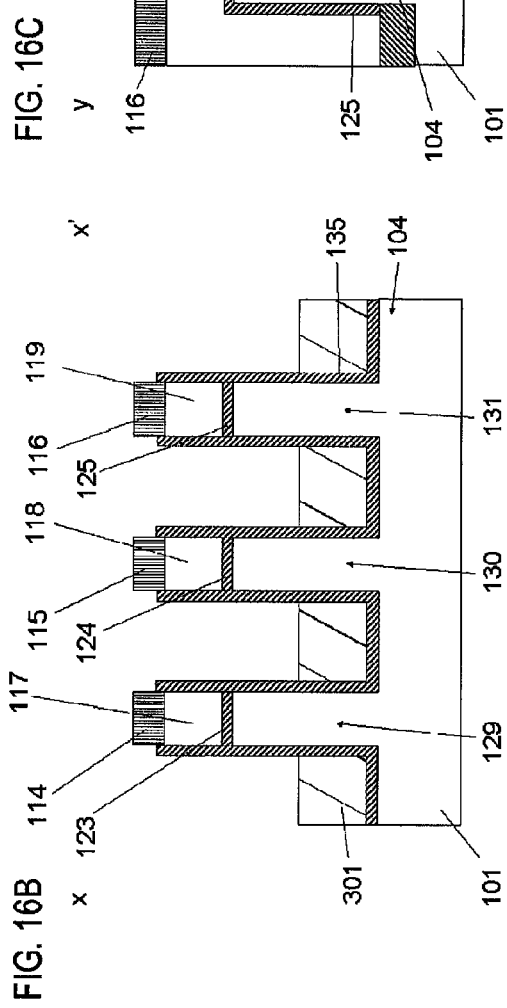
FIG. 16B is a cross-sectional view taken along line X-X' of FIG. 16A.

As illustrated in FIGS. 16A, 16B and 16C, a fourth insulating film 135 is formed around the first pillar-shaped silicon layers 129, 131, 132, and 134, the second pillar-shaped silicon layers 130 and 133, the first dummy gates 117 and 119, and the second dummy gate 118. The fourth insulating film 135 is preferably an oxide film. A third resist 301 is formed, and etch-back is then performed to expose upper portions of the first pillar-shaped silicon layers 129, 131, 132, and 134. At this time, upper portions of the second pillar-shaped silicon layers 130 and 133 may be exposed.

As illustrated in FIGS. 17A, 17B and 17C, an impurity is introduced to form first diffusion layers 302, 304, 305, and 307 in upper portions of the first pillar-shaped silicon layers 129, 131, 132, and 134, respectively. First diffusion layers 303 and 306 may be formed in upper portions of the second pillar-shaped silicon layers 130 and 133, respectively. In the case of an n-type diffusion layer, arsenic or phosphorus is preferably introduced. In the case of a p-type diffusion layer, boron is preferably introduced.

Figure 18C:
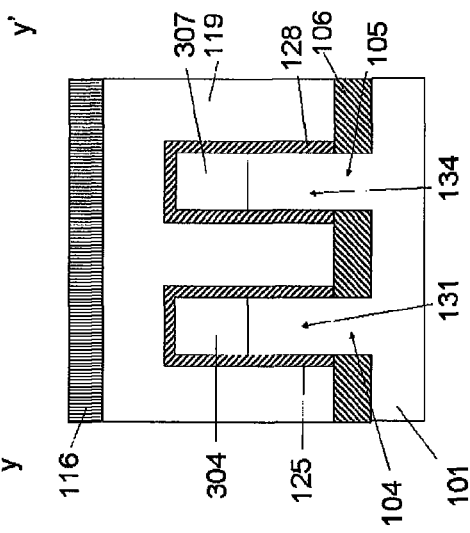
FIG. 18C is a cross-sectional view taken along line Y-Y' of FIG. 18A.
Figure 18A:
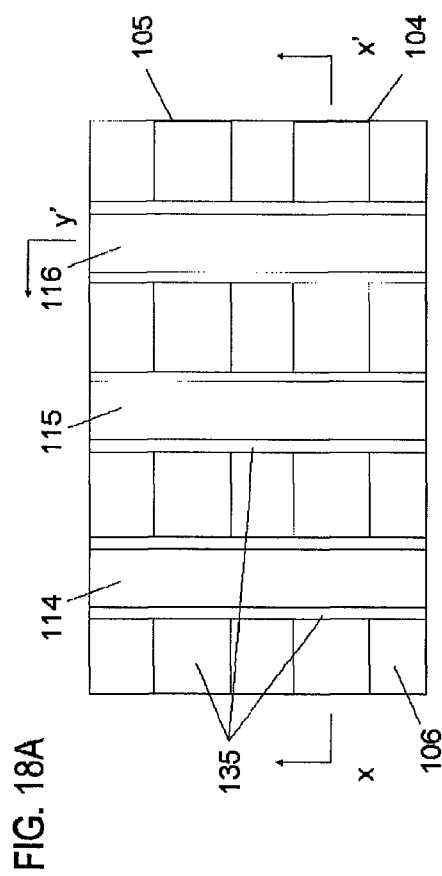
FIG. 18A is a plan view illustrating the method for producing a memory device according to the present invention.
Figure 18B:
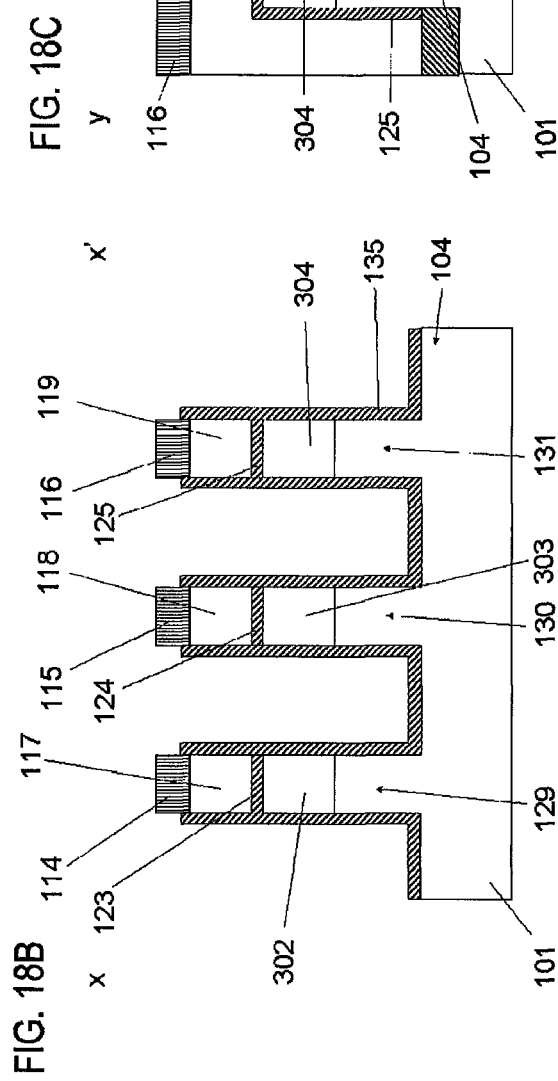
FIG. 18B is a cross-sectional view taken along line X-X' of FIG. 18A.

As illustrated in FIGS. 18A, 18B and 18C, the third resist 301 is removed.

Figure 19A:
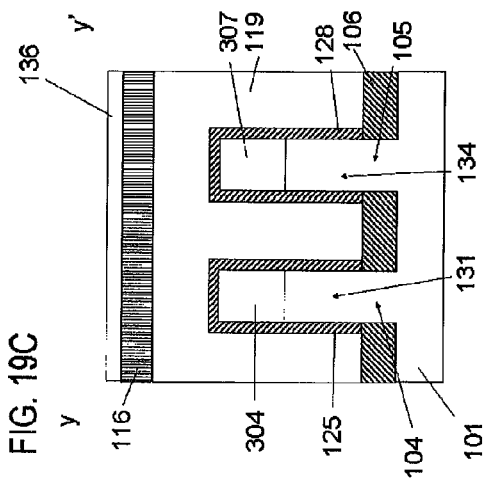
FIG. 19A is a plan view illustrating the method for producing a memory device according to the present invention.
Figure 19B:
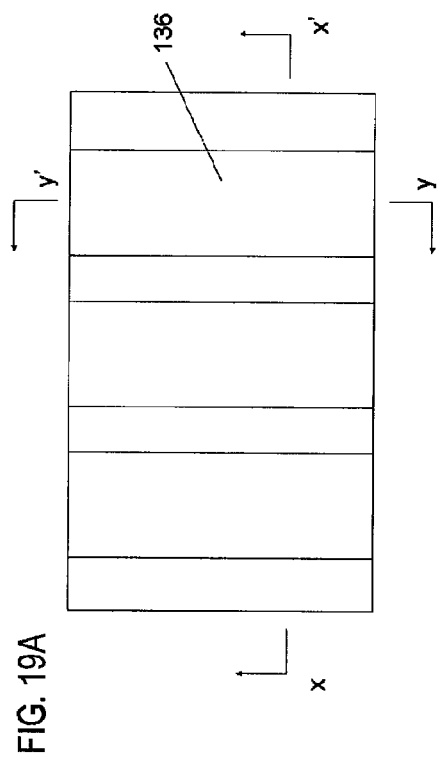
FIG. 19B is a cross-sectional view taken along line X-X' of FIG. 19A.
Figure 19C:
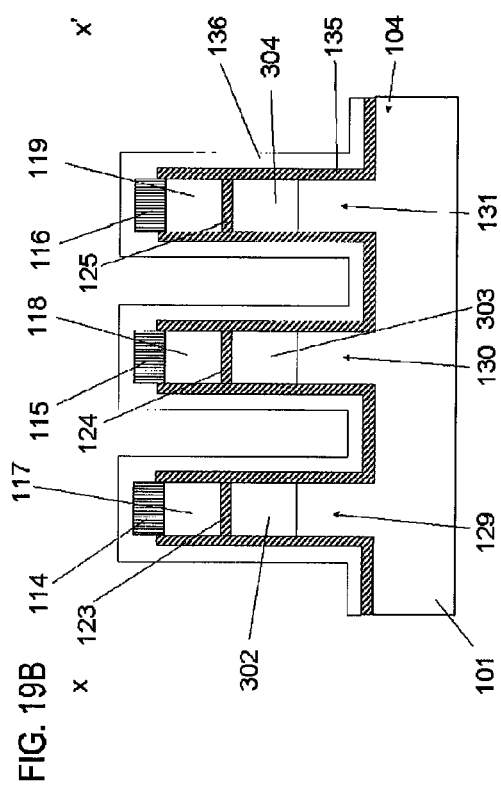
FIG. 19C is a cross-sectional view taken along line Y-Y' of FIG. 19A.

As illustrated in FIGS. 19A, 19B and 19C, a second polysilicon 136 is deposited around the fourth insulating film 135.

As illustrated in FIGS. 20A, 20B and 20C, by etching the second polysilicon 136, the second polysilicon 136 is left on side walls of the first dummy gates 117 and 119, the first pillar-shaped silicon layers 129, 131, 132, and 134, the second dummy gate 118, and the second pillar-shaped silicon layers 130 and 133. Thus, third dummy gates 137 and 139 and a fourth dummy gate 138 are formed. At this time, the fourth insulating film 135 may be separated into fourth insulating films 140, 141, and 142.

A description has been made of the third step of, after the second step, forming a fourth insulating film around the first pillar-shaped semiconductor layer, the second pillar-shaped semiconductor layer, the first dummy gate, and the second dummy gate, depositing a second polysilicon around the fourth insulating film, and leaving, by conducting etching, the second polysilicon on side walls of the first dummy gate, the first pillar-shaped semiconductor layer, the second dummy gate, and the second pillar-shaped semiconductor layer to form a third dummy gate and a fourth dummy gate.

Next, a description will be made of a fourth step of forming a second diffusion layer in an upper portion of the fin-shaped semiconductor layer, in a lower portion of the first pillar-shaped semiconductor layer, and in a lower portion of the second pillar-shaped semiconductor layer, forming a fifth insulating film around the third dummy gate and the fourth dummy gate, leaving the fifth insulating film in a side wall shape by etching to form side walls formed of the fifth insulating film, and forming a compound of a metal and a semiconductor in an upper portion of the second diffusion layer.

As illustrated in FIGS. 21A, 21B and 21C, an impurity is introduced to form second diffusion layers 143a and 143b in lower portions of the first pillar-shaped silicon layers 129, 131, 132, and 134 and in lower portions of the second pillar-shaped silicon layers 130 and 133. In the case of an n-type diffusion layer, arsenic or phosphorus is preferably introduced. In the case of a p-type diffusion layer, boron is preferably introduced. The diffusion layers may be formed after the formation of side walls formed of a fifth insulating film described below.

As illustrated in FIGS. 22A, 22B and 22C, a fifth insulating film 144 is formed around the third dummy gates 137 and 139 and the fourth dummy gate 138. The fifth insulating film 144 is preferably a nitride film.

As illustrated in FIGS. 23A, 23B and 23C, the fifth insulating film 144 is etched so as to be left in a side wall shape, thereby forming side walls 145, 146, and 147 formed of the fifth insulating film.

Figures 24A, 24B, 24C:
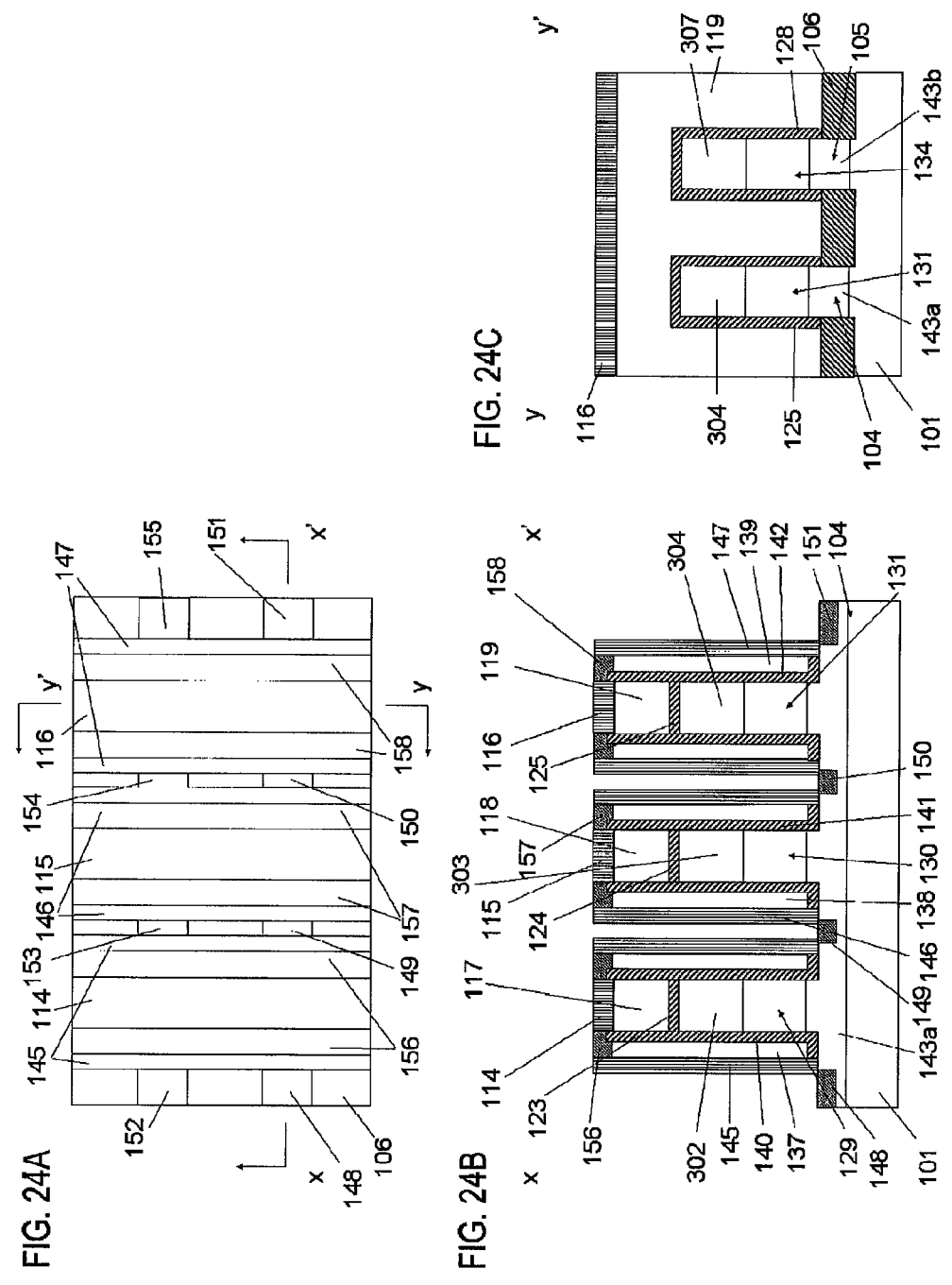

As illustrated in FIGS. 24A, 24B and 24C, compounds 148, 149, 150, 151, 152, 153, 154, and 155 of a metal and a semiconductor are formed in upper portions of the second diffusion layers 143a and 143b. At this time, compounds 156, 158, and 157 of a metal and a semiconductor are also formed in upper portions of the third dummy gates 137 and 139 and in an upper portion of the fourth dummy gate 138, respectively.

A description has been made of the fourth step of forming a second diffusion layer in an upper portion of the fin-shaped semiconductor layer, in a lower portion of the first pillar-shaped semiconductor layer, and in a lower portion of the second pillar-shaped semiconductor layer, forming a fifth insulating film around the third dummy gate and the fourth dummy gate, leaving the fifth insulating film in a side wall shape by etching to form side walls formed of the fifth insulating film, and forming a compound of a metal and a semiconductor in an upper portion of the second diffusion layer.

Next, a description will be made of a fifth step of after the fourth step, depositing an interlayer insulating film and planarizing the interlayer insulating film to expose upper portions of the first dummy gate, the second dummy gate, the third dummy gate, and the fourth dummy gate, removing the first dummy gate, the second dummy gate, the third dummy gate, and the fourth dummy gate, removing the second insulating film and the fourth insulating film, forming a gate insulating film around the first pillar-shaped semiconductor layer, around the second pillar-shaped semiconductor layer, and on an inner side of the fifth insulating film, forming a fourth resist for removing a portion of the gate insulating film which is located on a periphery of a bottom portion of the second pillar-shaped semiconductor layer, removing the portion of the gate insulating film which is located on the periphery of the bottom portion of the second pillar-shaped semiconductor layer, depositing a metal and etching back the metal to form a gate electrode and a gate line around the first pillar-shaped semiconductor layer and to form a contact electrode and a contact line around the second pillar-shaped semiconductor layer.

Figure 25A:
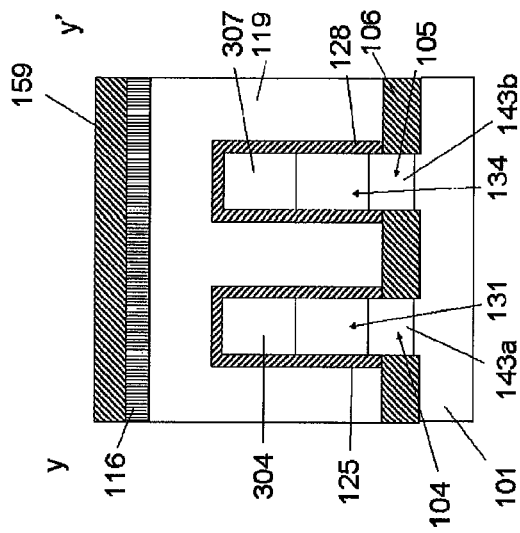
FIG. 25A is a plan view illustrating the method for producing a memory device according to the present invention.
Figure 25B:
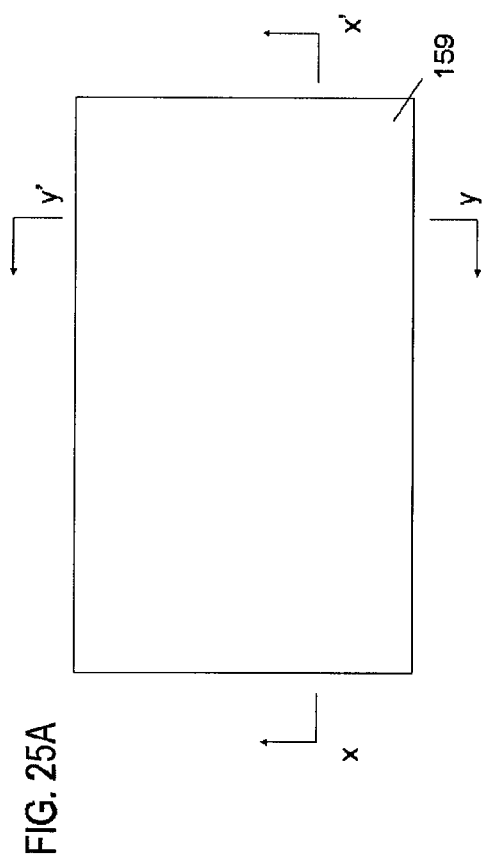
FIG. 25B is a cross-sectional view taken along line X-X' of FIG. 25A.
Figure 25C:
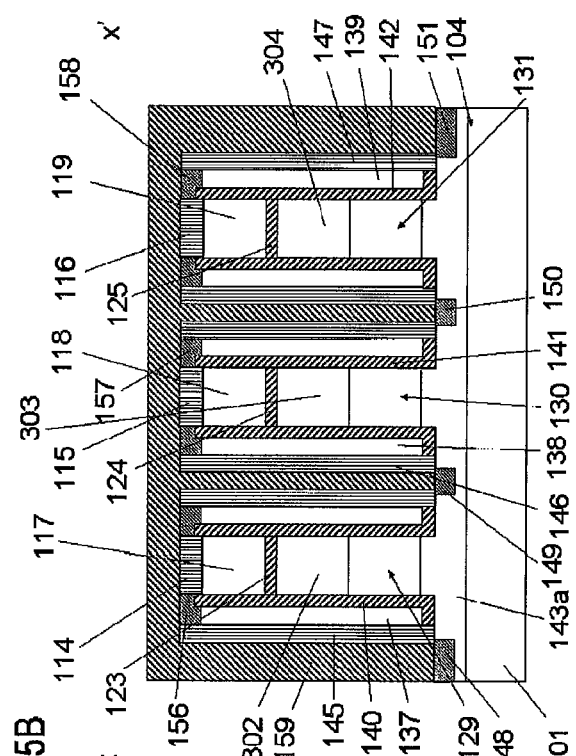
FIG. 25C is a cross-sectional view taken along line Y-Y' of FIG. 25A.

As illustrated in FIGS. 25A, 25B and 25C, an interlayer insulating film 159 is deposited. A contact stopper film may be used.

Figure 26C:
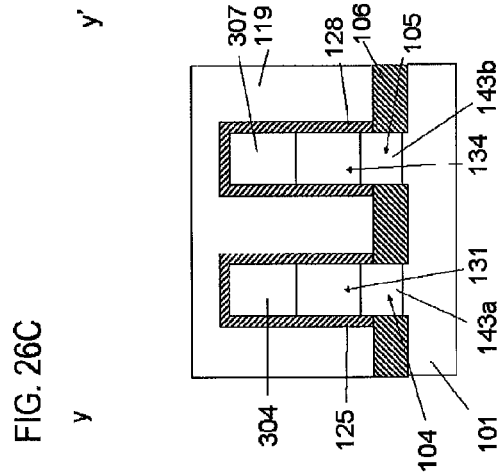
FIG. 26C is a cross-sectional view taken along line Y-Y' of FIG. 26A.
Figure 26A:
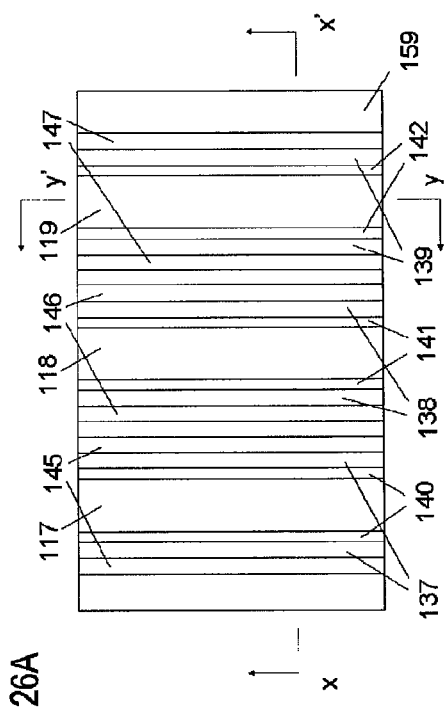
FIG. 26A is a plan view illustrating the method for producing a memory device according to the present invention.
Figure 26B:
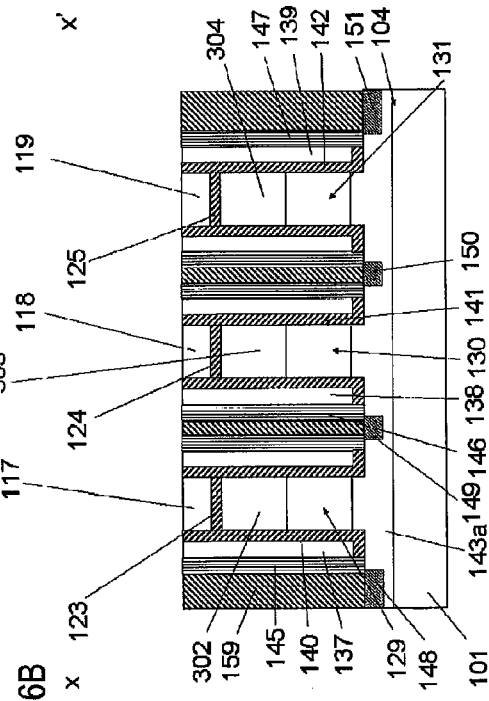
FIG. 26B is a cross-sectional view taken along line X-X' of FIG. 26A.

As illustrated in FIGS. 26A, 26B and 26C, upper portions of the first dummy gates 117 and 119, the second dummy gate 118, the third dummy gates 137 and 139, and the fourth dummy gate 138 are exposed by chemical mechanical polishing. At this time, the compounds 156, 158, and 157 of the metal and the semiconductor in the upper portions of the third dummy gates 137 and 139 and the upper portion of the fourth dummy gate 138 are removed.

Figure 27C:
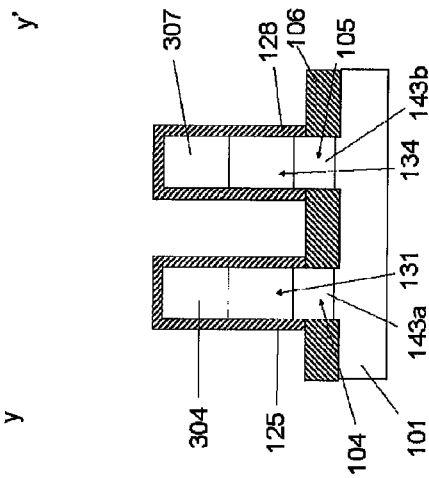
FIG. 27C is a cross-sectional view taken along line Y-Y' of FIG. 27A.
Figure 27A:
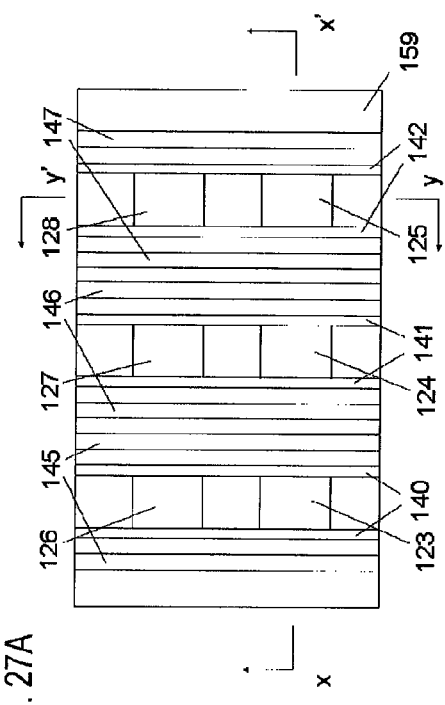
FIG. 27A is a plan view illustrating the method for producing a memory device according to the present invention.
Figure 27B:
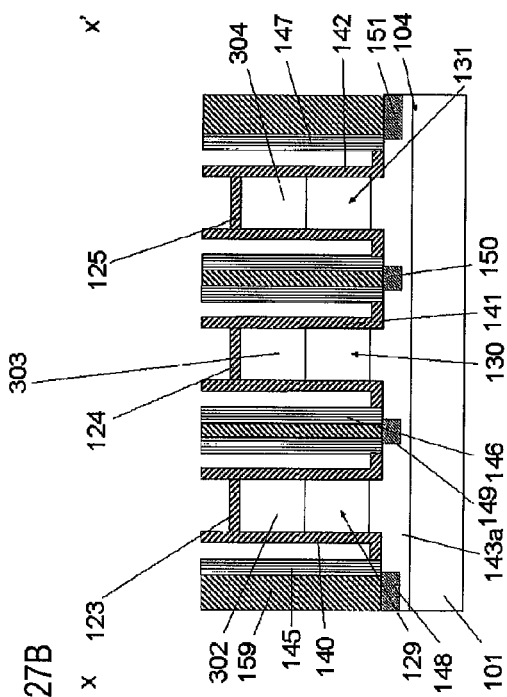
FIG. 27B is a cross-sectional view taken along line X-X' of FIG. 27A.

As illustrated in FIGS. 27A, 27B and 27C, the first dummy gates 117 and 119, the second dummy gate 118, the third dummy gates 137 and 139, and the fourth dummy gate 138 are removed.

Figure 28A:
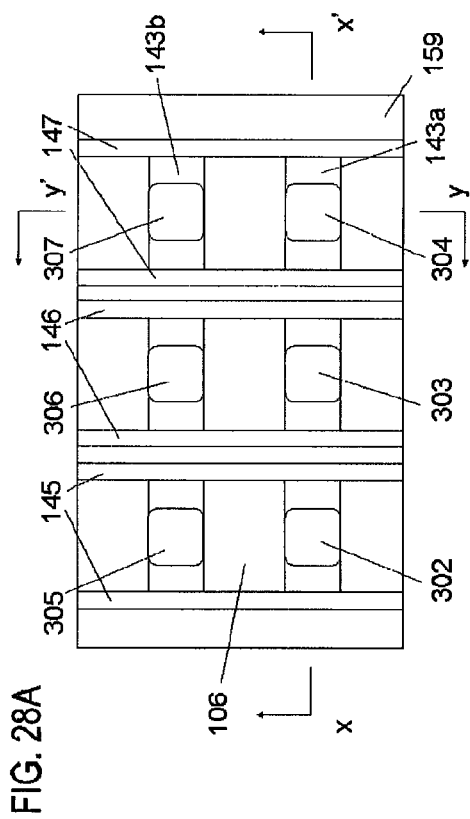
FIG. 28A is a plan view illustrating the method for producing a memory device according to the present invention.
Figure 28C:
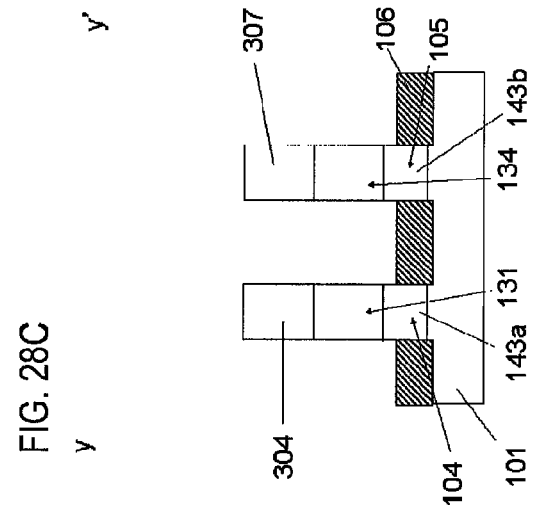
FIG. 28C is a cross-sectional view taken along line Y-Y' of FIG. 28A.
Figure 28B:
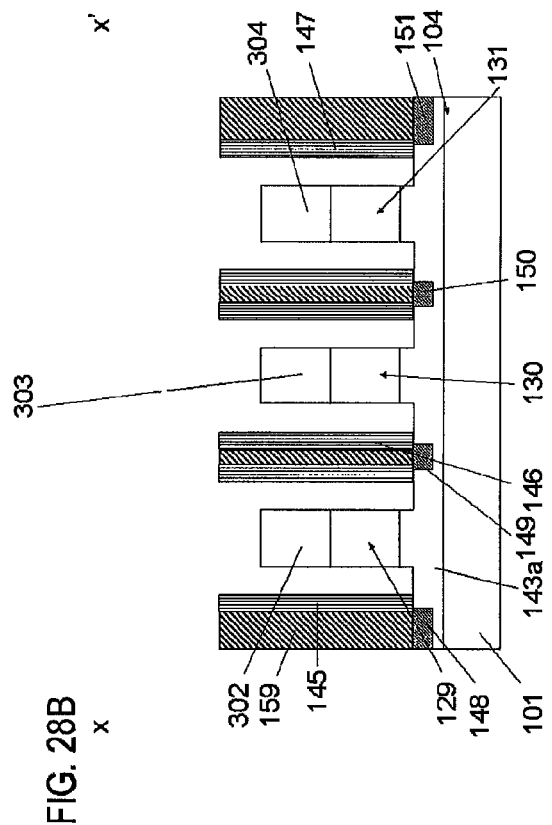
FIG. 28B is a cross-sectional view taken along line X-X' of FIG. 28A.

As illustrated in FIGS. 28A, 28B and 28C, the second insulating films 123, 124, 125, 126, 127, and 128 and the fourth insulating films 140, 141, and 142 are removed.

As illustrated in FIGS. 29A, 29B and 29C, a gate insulating film 160 is formed around the first pillar-shaped silicon layers 129, 131, 132, and 134, around the second pillar-shaped silicon layers 130 and 133, and on inner sides of the side walls 145, 146, and 147.

Figure 30A:
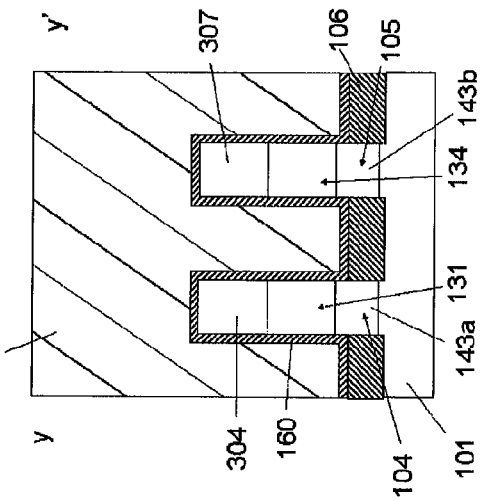
FIG. 30A is a plan view illustrating the method for producing a memory device according to the present invention.
Figure 30B:
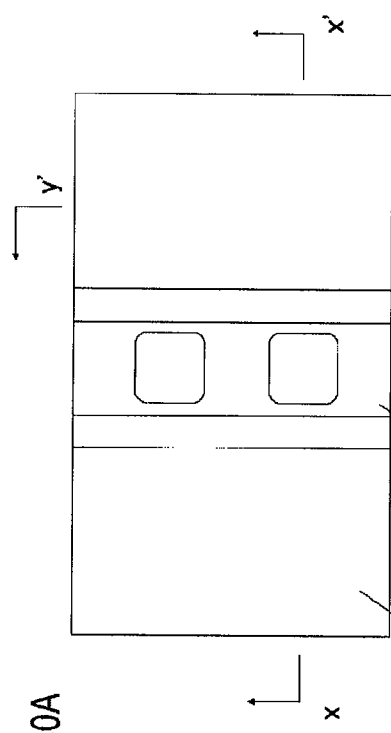
FIG. 30B is a cross-sectional view taken along line X-X' of FIG. 30A.
Figure 30C:
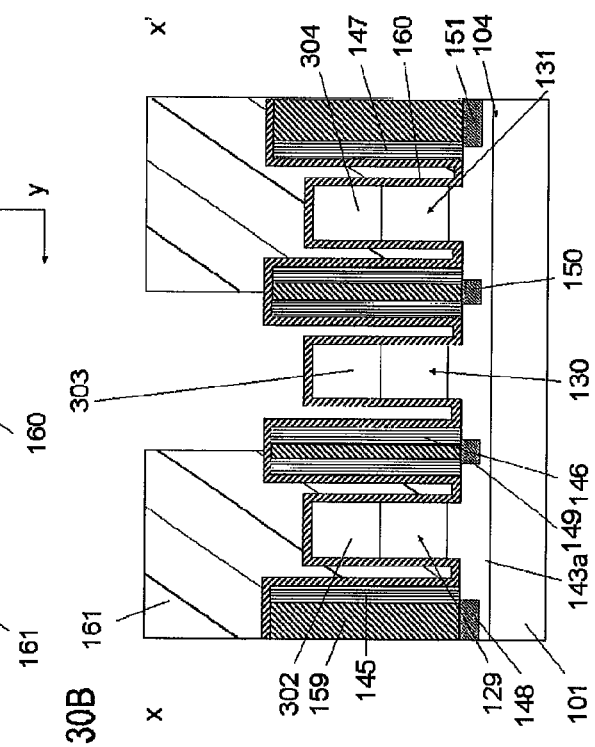
FIG. 30C is a cross-sectional view taken along line Y-Y' of FIG. 30A.

As illustrated in FIGS. 30A, 30B and 30C, a fourth resist 161 is formed. The fourth resist 161 is used for removing portions of the gate insulating film 160 which are located on the periphery of bottom portions of the second pillar-shaped silicon layers 130 and 133.

As illustrated in FIGS. 31A, 31B and 31C, the portions of the gate insulating film 160 which are located on the periphery of the bottom portions of the second pillar-shaped silicon layers 130 and 133 are removed. The gate insulating film is separated into gate insulating films 162, 163, 164, 165, and 166. The gate insulating films 164, 165, and 166 may be removed by isotropic etching.

As illustrated in FIGS. 32A, 32B and 32C, the fourth resist 161 is removed.

As illustrated in FIGS. 33A, 33B and 33C, a metal 167 is deposited.

As illustrated in FIGS. 34A, 34B and 34C, the metal 167 is etched back. Thus, gate electrodes 168a and 170a and gate lines 168b and 170b are formed around the first pillar-shaped silicon layers 129, 131, 132, and 134. A contact electrode 169a and a contact line 169b are formed around the second pillar-shaped silicon layers 130 and 133.

A description has been made of the fifth step of, after the fourth step, depositing an interlayer insulating film and planarizing the interlayer insulating film to expose upper portions of the first dummy gate, the second dummy gate, the third dummy gate, and the fourth dummy gate, removing the first dummy gate, the second dummy gate, the third dummy gate, and the fourth dummy gate, removing the second insulating film and the fourth insulating film, forming a gate insulating film around the first pillar-shaped semiconductor layer, around the second pillar-shaped semiconductor layer, and on an inner side of the fifth insulating film, forming a fourth resist for removing a portion of the gate insulating film which is located on a periphery of a bottom portion of the second pillar-shaped semiconductor layer, removing the portion of the gate insulating film which is located on the periphery of the bottom portion of the second pillar-shaped semiconductor layer, depositing a metal and etching back the metal to form a gate electrode and a gate line around the first pillar-shaped semiconductor layer and to form a contact electrode and a contact line around the second pillar-shaped semiconductor layer.

Next, a description will be made of a sixth step of, after the fifth step, depositing a second interlayer insulating film and planarizing the second interlayer insulating film to expose an upper portion of the first pillar-shaped semiconductor layer, forming a pillar-shaped layer whose resistance changes and a lower electrode, forming a reset gate insulating film so as to surround the pillar-shaped layer whose resistance changes and the lower electrode, and forming a reset gate.

As illustrated in FIGS. 35A, 35B and 35C, a second interlayer insulating film 171 is deposited.

Figure 36C:
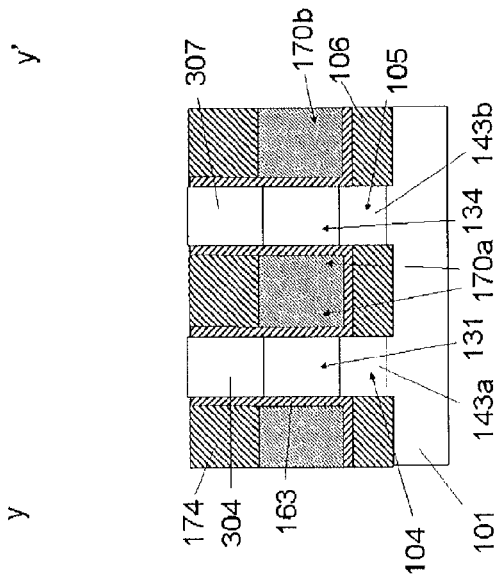
FIG. 36C is a cross-sectional view taken along line Y-Y' of FIG. 36A.
Figure 36A:
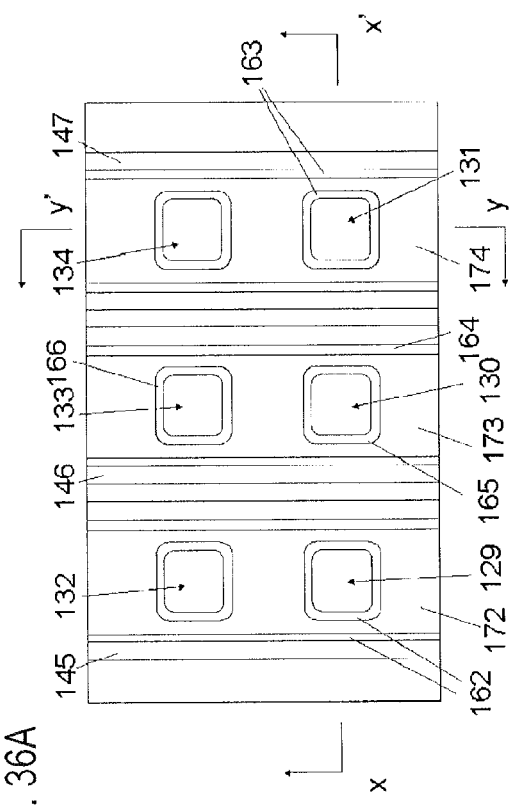
FIG. 36A is a plan view illustrating the method for producing a memory device according to the present invention.
Figure 36B:
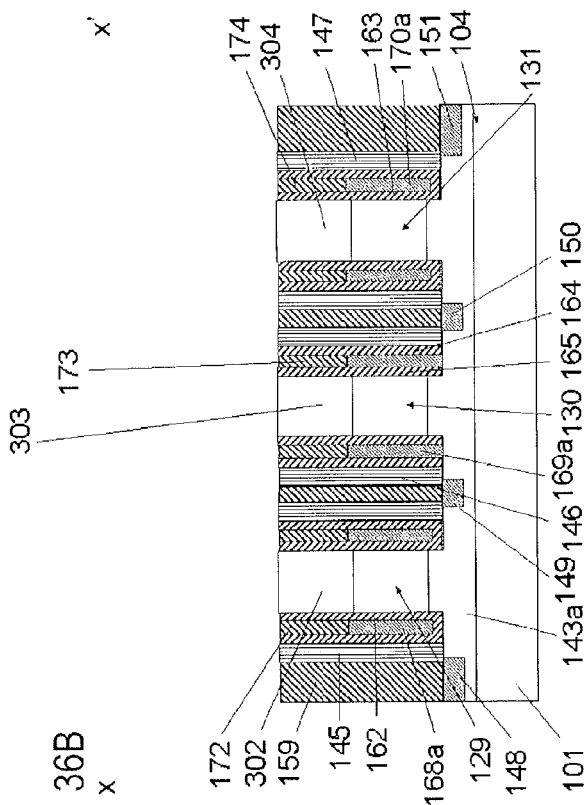
FIG. 36B is a cross-sectional view taken along line X-X' of FIG. 36A.

As illustrated in FIGS. 36A, 36B and 36C, the second interlayer insulating film 171 is etched back to expose upper portions of the first pillar-shaped silicon layers 129, 131, 132, and 134 and upper portions of the second pillar-shaped silicon layers 130 and 133.

Figure 37A:
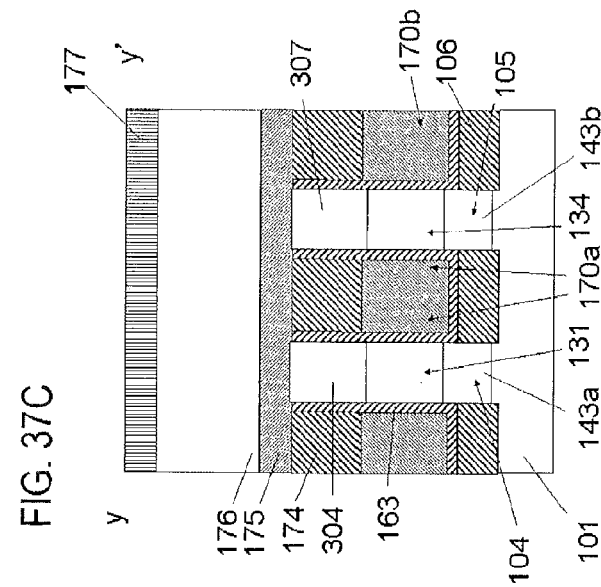
FIG. 37A is a plan view illustrating the method for producing a memory device according to the present invention.
Figure 37B:
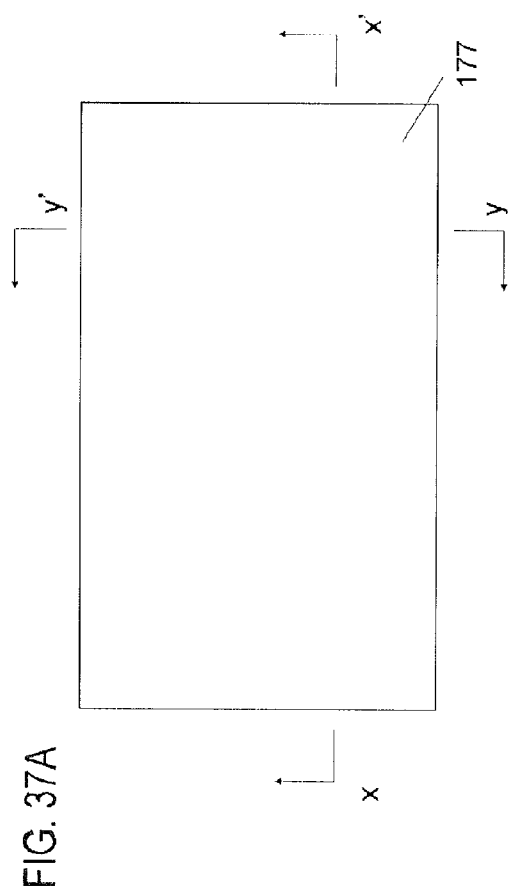
FIG. 37B is a cross-sectional view taken along line X-X' of FIG. 37A.
Figure 37C:
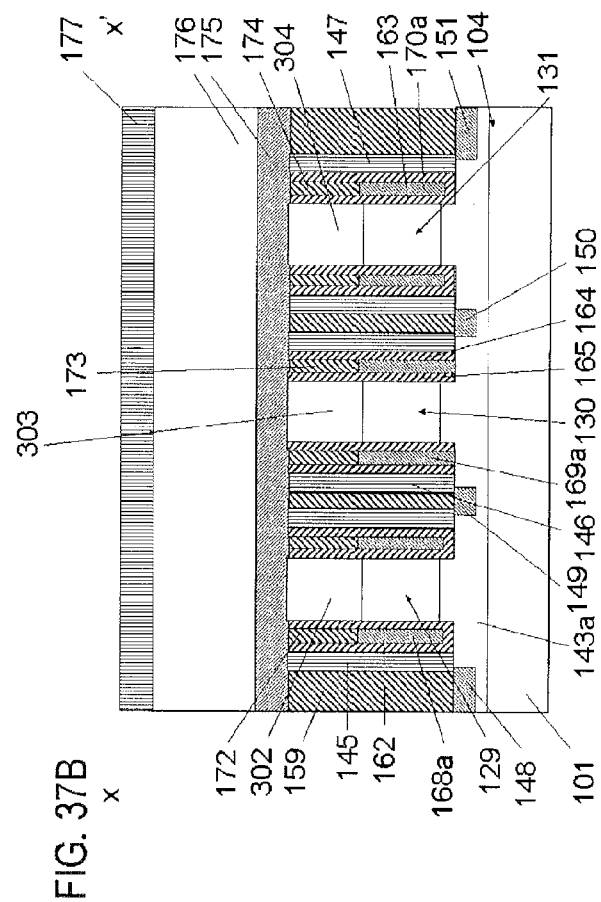
FIG. 37C is a cross-sectional view taken along line Y-Y' of FIG. 37A.

As illustrated in FIGS. 37A, 37B and 37C, a metal 175 for lower electrodes, a film 176 whose resistance changes, and a nitride film 177 are deposited.

Figure 38A:
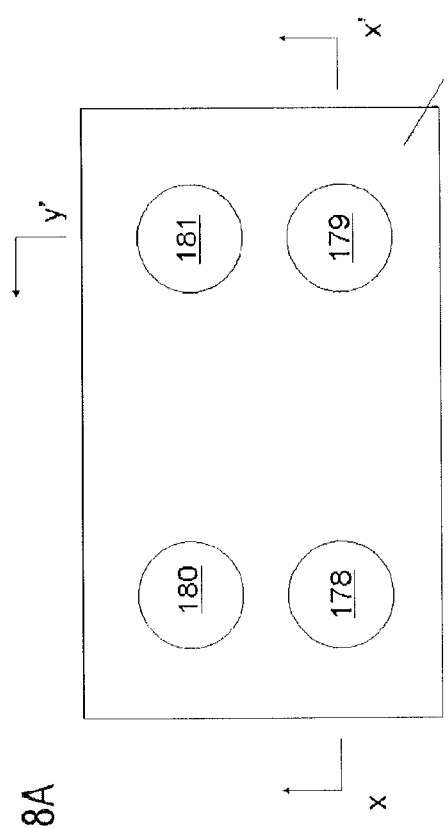
FIG. 38A is a plan view illustrating the method for producing a memory device according to the present invention.
Figure 38C:
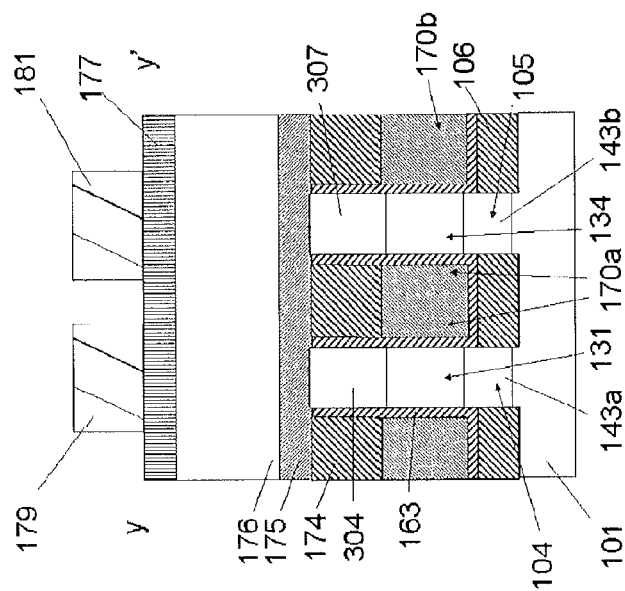
FIG. 38C is a cross-sectional view taken along line Y-Y' of FIG. 38A.
Figure 38B:
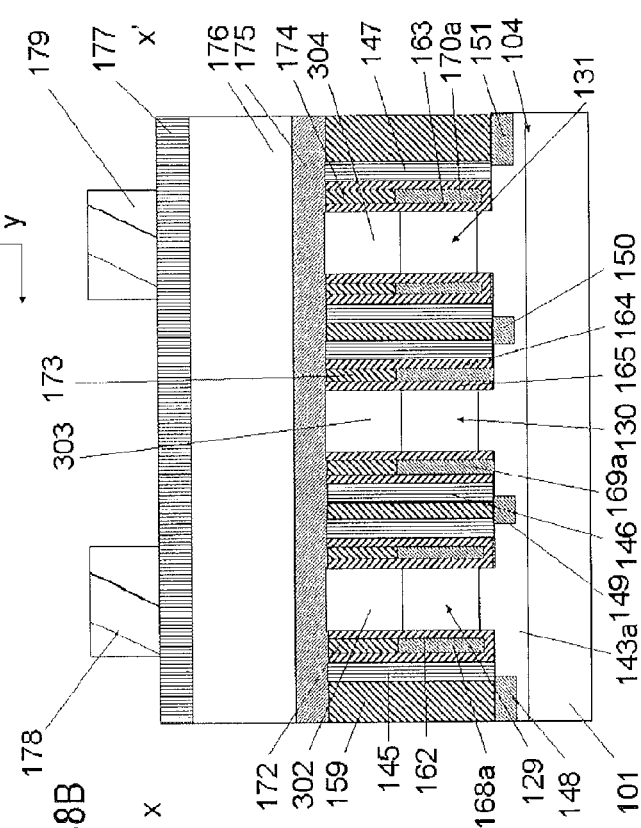
FIG. 38B is a cross-sectional view taken along line X-X' of FIG. 38A.

As illustrated in FIGS. 38A, 38B and 38C, fifth resists 178, 179, 180, and 181 for forming pillar-shaped layers whose resistances change and lower electrodes are formed.

As illustrated in FIGS. 39A, 39B and 39C, the nitride film 177, the film 176 whose resistance changes, and the metal 175 are etched. The nitride film 177 is separated into nitride films 177a, 177b, 177c, and 177d. The film 176 whose resistance changes is separated into pillar-shaped layers 176a, 176b, 176c, and 176d whose resistances change. The metal 175 is separated into lower electrodes 175a, 175b, 175c, and 175d.

Figure 40A:
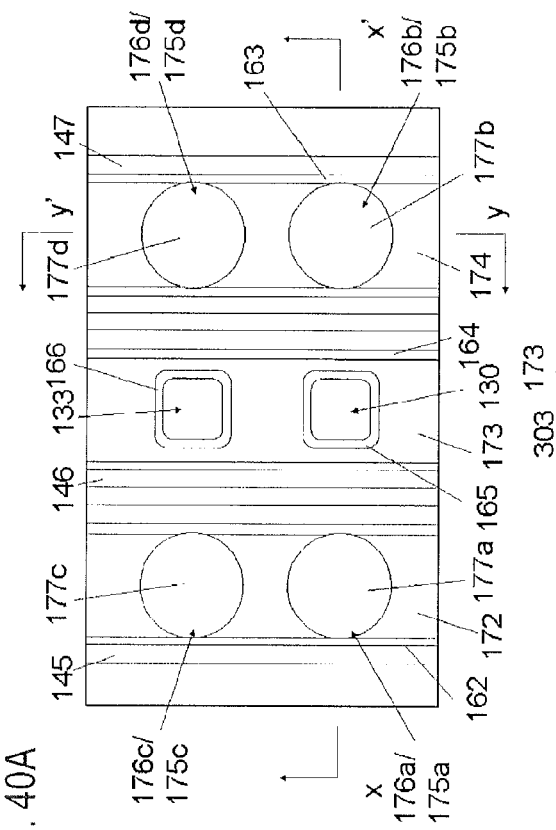
FIG. 40A is a plan view illustrating the method for producing a memory device according to the present invention.
Figure 40C:
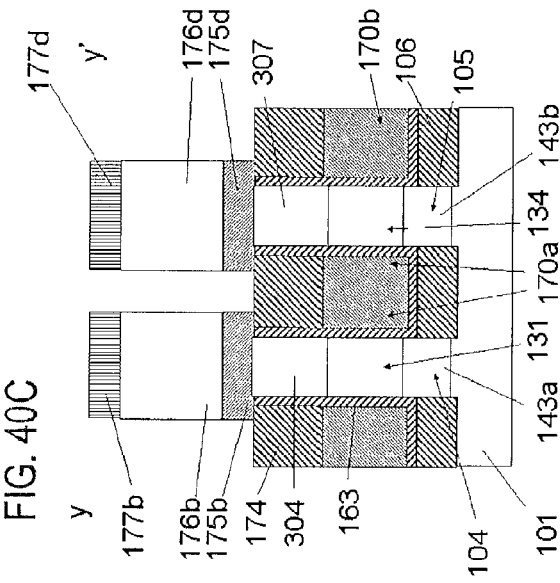
FIG. 40C is a cross-sectional view taken along line Y-Y' of FIG. 40A.
Figure 40B:
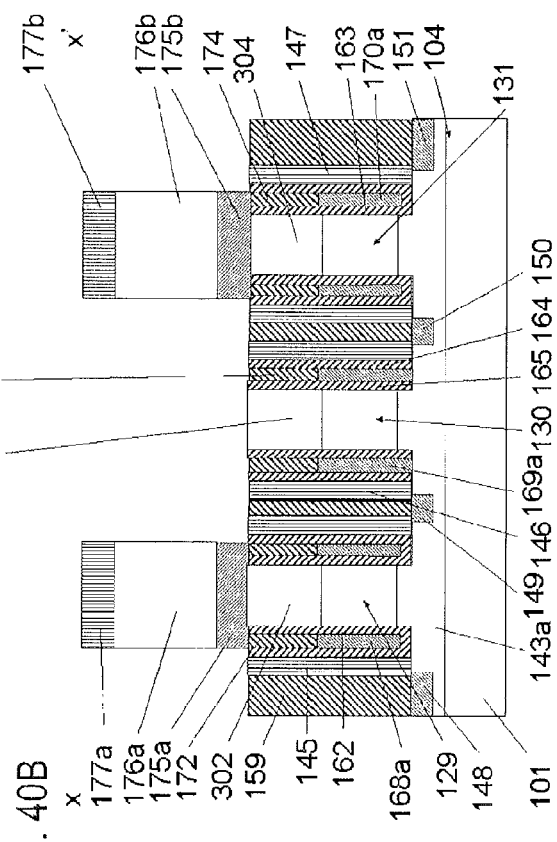
FIG. 40B is a cross-sectional view taken along line X-X' of FIG. 40A.

As illustrated in FIGS. 40A, 40B and 40C, the fifth resists 178, 179, 180, and 181 are removed.

As illustrated in FIGS. 41A, 41B and 41C, a reset gate insulating film 182 is deposited.

Figure 42C:
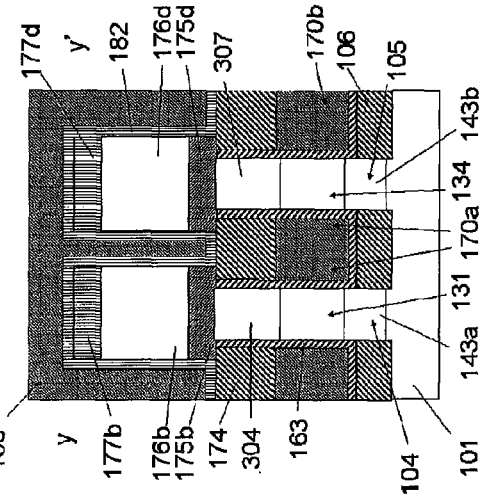
FIG. 42C is a cross-sectional view taken along line Y-Y' of FIG. 42A.
Figure 42A:
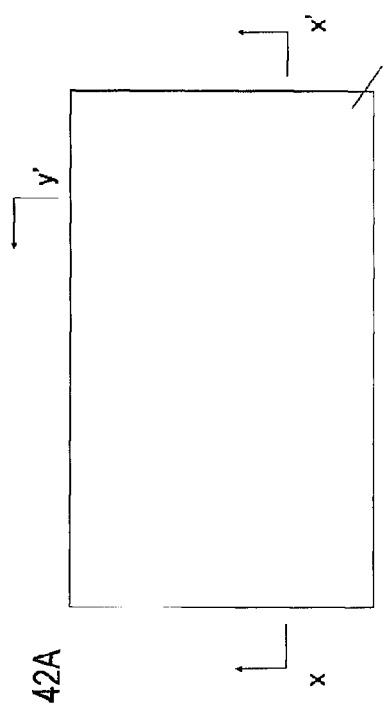
FIG. 42A is a plan view illustrating the method for producing a memory device according to the present invention.
Figure 42B:
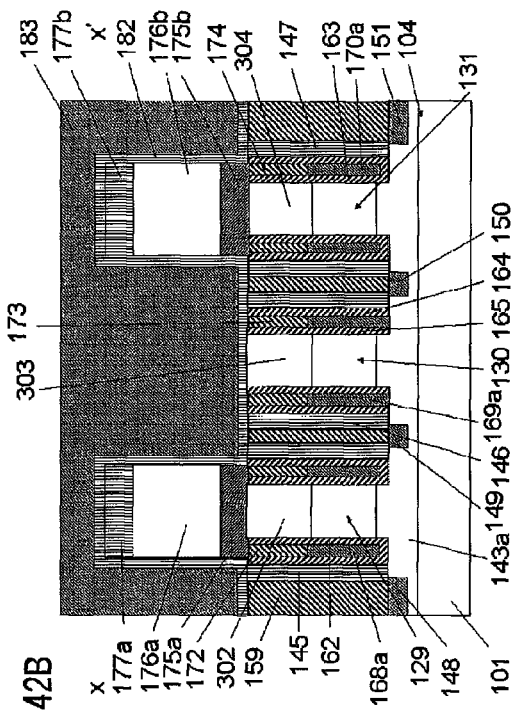
FIG. 42B is a cross-sectional view taken along line X-X' of FIG. 42A.

As illustrated in FIGS. 42A, 42B and 42C, a metal 183 which is to become reset gates is deposited.

Figure 43C:
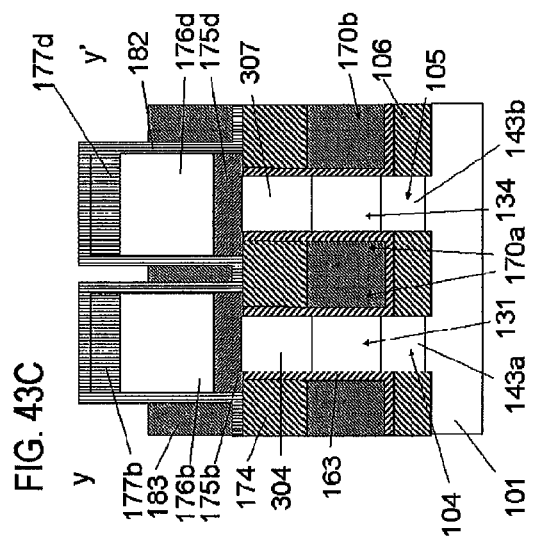
FIG. 43C is a cross-sectional view taken along line Y-Y' of FIG. 43A.
Figure 43A:
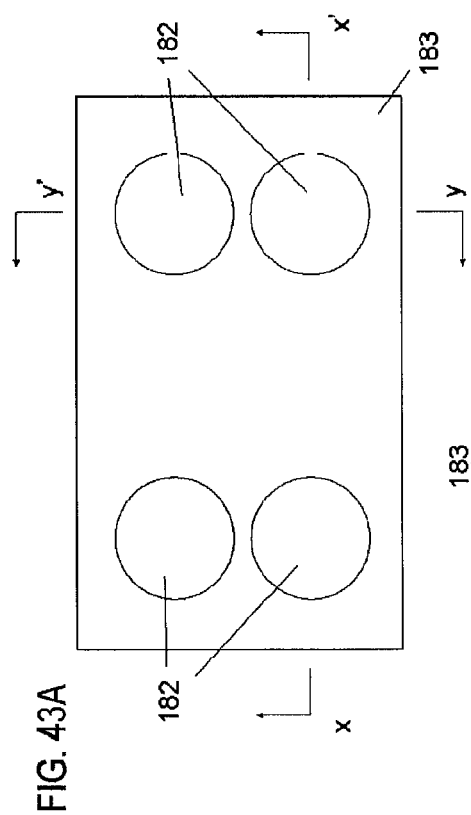
FIG. 43A is a plan view illustrating the method for producing a memory device according to the present invention.
Figure 43B:
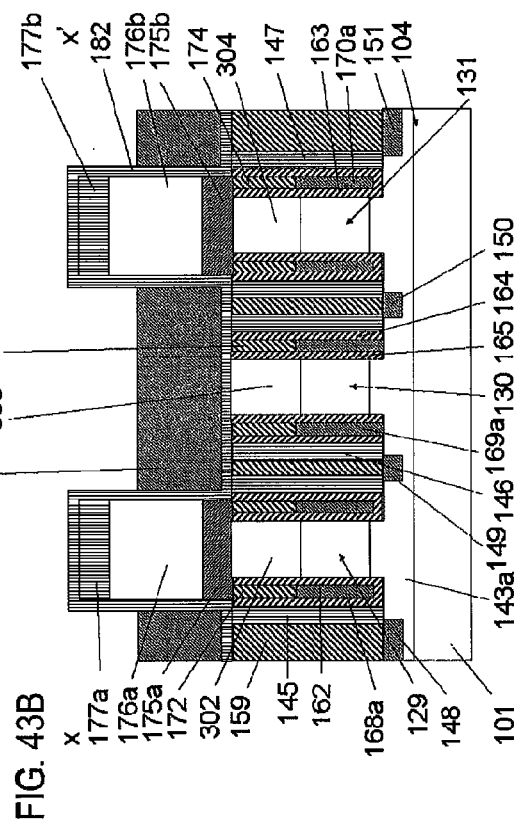
FIG. 43B is a cross-sectional view taken along line X-X' of FIG. 43A.

As illustrated in FIGS. 43A, 43B and 43C, the metal 183 is etched back.

As illustrated in FIGS. 44A, 44B and 44C, a nitride film 184 is deposited.

Figure 45A:
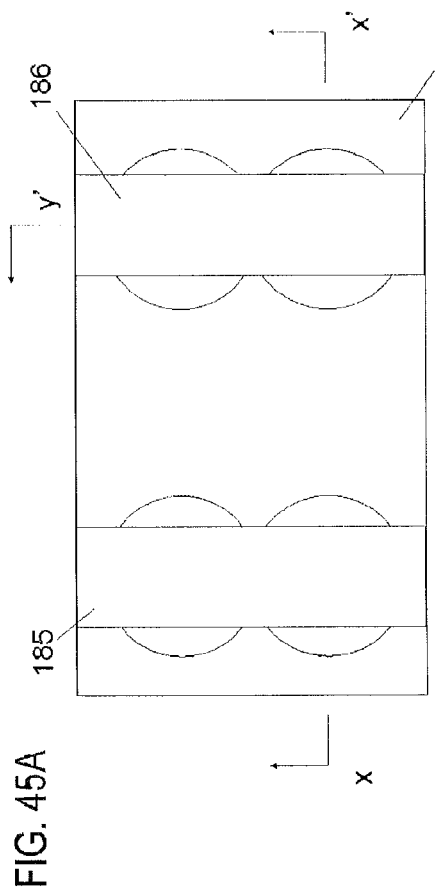
FIG. 45A is a plan view illustrating the method for producing a memory device according to the present invention.
Figure 45C:
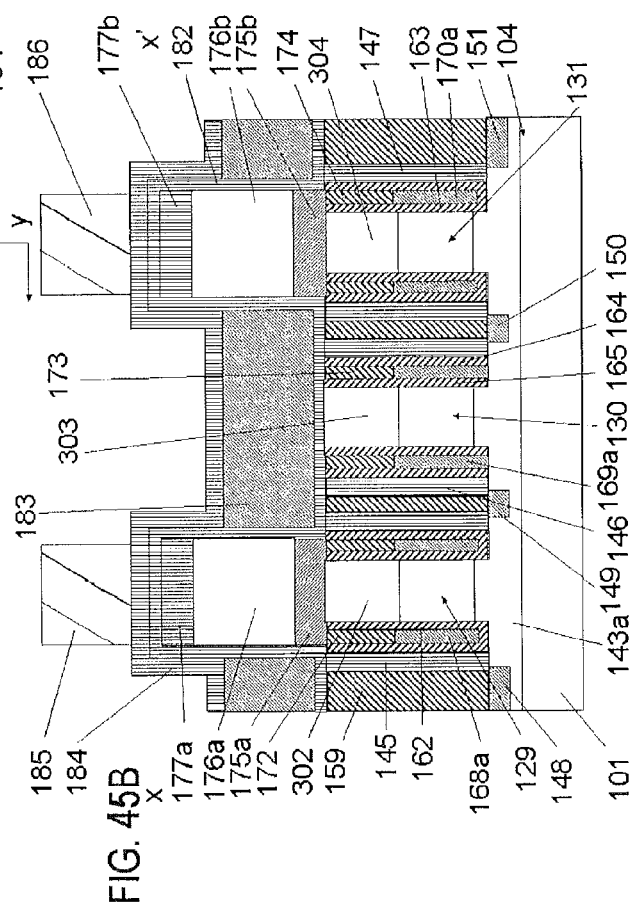
FIG. 45C is a cross-sectional view taken along line Y-Y' of FIG. 45A.
Figure 45B:
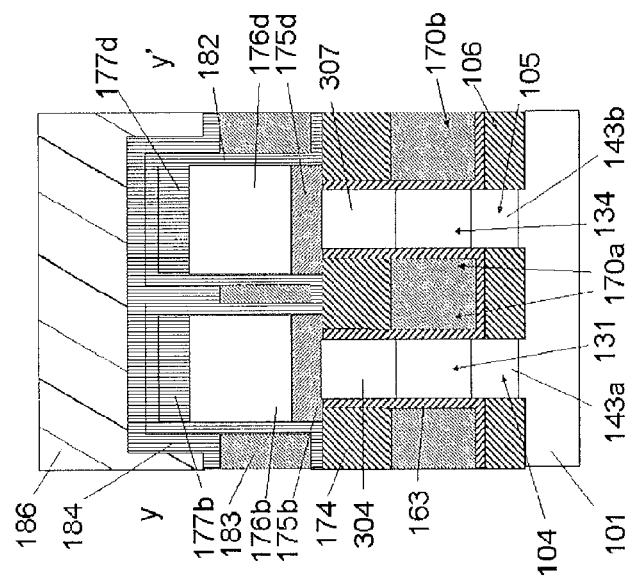
FIG. 45B is a cross-sectional view taken along line X-X' of FIG. 45A.

As illustrated in FIGS. 45A, 45B and 45C, sixth resists 185 and 186 for forming reset gates are formed.

Figure 46C:
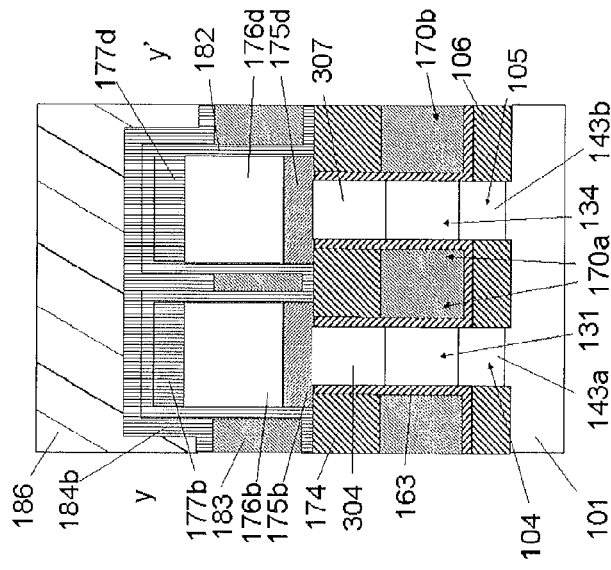
FIG. 46C is a cross-sectional view taken along line Y-Y' of FIG. 46A.
Figure 46A:
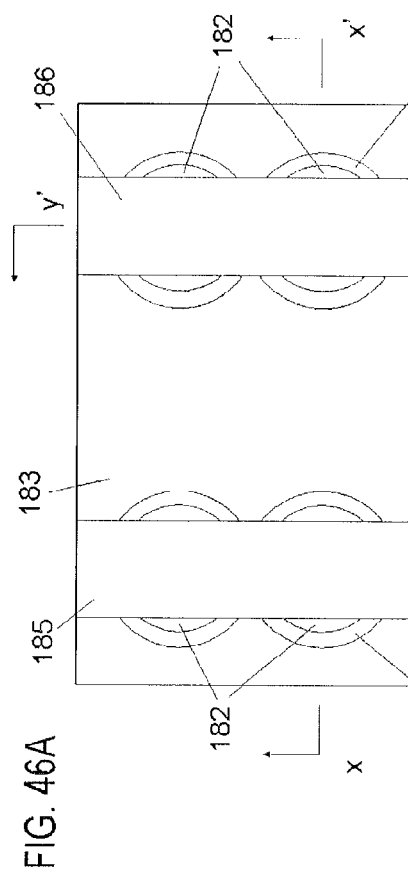
FIG. 46A is a plan view illustrating the method for producing a memory device according to the present invention.
Figure 46B:
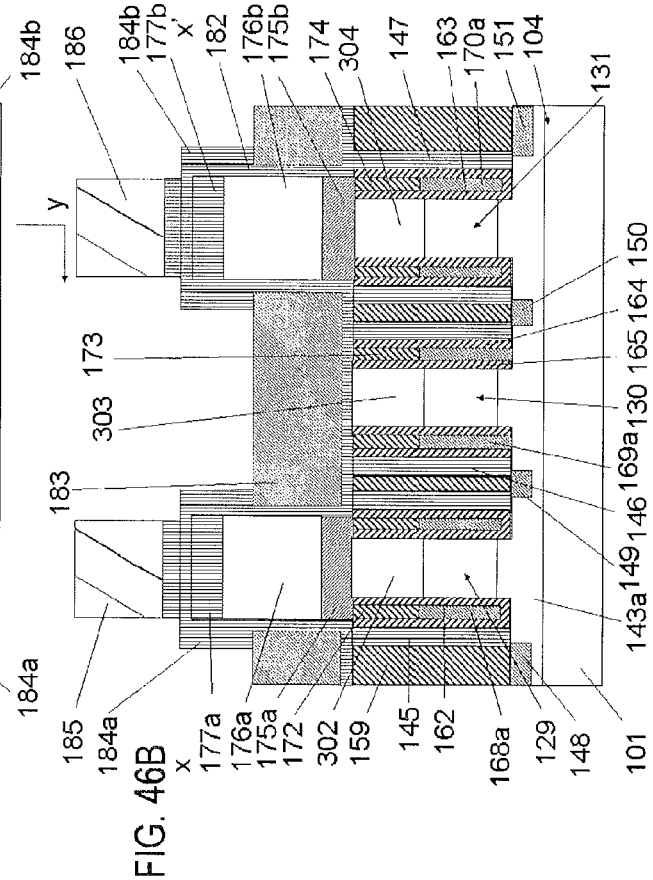
FIG. 46B is a cross-sectional view taken along line X-X' of FIG. 46A.

As illustrated in FIGS. 46A, 46B and 46C, the nitride film 184 is etched. The nitride film 184 is separated into nitride films 184a and 184b.

As illustrated in FIGS. 47A, 47B and 47C, the metal 183 is etched by using the sixth resists 185 and 186 and the nitride films 184a and 184b as a mask to from reset gates 183a and 183b.

As illustrated in FIGS. 48A, 48B and 48C, the sixth resists 185 and 186 are removed.

Figure 49A:
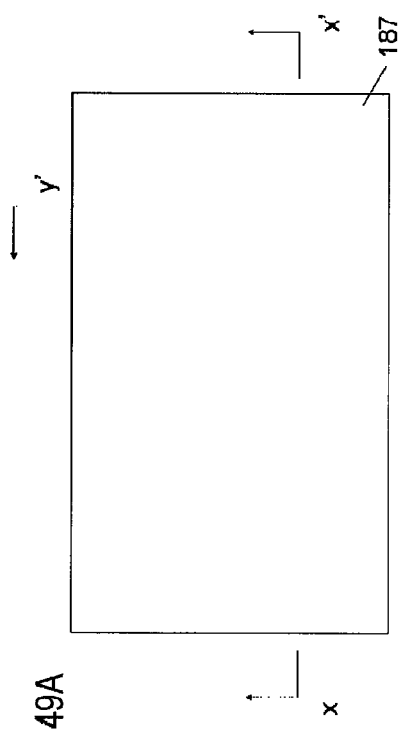
FIG. 49A is a plan view illustrating the method for producing a memory device according to the present invention.
Figure 49C:
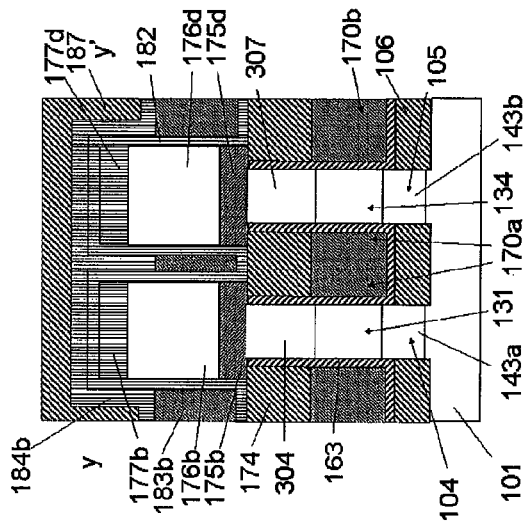
FIG. 49C is a cross-sectional view taken along line Y-Y' of FIG. 49A.
Figure 49B:
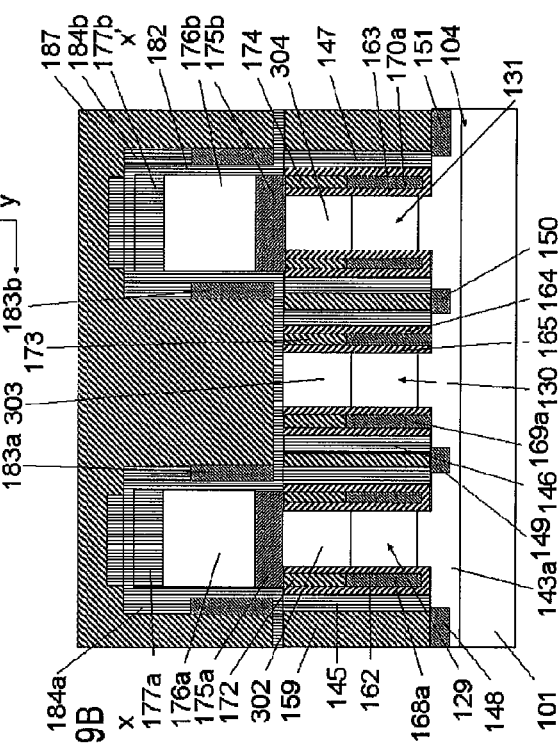
FIG. 49B is a cross-sectional view taken along line X-X' of FIG. 49A.

As illustrated in FIGS. 49A, 49B and 49C, a third interlayer insulating film 187 is deposited.

Figure 50A:
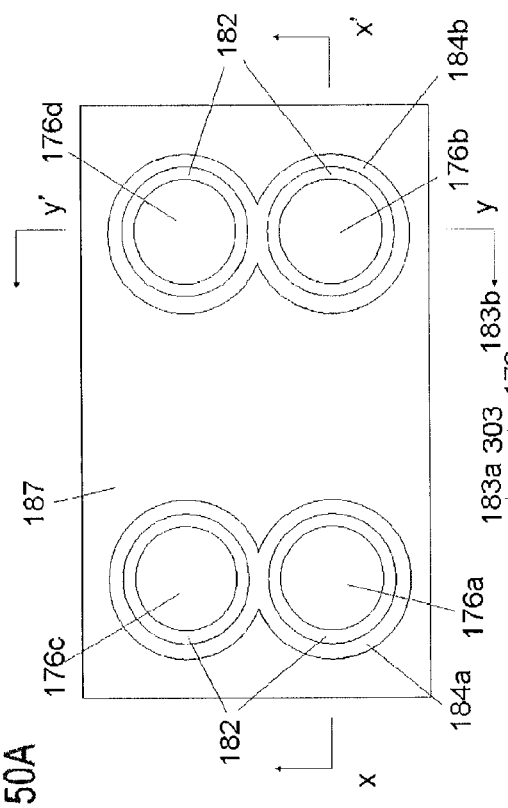
FIG. 50A is a plan view illustrating the method for producing a memory device according to the present invention.
Figure 50B:
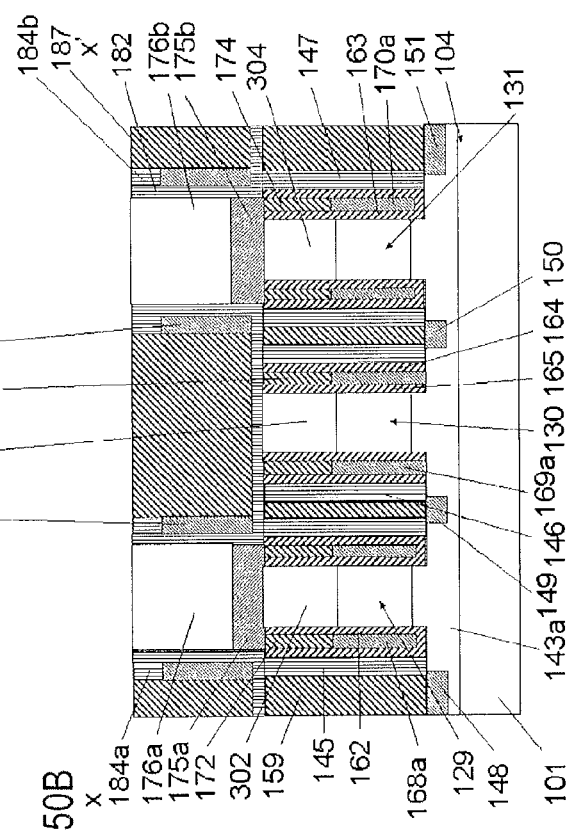
FIG. 50B is a cross-sectional view taken along line X-X' of FIG. 50A.
Figure 50C:
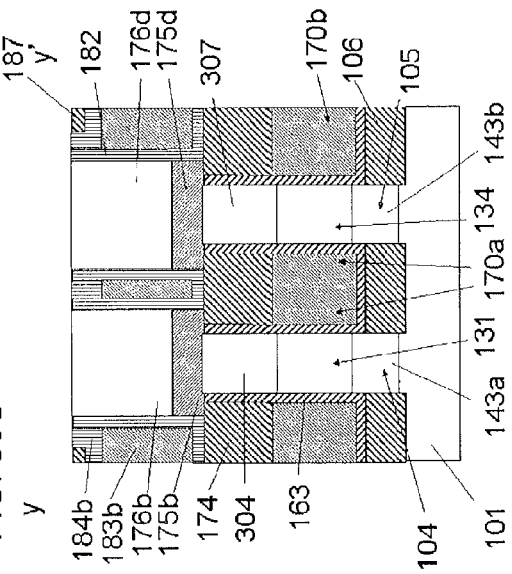
FIG. 50C is a cross-sectional view taken along line Y-Y' of FIG. 50A.

As illustrated in FIGS. 50A, 50B and 50C, the third interlayer insulating film 187 is planarized, and the nitride films 177a, 177b, 177c, and 177d are removed so as to expose upper portions of the pillar-shaped layers 176a, 176b, 176c, and 176d whose resistances change.

As illustrated in FIGS. 51A, 51B and 51C, a metal 188 is deposited.

Figure 52C:
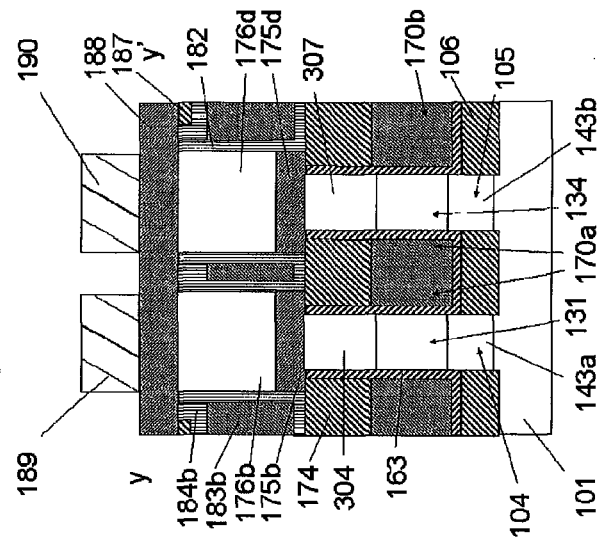
FIG. 52C is a cross-sectional view taken along line Y-Y' of FIG. 52A.
Figure 52A:
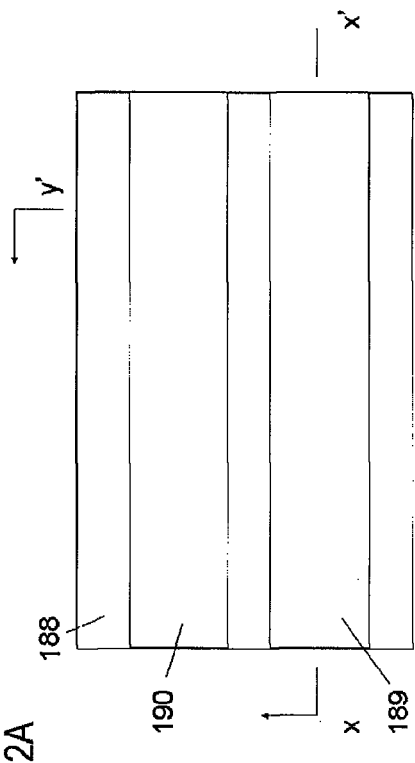
FIG. 52A is a plan view illustrating the method for producing a memory device according to the present invention.
Figure 52B:
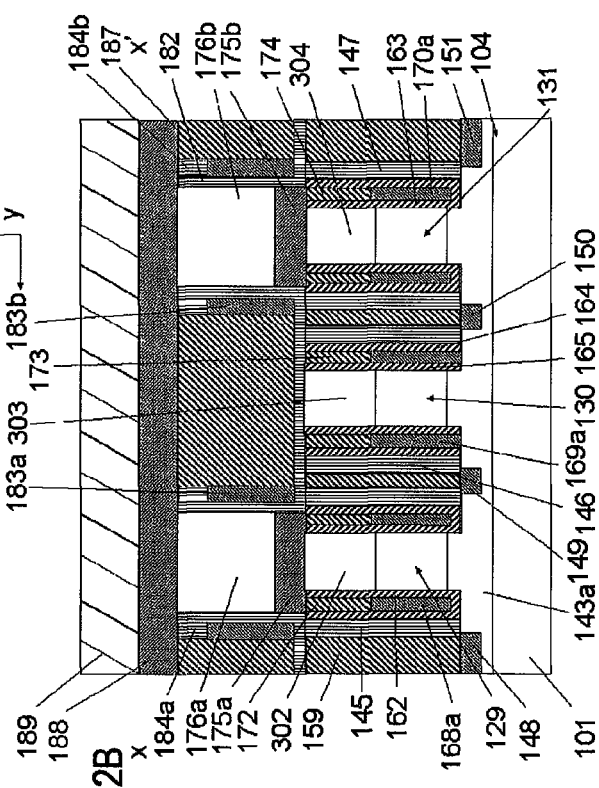
FIG. 52B is a cross-sectional view taken along line X-X' of FIG. 52A.

As illustrated in FIGS. 52A, 52B and 52C, seventh resists 189 and 190 for forming bit lines are formed.

Figure 53A:
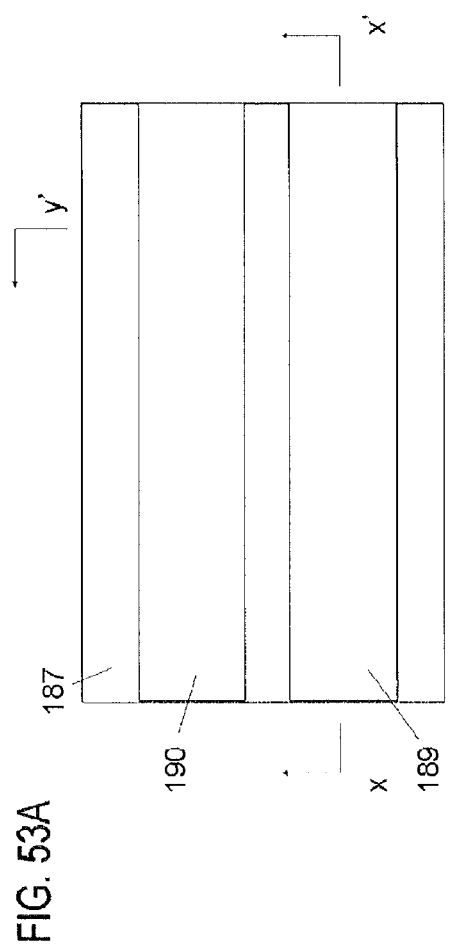
FIG. 53A is a plan view illustrating the method for producing a memory device according to the present invention.
Figure 53C:
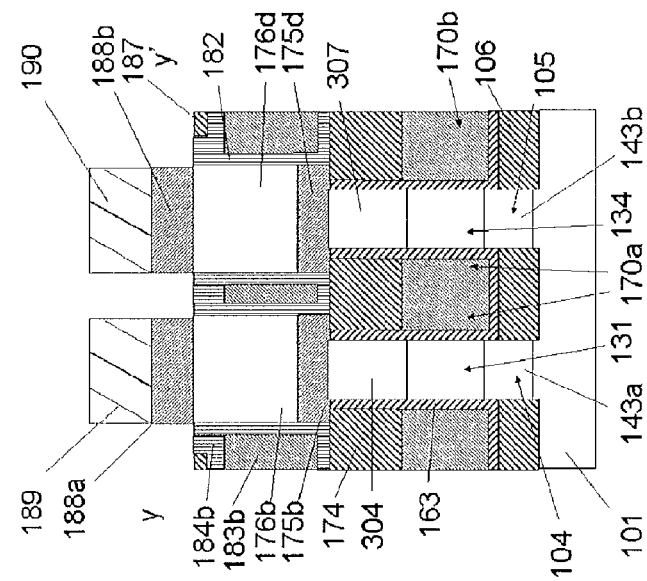
FIG. 53C is a cross-sectional view taken along line Y-Y' of FIG. 53A.
Figure 53B:
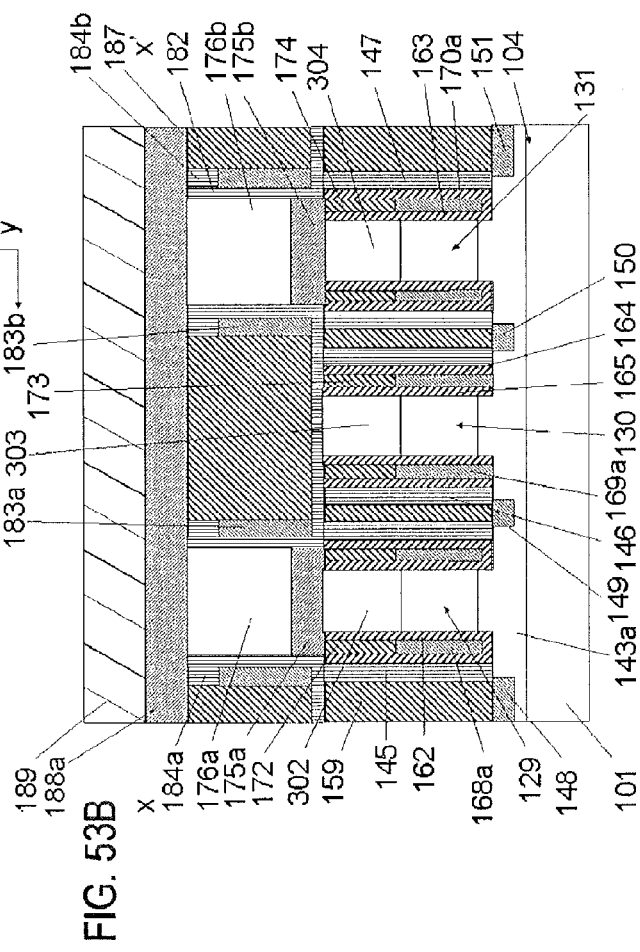
FIG. 53B is a cross-sectional view taken along line X-X' of FIG. 53A.

As illustrated in FIGS. 53A, 53B and 53C, the metal 188 is etched to form bit lines 188a and 188b.

Figure 54A:
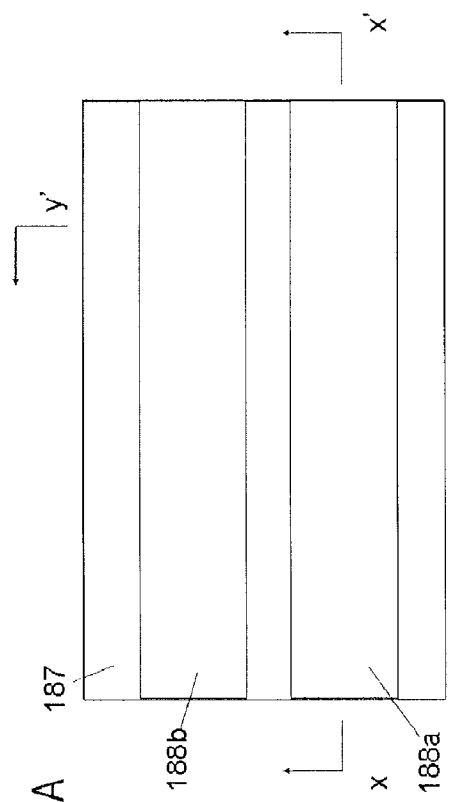
FIG. 54A is a plan view illustrating the method for producing a memory device according to the present invention.
Figure 54C:
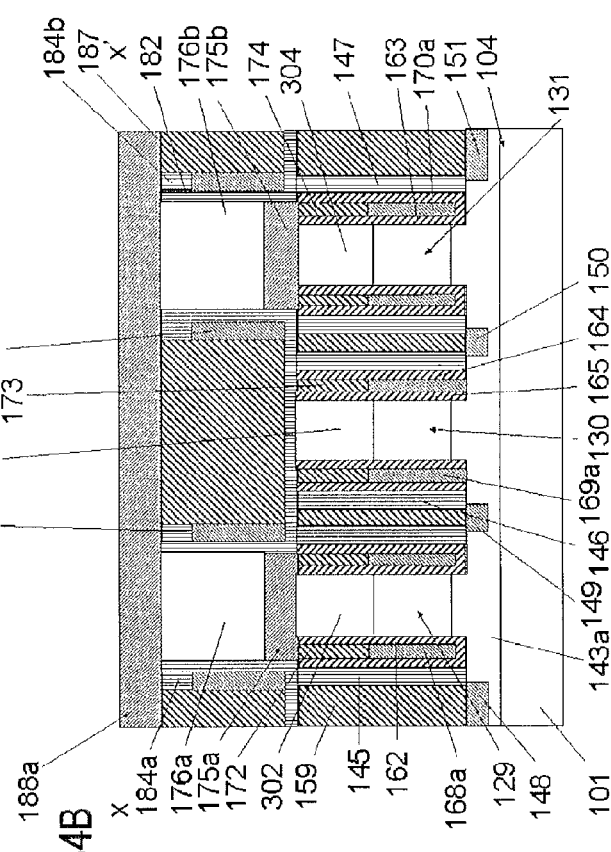
FIG. 54C is a cross-sectional view taken along line Y-Y' of FIG. 54A.
Figure 54B:
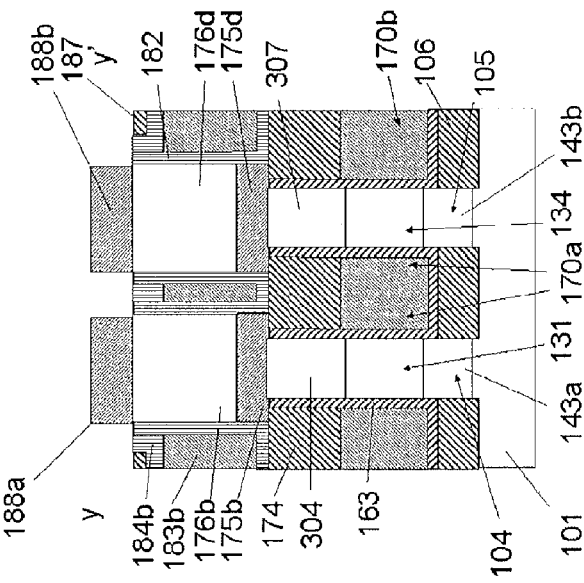
FIG. 54B is a cross-sectional view taken along line X-X' of FIG. 54A.

As illustrated in FIGS. 54A, 54B and 54C, the seventh resists 189 and 190 are removed.

A description has been made of the sixth step of, after the fifth step, depositing a second interlayer insulating film and planarizing the second interlayer insulating film to expose an upper portion of the first pillar-shaped semiconductor layer, forming a pillar-shaped layer whose resistance changes and a lower electrode, forming a reset gate insulating film so as to surround the pillar-shaped layer whose resistance changes and the lower electrode, and forming a reset gate.

A production process for forming the structure of a memory device according to an embodiment of the present invention has been described.

It is to be understood that various embodiments and modifications of the present invention can be made without departing from the broad spirit and the scope of the present invention. The embodiments described above are illustrative examples of the present invention and do not limit the scope of the present invention.

For example, in the above embodiments, a method for producing a semiconductor device in which the conductivity types of the p type (including the p$^+$ type) and the n type (including the n$^+$ type) are each changed to the opposite conductivity type, and a semiconductor device produced by the method are also included in the technical scope of the present invention.

The invention claimed is:

1. A memory device comprising:
a pillar-shaped phase-change layer;
a lower electrode under the pillar-shaped phase-change layer;
a reset gate insulating film surrounding the pillar-shaped phase-change layer; and
a reset gate surrounding the reset gate insulating film, the reset gate insulating film separating the lower electrode from the reset gate,
wherein the reset gate and the lower electrode function as a heater, and the pillar-shaped phase-change layer and the reset gate are electrically insulated from each other by the reset gate insulating film, and the phase-change layer is reset by a current flowing in the reset gate.

2. The memory device according to claim 1, wherein the reset gate is composed of titanium nitride.

3. The memory device according to claim 1, wherein the reset gate insulating film is formed of a nitride film.

4. The memory device according to claim 1, wherein the lower electrode is composed of titanium nitride.

5. The memory device according to claim 1 wherein the reset gate extends in a first direction, the reset gate connects a plurality of the memory devices to each other in the first direction, and the reset gate does not connect connected the plurality of the memory devices to each other in a direction perpendicular to the first direction.

* * * * *